(12) United States Patent
Hasegawa et al.

(10) Patent No.: US 10,944,046 B2
(45) Date of Patent: Mar. 9, 2021

(54) SEMICONDUCTOR DEVICE

(71) Applicant: ROHM CO., LTD., Kyoto (JP)

(72) Inventors: Yuya Hasegawa, Kyoto (JP); Satohiro Kigoshi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/694,513

(22) Filed: Nov. 25, 2019

(65) Prior Publication Data

US 2020/0091416 A1 Mar. 19, 2020

Related U.S. Application Data

(63) Continuation of application No. 16/113,339, filed on Aug. 27, 2018, now Pat. No. 10,535,812.

(30) Foreign Application Priority Data

Sep. 4, 2017 (JP) .............................. JP2017-169389
Jul. 18, 2018 (JP) .............................. JP2018-134794

(51) Int. Cl.
*H01L 43/04* (2006.01)
*H01L 23/544* (2006.01)
(Continued)

(52) U.S. Cl.
CPC .............. *H01L 43/04* (2013.01); *G01R 33/07* (2013.01); *H01L 21/4828* (2013.01);
(Continued)

(58) Field of Classification Search
CPC ........... H01L 23/3124; H01L 23/49513; H01L 23/49541; H01L 23/49548;
(Continued)

(56) References Cited

U.S. PATENT DOCUMENTS 5,909,122 A * 6/1999 Chung ............... G01R 31/2884
257/E23.124
6,342,730 B1 * 1/2002 Jung .................... H01L 21/4832
257/692
(Continued)

FOREIGN PATENT DOCUMENTS

CN 101651126 A * 2/2010
JP 5676826 B2 2/2015
(Continued)

*Primary Examiner* — Earl N Taylor
(74) *Attorney, Agent, or Firm* — Hamre, Schumann, Mueller & Larson, P.C.

(57) ABSTRACT

A semiconductor device includes a semiconductor element, a conductive layer, terminals, and a sealing resin. The conductive layer, containing metal particles, is in contact with the reverse surface and the side surface of the semiconductor element. The terminals are spaced apart from and electrically connected to the semiconductor element. The sealing resin covers the semiconductor element. The conductive layer has an edge located outside of the semiconductor element as viewed in plan. Each terminal includes a top surface, a bottom surface, an inner side surface held in contact with the sealing resin, and the terminal is formed with a dent portion recessed from the bottom surface and the inner side surface. The conductive layer and the bottom surface of each terminal are exposed from a bottom surface of the sealing resin.

19 Claims, 41 Drawing Sheets

(51) Int. Cl.
| | | |
|---|---|---|
| *H01L 23/495* | (2006.01) | |
| *G01R 33/07* | (2006.01) | |
| *H01L 21/48* | (2006.01) | |
| *H01L 21/56* | (2006.01) | |
| *H01L 21/683* | (2006.01) | |
| *H01L 23/31* | (2006.01) | |
| *H01L 23/00* | (2006.01) | |
| *H01L 43/06* | (2006.01) | |
| *H01L 43/14* | (2006.01) | |

(52) U.S. Cl.
CPC .......... *H01L 21/565* (2013.01); *H01L 21/568* (2013.01); *H01L 21/6835* (2013.01); *H01L 23/3121* (2013.01); *H01L 23/49513* (2013.01); *H01L 23/49541* (2013.01); *H01L 23/49548* (2013.01); *H01L 23/49582* (2013.01); *H01L 23/544* (2013.01); *H01L 24/48* (2013.01); *H01L 24/85* (2013.01); *H01L 43/065* (2013.01); *H01L 43/14* (2013.01); *H01L 23/3107* (2013.01); *H01L 24/05* (2013.01); *H01L 24/45* (2013.01); *H01L 2221/68345* (2013.01); *H01L 2224/04026* (2013.01); *H01L 2224/04042* (2013.01); *H01L 2224/05166* (2013.01); *H01L 2224/05573* (2013.01); *H01L 2224/05644* (2013.01); *H01L 2224/45144* (2013.01); *H01L 2224/48091* (2013.01); *H01L 2224/48096* (2013.01); *H01L 2224/48097* (2013.01); *H01L 2224/48101* (2013.01); *H01L 2224/48106* (2013.01); *H01L 2224/48177* (2013.01); *H01L 2224/48465* (2013.01); *H01L 2224/48471* (2013.01); *H01L 2224/48644* (2013.01); *H01L 2224/85005* (2013.01); *H01L 2224/97* (2013.01); *H01L 2924/10329* (2013.01); *H01L 2924/1815* (2013.01); *H01L 2924/18165* (2013.01)

(58) Field of Classification Search
CPC ... H01L 23/49582; H01L 24/48; H01L 24/85; H01L 43/04; H01L 43/065; H01L 43/14; H01L 2223/544; H01L 2223/54406; H01L 2223/54413; H01L 2223/5442; H01L 2223/54433; H01L 2223/54486; H01L 23/3107
See application file for complete search history.

(56) References Cited

U.S. PATENT DOCUMENTS

| | | | | |
|---|---|---|---|---|
| 6,759,745 B2* | 7/2004 | Masumoto | .......... | H01L 21/6835 257/730 |
| 7,501,693 B2* | 3/2009 | Chu | .................. | H01L 23/49513 257/676 |
| 7,629,677 B2* | 12/2009 | Youn | .................. | H01L 23/3107 257/676 |
| 7,944,062 B2* | 5/2011 | Groenhuis | .......... | H01L 23/3135 257/787 |
| 8,368,188 B2* | 2/2013 | Do | .................. | H01L 21/568 257/666 |
| 8,853,865 B2* | 10/2014 | Narita | .................. | H01L 23/3107 257/778 |
| 9,263,398 B1* | 2/2016 | Chang | .................. | H01L 23/3142 |
| 9,768,098 B2* | 9/2017 | Lohia | .................. | H01L 23/4952 |
| 10,128,169 B1* | 11/2018 | Cadag | .................. | H01L 23/49513 |
| 10,134,659 B2* | 11/2018 | Narita | .................. | H01L 23/4951 |
| 10,535,812 B2* | 1/2020 | Hasegawa | .............. | H01L 43/04 |
| 2002/0004250 A1* | 1/2002 | Iketani | .................. | H01L 21/561 438/15 |
| 2002/0016013 A1* | 2/2002 | Iketani | .................. | H01L 21/6835 438/15 |
| 2002/0019066 A1* | 2/2002 | Iketani | .................. | H01L 24/97 438/14 |
| 2003/0001244 A1* | 1/2003 | Araki | .................. | H01L 24/32 257/666 |
| 2004/0262718 A1* | 12/2004 | Ramakrishna | .......... | H01L 24/29 257/666 |
| 2005/0093174 A1* | 5/2005 | Seng | .................. | H01L 24/32 257/782 |
| 2005/0167800 A1* | 8/2005 | Naya | .................. | H01L 21/6835 257/678 |
| 2006/0076675 A1* | 4/2006 | Hori | .................. | H01L 23/544 257/718 |
| 2006/0166381 A1* | 7/2006 | Lange | .................. | H01L 23/3107 438/14 |
| 2006/0187719 A1* | 8/2006 | Matsumoto | .......... | H01L 23/544 365/189.07 |
| 2007/0035008 A1* | 2/2007 | Wu | .................. | H01L 23/544 257/700 |
| 2007/0052106 A1* | 3/2007 | Watase | .................. | H01L 23/3114 257/774 |
| 2007/0158792 A1* | 7/2007 | Camacho | .......... | H01L 23/49548 257/666 |
| 2007/0171695 A1* | 7/2007 | Aouba | .................. | G11C 11/155 365/145 |
| 2007/0241466 A1* | 10/2007 | Chou | .................. | H01L 23/544 257/797 |
| 2009/0072367 A1* | 3/2009 | Poddar | .................. | H01L 24/83 257/676 |
| 2009/0134512 A1* | 5/2009 | Chiang | .................. | H01L 23/544 257/723 |
| 2009/0283897 A1* | 11/2009 | Fukaya | .................. | H01L 23/544 257/696 |
| 2010/0084758 A1* | 4/2010 | Mun | .................. | H01L 23/16 257/690 |
| 2010/0155934 A1* | 6/2010 | Yim | .................. | H01L 23/544 257/704 |
| 2010/0264553 A1* | 10/2010 | Wainerdi | .................. | H01L 24/32 257/783 |
| 2011/0074016 A1* | 3/2011 | Narita | .................. | H01L 21/561 257/737 |
| 2011/0198752 A1* | 8/2011 | Nondhasitthichai | .......... | H01L 23/49513 257/738 |
| 2011/0267789 A1* | 11/2011 | Chew | .................. | H01L 21/4832 361/767 |
| 2011/0284989 A1* | 11/2011 | Umeno | .................. | H01L 23/49822 257/531 |
| 2012/0043648 A1* | 2/2012 | Matsumaru | .......... | H01L 23/544 257/618 |
| 2012/0104577 A1* | 5/2012 | Fukumura | .......... | H01L 23/49548 257/666 |
| 2012/0126418 A1* | 5/2012 | Feng | .................. | H01L 24/13 257/774 |
| 2012/0181640 A1* | 7/2012 | von Koblinski | .... | H01L 23/3178 257/421 |
| 2012/0295668 A1* | 11/2012 | Kitahara | .................. | H01L 21/56 455/571 |
| 2013/0040426 A1* | 2/2013 | Narita | .................. | H01L 23/3107 438/113 |
| 2013/0122662 A1* | 5/2013 | Matsumaru | .......... | H01L 21/565 438/127 |
| 2013/0299956 A1* | 11/2013 | Narita | .................. | H01L 24/97 257/676 |
| 2013/0328218 A1* | 12/2013 | Narita | .................. | H01L 24/97 257/783 |
| 2014/0049723 A1* | 2/2014 | Ryu | .................. | G02F 1/133606 349/62 |
| 2014/0175657 A1* | 6/2014 | Oka | .................. | H01L 23/49822 257/773 |
| 2014/0361444 A1* | 12/2014 | Narita | .................. | H01L 21/565 257/778 |
| 2015/0214076 A1* | 7/2015 | Kitahara | .................. | H04B 1/0475 455/571 |
| 2015/0228588 A1* | 8/2015 | Koo | .................. | H01L 23/544 257/622 |

(56) References Cited

U.S. PATENT DOCUMENTS

| | | | | |
|---|---|---|---|---|
| 2015/0235987 | A1* | 8/2015 | Danno | H01L 21/4842 |
| | | | | 438/123 |
| 2015/0348944 | A1* | 12/2015 | Shimanuki | H01L 24/85 |
| | | | | 257/737 |
| 2015/0380359 | A1* | 12/2015 | Lim | H01L 25/0655 |
| | | | | 257/773 |
| 2016/0005679 | A1* | 1/2016 | Israel | H01L 24/97 |
| | | | | 257/368 |
| 2016/0005680 | A1* | 1/2016 | Israel | H01L 23/49568 |
| | | | | 257/675 |
| 2016/0141187 | A1* | 5/2016 | Marbella | H01L 21/566 |
| | | | | 257/796 |
| 2016/0181180 | A1* | 6/2016 | Lohia | H01L 21/565 |
| | | | | 257/676 |
| 2016/0233147 | A1* | 8/2016 | Lohia | H01L 23/49513 |
| 2016/0276252 | A1* | 9/2016 | Yoshimoto | H01L 23/4952 |
| 2017/0040185 | A1* | 2/2017 | Fuwa | H01L 23/4951 |
| 2017/0053877 | A1* | 2/2017 | Hosomi | H01L 23/3107 |
| 2017/0309592 | A1* | 10/2017 | Kobayakawa | H01L 43/04 |
| 2017/0358538 | A1* | 12/2017 | Sawada | H01L 23/544 |
| 2018/0194869 | A1* | 7/2018 | Shimobe | C09J 9/00 |
| 2018/0277397 | A1* | 9/2018 | Hashizume | H01L 23/49575 |
| 2018/0277747 | A1* | 9/2018 | Shoji | G01R 33/07 |
| 2019/0006266 | A1* | 1/2019 | Gomez | H01L 23/60 |
| 2019/0074431 | A1* | 3/2019 | Hasegawa | G01R 33/07 |
| 2019/0189171 | A1* | 6/2019 | Yang | H04L 63/0876 |
| 2019/0348335 | A1* | 11/2019 | Mineta | H01L 23/49503 |
| 2020/0091416 | A1* | 3/2020 | Hasegawa | H01L 23/49548 |

FOREIGN PATENT DOCUMENTS

| | | | | |
|---|---|---|---|---|
| JP | 2015043378 A | * | 3/2015 | H01L 23/3135 |
| JP | 2019197796 A | * | 11/2019 | H01L 23/49575 |

* cited by examiner

FIG.49
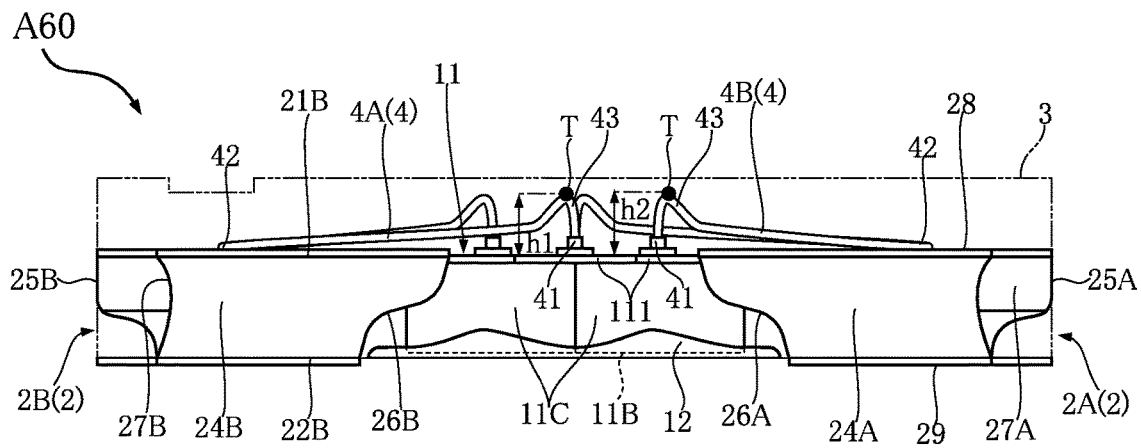
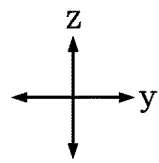
FIG.50
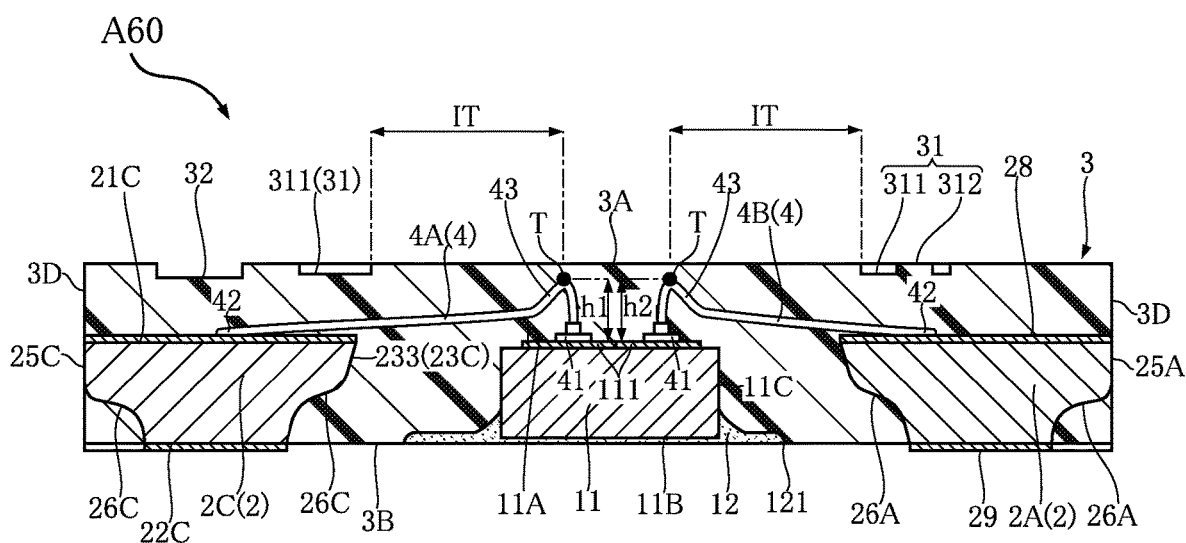
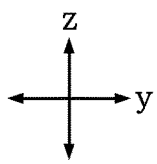

SEMICONDUCTOR DEVICE

FIELD

The present disclosure relates to a semiconductor device that includes a Hall element.

BACKGROUND

Semiconductor devices that include Hall elements are used in various electronic equipment such as cellular phones. In a cellular phone, the semiconductor device may be used to control the light source of the display of the phone in a manner such that the light source can be turned on or off in accordance with the opening or closing of the phone. The recent trend toward thinner electronic equipment (e.g., cellular phone) requires for height reduction of the incorporated semiconductor devices.

Japanese Patent No. 5676826 discloses a semiconductor device that includes a Hall element (which may often be referred to as "pellet"). The semiconductor device realizes height reduction by arranging an insulating layer in such a manner that the insulating layer is in close contact with the reverse surface of the pellet and exposed from the reverse surface of the sealing resin. However, since the heat dissipation performance of the insulating paste is relatively low due to its material characteristics, heat is likely to build up inside the semiconductor device during the operation of the pellet, thereby to hinder the performance of the pellet.

SUMMARY

The present disclosure is proposed under the above circumstances and aims to provide a semiconductor device that is capable of improving heat dissipation while achieving height reduction.

According to an embodiment of the present disclosure, there is provided a semiconductor device including a semiconductor element, a conductive layer, a plurality of terminals and a sealing resin. The semiconductor element includes an obverse surface and a reverse surface facing away from each other in a thickness direction, and a side surface connected to the obverse surface and the reverse surface. The conductive layer is in contact with the reverse surface and the side surface and contains metal particles. The plurality of terminals are spaced apart from the semiconductor element and electrically connected to the semiconductor element. The sealing resin includes a first surface facing in the direction in which the obverse surface faces and a second surface facing away from the first surface. The sealing resin covers the semiconductor element. Further, the conductive layer has an edge located on an outer side of an edge of the semiconductor element as viewed in the thickness direction (in other words, in plan view). Each of the terminals includes a top surface facing in the direction in which the obverse surface faces, a bottom surface facing away from the top surface, an inner side surface connected to the top surface and in contact with the sealing resin. Each terminal is also formed with a dent portion recessed from the bottom surface and the inner side surface. The conductive layer and the bottom surface of each of the terminals are exposed from the second surface.

The semiconductor device according to the present disclosure enhances heat dissipation while achieving height reduction.

Other features and advantages of the present disclosure will become apparent from the following detailed description with reference to the accompanying drawings.

DRAWINGS

FIG. 49 is a right side view of the semiconductor device shown in FIG. 48;

FIG. 50 is a sectional view taken along line L-L in FIG. 48;

EMBODIMENTS

Modes for carrying out the present disclosure are described below with reference to the accompanying drawings.

With reference to FIGS. 1 to 7, a semiconductor device A10 according to a first embodiment of the present disclosure is described. The semiconductor device A10 includes a semiconductor element 11, an electrically conductive layer (or simply, conductive layer) 12, a plurality of terminals 2, a sealing resin 3, and a plurality of wires 4.

Figure 1:
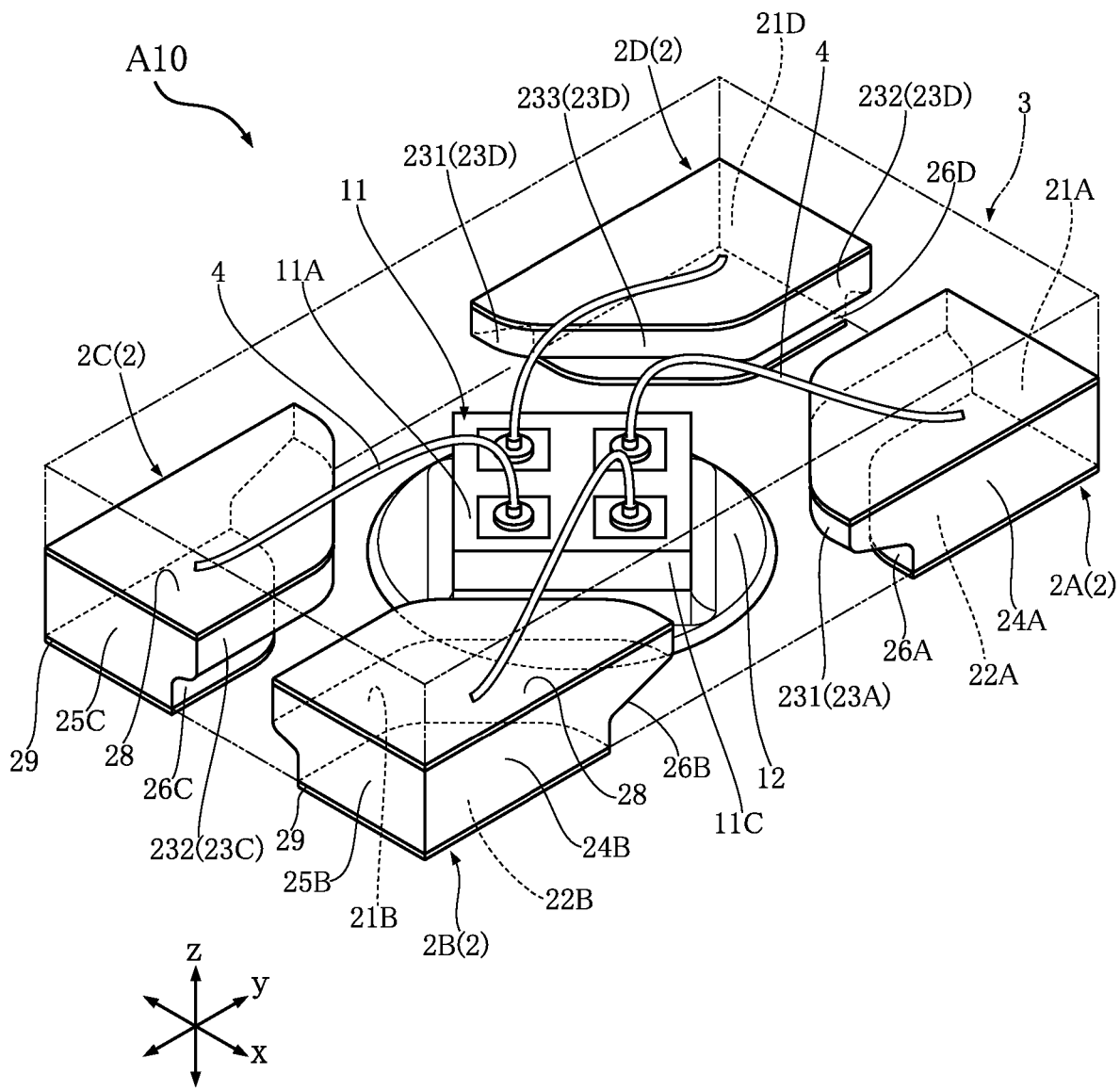
FIG. 1 is a perspective view of a semiconductor device according to a first embodiment of the present disclosure, with the sealing resin depicted as transparent and indicated by two-dot chain lines.
Figure 2:
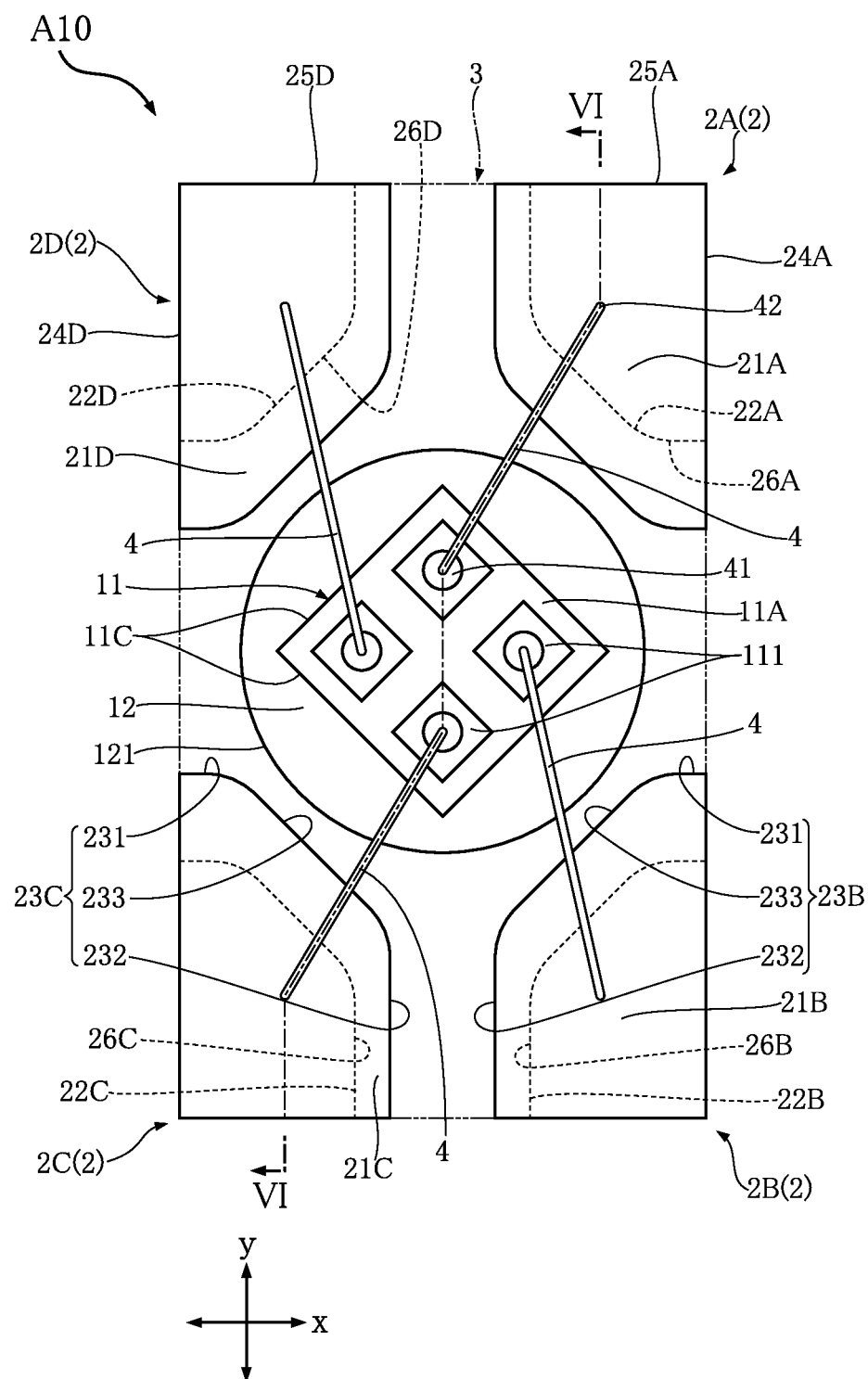
FIG. 2 is a plan view of the semiconductor device of FIG. 1.

FIG. 1 is a view as seen through the sealing resin 3, for convenience of understanding. FIG. 2 is a view as seen through inner electrically conductive layers 28 (described later) and the sealing resin 3, for convenience of understanding. In FIGS. 1 and 2, the contour of the sealing resin 3 is illustrated by imaginary lines (two-dot chain lines). In FIG. 2, line VI-VI passing through the semiconductor device is indicated by a single-dot chain line. FIG. 8 is a sectional view taken along the same plane as FIG. 6. As to the plurality of terminals 2 shown in FIGS. 1-7, reference signs for the identical elements or parts of the terminals 2 are omitted from some of the figures.

The semiconductor device A10 shown in these figures is a magnetic sensor (Hall IC) including a semiconductor element 11 that is a Hall element. The semiconductor devices A20 to A60 are also a magnetic sensor including a semiconductor element 11 that is a Hall element. The semiconductor device A10 is of a type that is surface-mounted on a wiring board of various electronic equipment such as a cellular phone. The semiconductor device A10 is rectangular as viewed in the thickness direction z of the semiconductor element 11 (hereinafter simply referred to as the "thickness direction z"). Hereinafter, for convenience of description, the widthwise direction of the semiconductor device A10 that is perpendicular to the thickness direction z is referred to as a first direction x, whereas the longitudinal direction of the semiconductor device A10 that is perpendicular to both of the thickness direction z and the first direction x is referred to as a second direction y.

Figure 6:
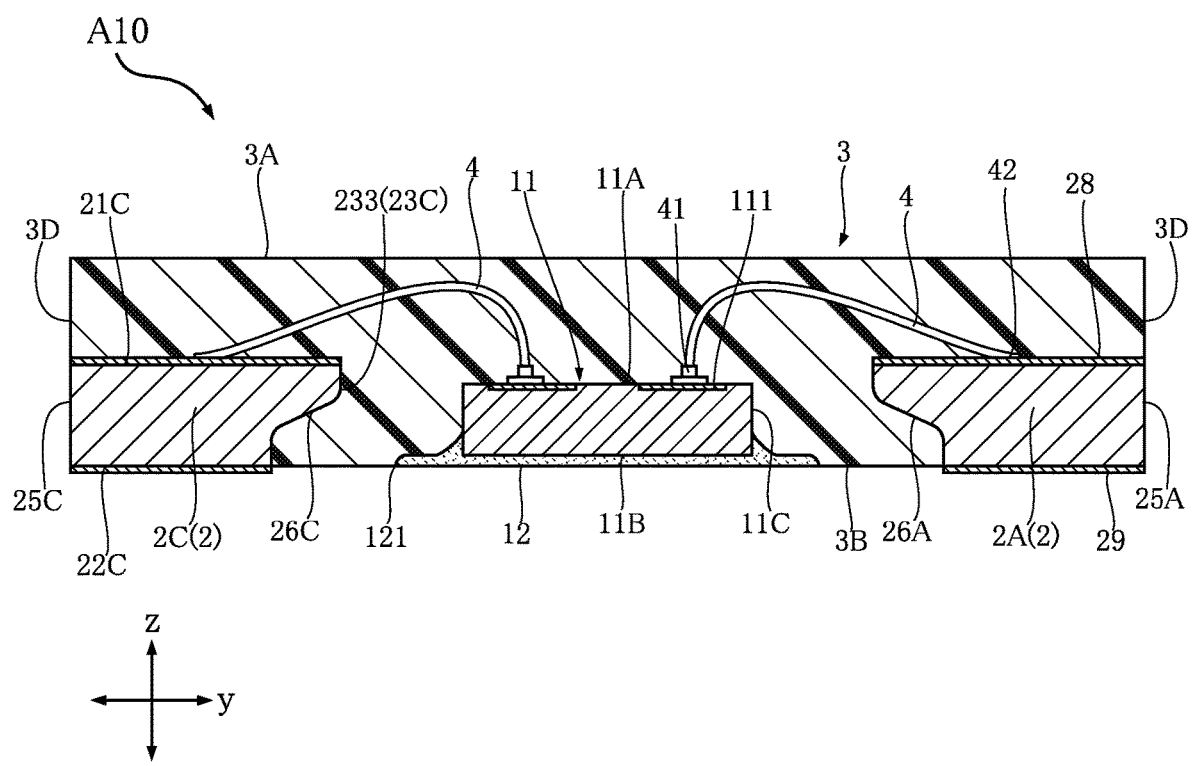
FIG. 6 is a sectional view taken along line VI-VI in FIG. 2.

The semiconductor element 11 is a Hall element that is rectangular as viewed in the thickness direction z, as shown in FIG. 2. The main material for the semiconductor element 11 is gallium arsenide (GaAs), for example. The Hall element containing gallium arsenide as the main material is advantageous in that it has excellent linearity of Hall voltage in response to the change of magnetic flux density and is not easily affected by temperature variations. Alternatively, the main material for the semiconductor element 11 may be selected from silicon (Si), indium arsenide (InAs), and indium antimonide (InSb). The main material for the semiconductor element 11 is not limited to these. As shown in FIG. 6, the semiconductor element 11 has an obverse surface 11A and a reverse surface 11B that face away from each other in the thickness direction z. The obverse surface 11A is covered with the sealing resin 3. As shown in FIGS. 2 and 6, the obverse surface 11A is provided with a plurality of electrodes 111. The electrodes 111 are made of a metal layer formed by laminating a gold (Au) layer on a titanium (Ti) layer, for example. A wire 4 is connected to each of the electrodes 111. The reverse surface 11B is in contact with the conductive layer 12.

As shown in FIGS. 1, 2, and 6, the semiconductor element 11 has a side surface 11C connected to both of the obverse surface 11A and the reverse surface 11B. The side surface 11C has four sections. The conductive layer 12 is partially in contact with each of the four sections. The boundary between the obverse surface 11A and the side surface 11C corresponds to the edge of the semiconductor element 11 as viewed in the thickness direction z. As shown in FIG. 2, the edge of the semiconductor element 11 as viewed in the thickness direction z is made up of four sides inclined with respect to both of the first direction x and the second direction y. In the example of the semiconductor device A10, each of the four sides is inclined at an inclination angle 45° with respect to both of the first direction x and the second direction y.

As shown in FIGS. 1-6 (excluding FIGS. 4 and 5), the conductive layer 12 is in contact with the reverse surface 11B of the semiconductor element 11. The lower end of the conductive layer 12, which is shown in FIG. 6, is exposed from the sealing resin 3. The conductive layer 12 is in contact with both of the reverse surface 11B and the side surface 11C (the semiconductor element 11). As shown in FIG. 2, the edge 121 of the conductive layer 12 is located on the outer side of the edge of the semiconductor element 11. The conductive layer 12 is a dried and hardened die-attach paste containing particles of a metal such as silver (Ag), for example. Since the conductive layer 12 contains metal particles, the thermal conductivity of the conductive layer 12 is relatively high.

As shown in FIGS. 1-6, the plurality of terminals 2 form an electrical conduction path between the semiconductor element 11 and the wiring board on which the semiconductor device A10 is mounted. The plurality of terminals 2 are spaced apart from the semiconductor element 11. Each of the plurality of terminals 2 is electrically connected to the obverse surface 11A (electrode 111) of the semiconductor element 11 via a wire 4. The plurality of terminals 2 are constituted of four terminals, which are referred to as 2A, 2B, 2C, and 2D. Specifically, for convenience of description, the terminal 2 located on the upper right in FIG. 2 is referred to as a terminal 2A. The terminal 2 located on the lower right in FIG. 2 is referred to as a terminal 2B, the terminal 2 located on the lower left in FIG. 2 is referred to as a terminal 2C, and the terminal 2 located on the upper left in FIG. 2 is referred to as a terminal 2D. In the semiconductor devices A20-A60 (described later) as well, the plurality of terminals 2 are constituted of four terminals 2A, 2B, 2C, and 2D, and the positions of these terminals are the same as those in the semiconductor device A10. Each of the terminals 2 has a top surface 21, a bottom surface 22, an inner side surface 23, a first outer side surface 24, a second outer side surface 25 and a dent portion 26. The terminals 2 further include inner electrically conductive layers 28 and outer electrically conductive layer 29. The plurality of terminals 2 excluding the inner conductive layers 28 and the outer conductive layers 29 are made of a same metallic material. The metallic material includes copper (Cu), for example. The metallic material may be any metallic material as long as it is electrically conductive and nonmagnetic.

As shown in FIGS. 1, 2, and 6, the top surfaces 21 face in the same direction as the obverse surface 11A of the semiconductor element 11. A wire 4 is connected to each of the top surfaces 21 via an inner electrically conductive layer (or simply, inner conductive layer) 28. In the present specification, the top surface 21 of the terminal 2A is referred to as a top surface 21A, the top surface 21 of the terminal 2B is referred to as a top surface 21B, the top surface 21 of the terminal 2C is referred to as a top surface 21C, and the top surface 21 of the terminal 2D is referred to as a top surface 21D. The shape of the top surface 21C is the same as that of the top surface 21A. The shape of the top surface 21D is the same as that of the top surface 21B.

As shown in FIGS. 1-6, the bottom surfaces 22 face away from the top surfaces 21. The bottom surfaces 22 are exposed from the sealing resin 3. In the present specification, the bottom surface 22 of the terminal 2A is referred to as a bottom surface 22A, the bottom surface 22 of the terminal 2B is referred to as a bottom surface 22B, the bottom surface 22 of the terminal 2C is referred to as a bottom surface 22C, and the bottom surface 22 of the terminal 2D is referred to as a bottom surface 22D. The shape of the bottom surface 22C is the same as that of the bottom surface 22A. The shape of the bottom surface 22D is the same as that of the bottom surface 22B.

As shown in FIGS. 1-6 (excluding FIG. 3), the inner side surfaces 23 are connected to the top surfaces 21 and in contact with the sealing resin 3. In the present specification, the inner side surface 23 of the terminal 2A is referred to as an inner side surface 23A, the inner side surface 23 of the terminal 2B is referred to as an inner side surface 23B, the inner side surface 23 of the terminal 2C is referred to as an inner side surface 23C, and the inner side surface 23 of the terminal 2D is referred to as an inner side surface 23D. The shape of the inner side surface 23C is the same as that of the inner side surface 23A. The shape of the inner side surface 23D is the same as that of the inner side surface 23B. In each of the terminals 2, the inner side surface 23 (inner side surface 23A, 23B, 23C, 23D) includes a first portion 231, a second portion 232, and a third portion 233. The first portion 231 is arranged along both of the first direction x and the thickness direction z. In the first direction x, one end of the first portion 231 is connected to a first outer side surface 24. The second portion 232 is arranged along both of the second direction y and the thickness direction z. In the second direction y, one end of the second portion 232 is connected to a second outer side surface 25. The third portion 233 is arranged along the thickness direction z and inclined with respect to both of the first direction x and the second direction y. The most suitable inclination angle of the third portion 233 with respect to each of the first direction x and the second direction y may be 45°, and the acceptable error range of the inclination angle is ±5°. As viewed in the thickness direction z, one end of the third portion 233 is connected to the first portion 231, whereas the other end of the third portion 233 is connected to the second portion 232. As shown in FIG. 2, the third portion 233 is parallel to one of the four sides of the edge of the semiconductor element 11.

As shown in FIGS. 1-5, each of the first outer side surfaces 24 is connected to all of a top surface 21, a bottom surface 22 and an inner side surface 23 (first portion 231) and faces in the first direction x. The first outer side surfaces 24 are exposed from the sealing resin 3. In the present specification, the first outer side surface 24 of the terminal 2A is referred to as a first outer side surface 24A, the first outer side surface 24 of the terminal 2B is referred to as a first outer side surface 24B, the first outer side surface 24 of the terminal 2C is referred to as a first outer side surface 24C, and the first outer side surface 24 of the terminal 2D is referred to as a first outer side surface 24D. The shape of the first outer side surface 24C is the same as that of the first outer side surface 24A. The shape of the first outer side surface 24D is the same as that of the first outer side surface 24B.

As shown in FIGS. 1-6, each of the second outer side surfaces 25 is connected to all of a top surface 21, a bottom surface 22 and an inner side surface 23 (second portion 232) and faces in the second direction y. The second outer side surfaces 25 are exposed from the sealing resin 3. The second outer side surfaces 25 are connected to the first outer side surfaces 24. As viewed in the thickness direction, a portion at which a plane containing a first outer side surface 24 and a plane containing a second outer side surface 25 meet with each other defines a corner of the semiconductor device A10. In the present specification, the second outer side surface 25 of the terminal 2A is referred to as a second outer side surface 25A, the second outer side surface 25 of the terminal 2B is referred to as a second outer side surface 25B, the second outer side surface 25 of the terminal 2C is referred to as a second outer side surface 25C, and the second outer side surface 25 of the terminal 2D is referred to as a second outer side surface 25D. The shape of the second outer side surface 25C is the same as that of the second outer side surface 25A. The shape of the second outer side surface 25D is the same as that of the second outer side surface 25B.

As shown in FIGS. 1-6, each of the dent portions 26 is recessed from both of a bottom surface 22 and an inner side surface 23. Each terminal 2 has an eave-like portion defined as a part that overlaps with the dent portion 26 as viewed in the z direction. The dent portions 26 are in contact with the sealing resin 3. In the example of the semiconductor device A10, the dent portions 26 are filled with the sealing resin 3. In the present specification, the dent portion 26 of the terminal 2A is referred to as a dent portion 26A, the dent portion 26 of the terminal 2B is referred to as a dent portion 26B, the dent portion 26 of the terminal 2C is referred to as a dent portion 26C, and the dent portion 26 of the terminal 2D is referred to as a dent portion 26D.

Figure 7:
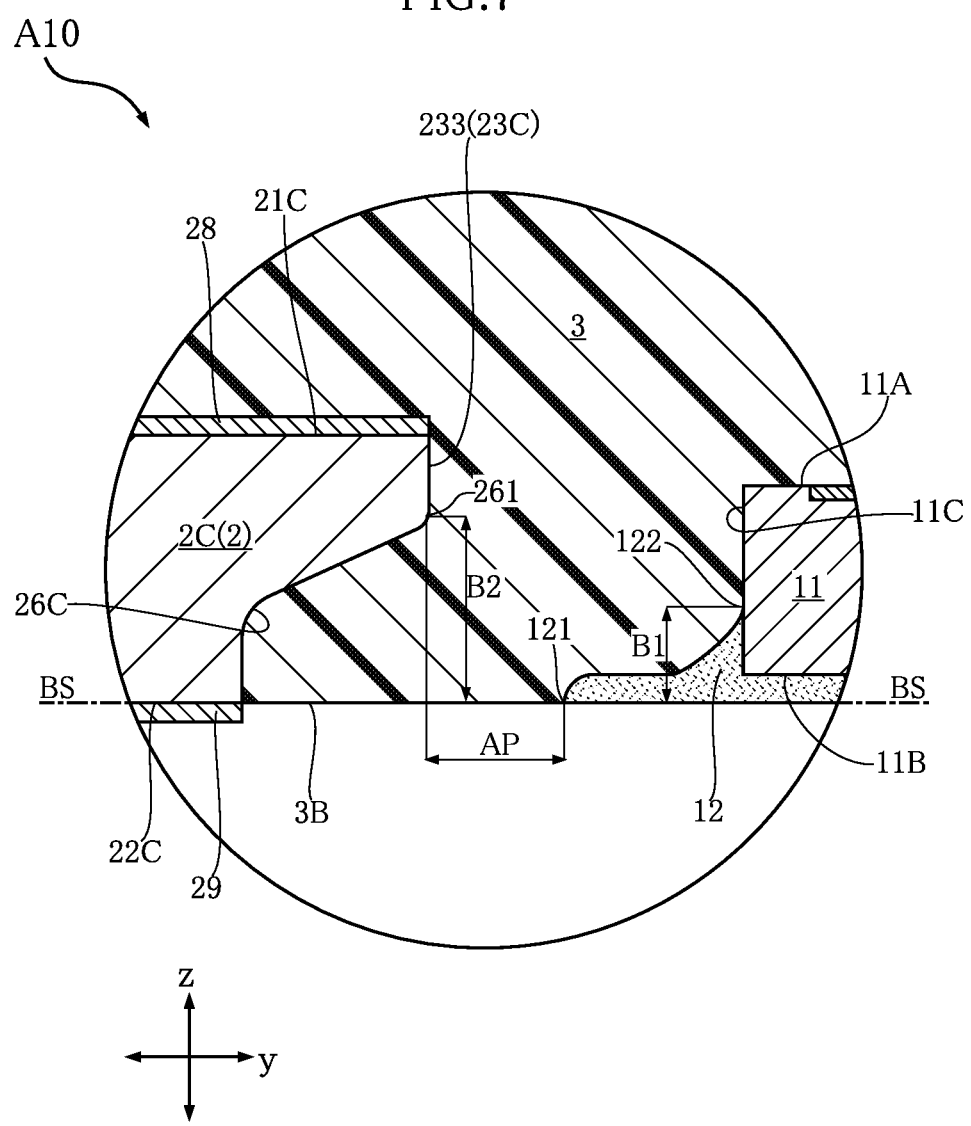
FIG. 7 is a sectional view showing a part of FIG. 6 as enlarged.
Figure 8:
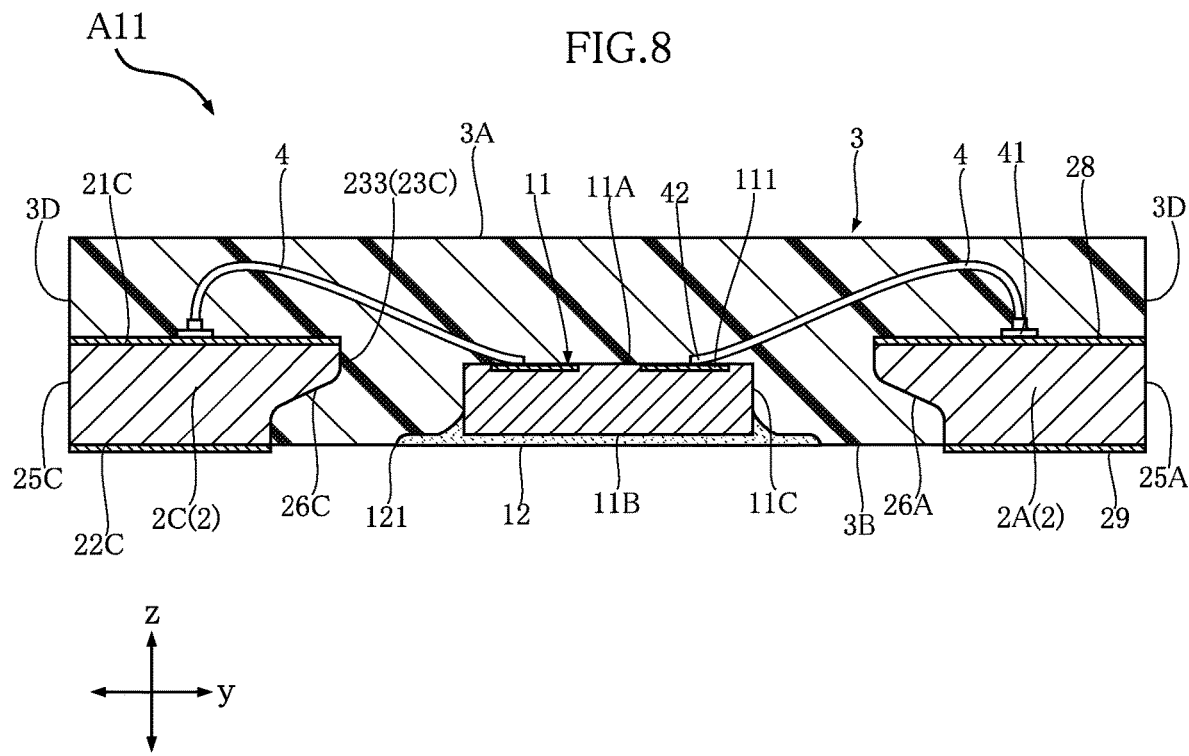
FIG. 8 is a sectional view of a semiconductor device according to a variation of the first embodiment of the present disclosure.

Referring to FIGS. 2 and 7, as viewed in the thickness direction z, the edge 121 of the conductive layer 12 is spaced apart from the top surfaces 21 and the dent portions 26 of the terminals 2 (see the separation "AP" in FIG. 7). As shown in FIG. 7, a base surface BS may be defined as a surface that contains a second surface 3B of the sealing resin 3 and that is perpendicular to the thickness direction z. In addition to the second surface 3B, the base surface BS contains the lower end of the conductive layer 12 and the bottom surfaces 22A, 22B, 22C and 22D of the terminals 2. The distance B1 from the base surface BS to the farthest (or highest) portion 122 of the conductive layer 12 is shorter than the distance B2 from the base surface BS to the boundary 261 between the inner side surface 23 and the dent portion 26. Here, the farthest portion 122 is the top of the part of the conductive layer 12 that is in contact with the side surface 11C. The boundary 261 between the inner side surface 23 and the dent portion 26 extends in parallel to the base surface BS.

As shown in FIGS. 1-6 (excluding FIGS. 2 and 3), the inner conductive layers 28 cover the top surfaces 21 of the terminals 2. The inner conductive layers 28 are made of Ag, for example. The inner conductive layers 28 may be formed by laminating a nickel (Ni) layer, a palladium (Pd) layer and a gold layer in the mentioned order or laminating a palladium layer on a nickel layer. The configuration of the inner conductive layers 28 is not limited to these. The inner conductive layers 28 are covered with the sealing resin 3. As shown in FIGS. 1-6 (excluding FIG. 2), the outer conductive layers 29 cover the bottom surfaces 22 of the terminals 2. The outer conductive layer 29 may be made of an alloy containing tin (Sn). Examples of the alloy include a lead-free solder alloy such as tin-antimony alloy or tin-silver alloy. The outer conductive layers 29 may be formed by laminating such an alloy layer on a silver layer or laminating a gold layer on a silver layer. The configuration of the outer conductive layers 29 is not limited to these. The outer conductive layers 29 are exposed.

As shown in FIGS. 3-6, the sealing resin 3 covers the semiconductor element 11, the wires 4, a part of the conductive layer 12, and a part of each terminal 2. The sealing resin 3 is made of a thermosetting synthetic resin having electrically insulating properties. For example, the synthetic resin is black epoxy resin. The sealing resin 3 has a first surface 3A, a second surface 3B, a third surface 3C, and a fourth surface 3D.

Figure 4:
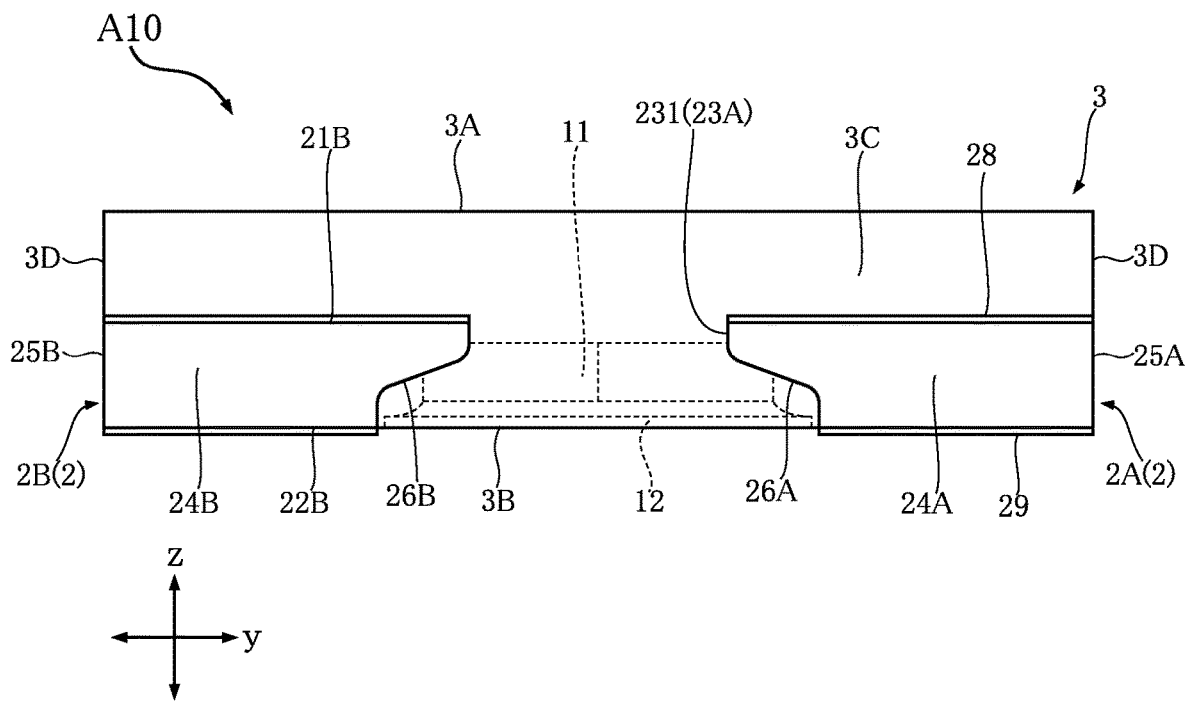
FIG. 4 is a right side view of the semiconductor device shown in FIG. 1.
Figure 5:
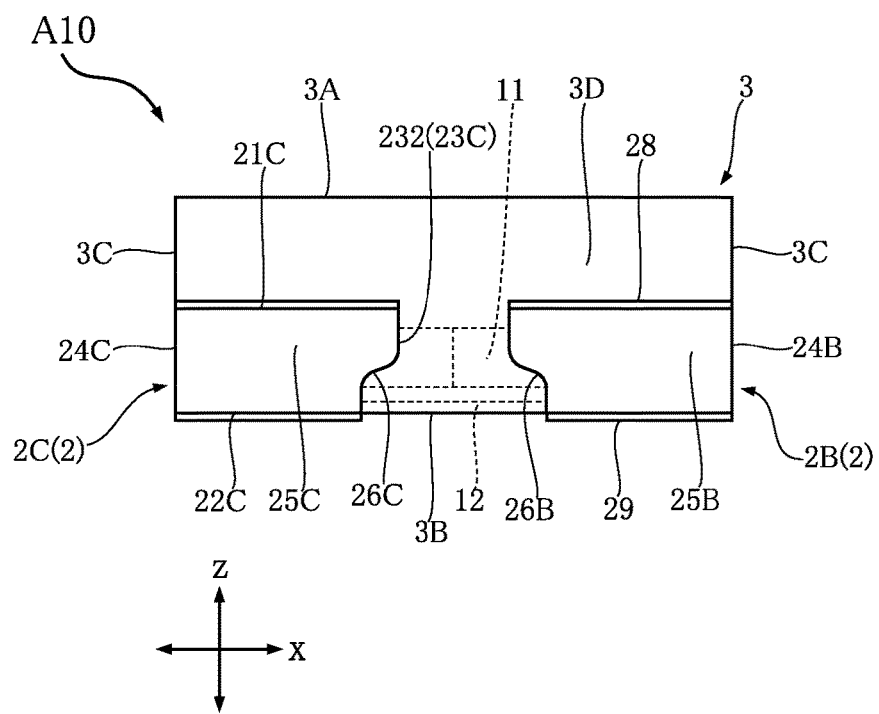
FIG. 5 is a front view of the semiconductor device shown in FIG. 1.

As shown in FIGS. 4-6, the first surface 3A faces in the same direction as the obverse surface 11A of the semiconductor element 11. The second surface 3B faces away from the first surface 3A. The conductive layer 12 and the bottom surfaces 22 of the terminals 2 are exposed from the second surface 3B. The conductive layer 12 and the bottom surfaces 22 are flush with the second surface 3B.

Figure 3:
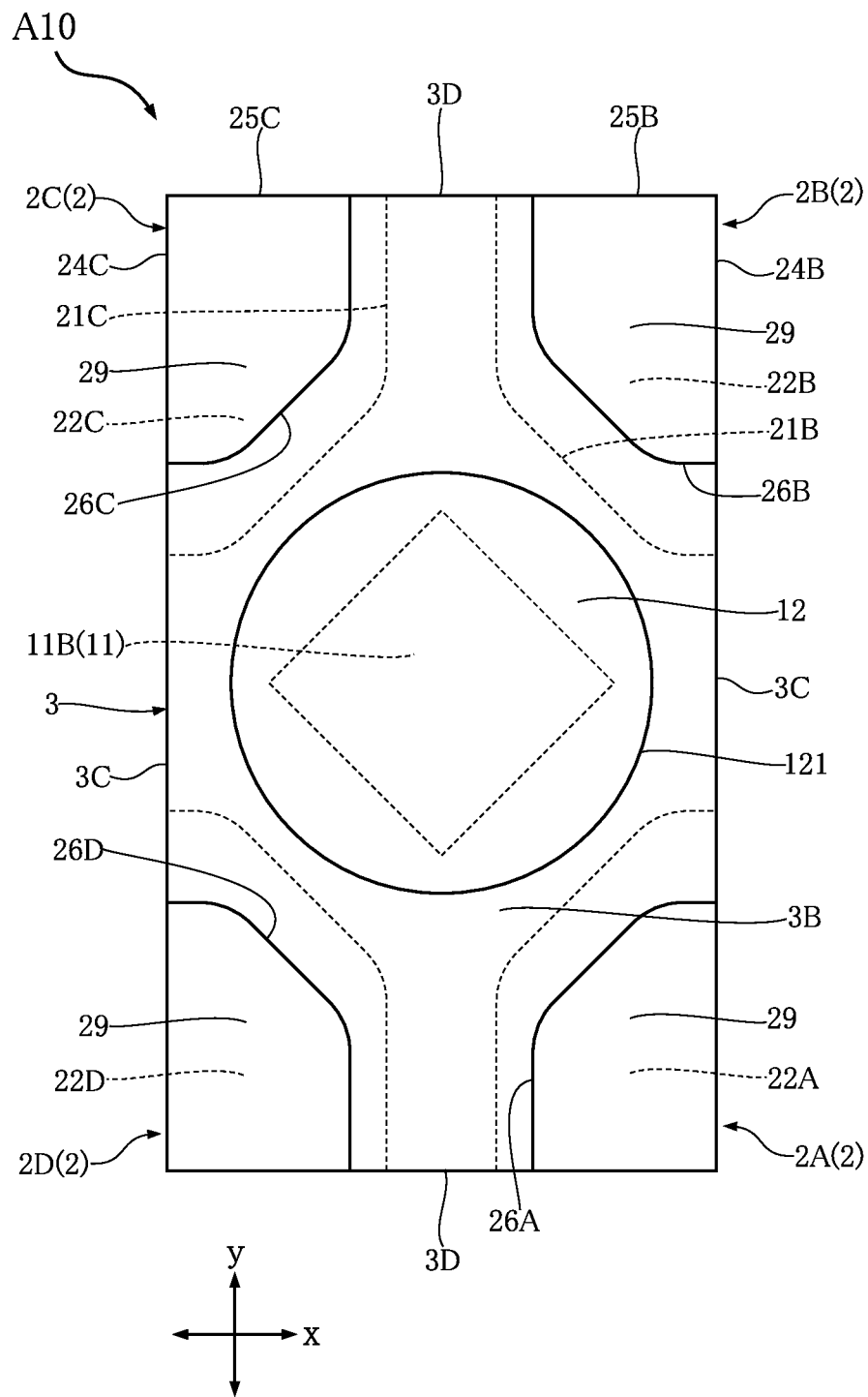
FIG. 3 is a bottom view of the semiconductor device shown in FIG. 1.

As shown in FIGS. 3-5, the third surface 3C is connected to both of the first surface 3A and the second surface 3B and faces in the first direction x. The third surface 3C includes a pair of sections spaced apart from each other in the first direction x. All of the first outer side surfaces 24 of the terminals 2 are exposed from the third surface 3C. The first outer side surfaces 24 are flush with the third surface 3C.

As shown in FIGS. 3-6, the fourth surface 3D is connected to both of the first surface 3A and the second surface 3B and faces in the second direction y. The fourth surface 3D includes a pair of sections spaced apart from each other in the second direction y. Opposite ends of each section of the fourth surface 3D are connected to the third surface 3C. All of the second outer side surface 25 of the terminals 2 are exposed from the fourth surface 3D. The second outer side surfaces 25 are flush with the fourth surface 3D.

As shown in FIGS. 1, 2, and 6, the wires 4 electrically connect the electrodes 111 of the semiconductor element 11 and the terminals 2 to each other. In the illustrated example, four wires 4 are provided. The wires 4 are made of gold, for example. The wires 4 are formed by wire bonding. Each of the four wires has a first connecting portion 41 and a second connecting portion 42. The first connecting portions 41 are ball bonding portions that are formed first in the wire forming process. The first connecting portions 41 are connected to the electrodes 111 of the semiconductor element 11. The second connecting portions 42 are stich bonding portions that are formed last in the wire forming process. The second connecting portions 42 are connected to the inner conductive layers 28 covering the top surfaces 21 of the terminals 2. In the illustrated example, each second connecting portion 42 is connected to a part of the inner conductive layer 28 covering the portion of the top surface 21 that overlaps with the bottom surface 22 as viewed in the thickness direction z.

Referring now to FIG. 8, a semiconductor device A11, which is a variation of the semiconductor device A10, is described. In the semiconductor device A11, the first connecting portions 41 of the wires 4 are connected to the inner conductive layers 28 covering the top surfaces 21 of the terminals 2. The second connecting portions 42 of the wires 4 are connected to the electrodes 111 of the semiconductor element 11. In this case, each first connecting portion 41 is connected to the inner conductive layer 28 on the part of the top surface 21 that overlaps with the bottom surface 22 as viewed in the thickness direction z. As will be understood from this variation, the wires 4 may be connected in the manner according to the semiconductor device A10 or in the manner according to the semiconductor device A11.

Figure 9:
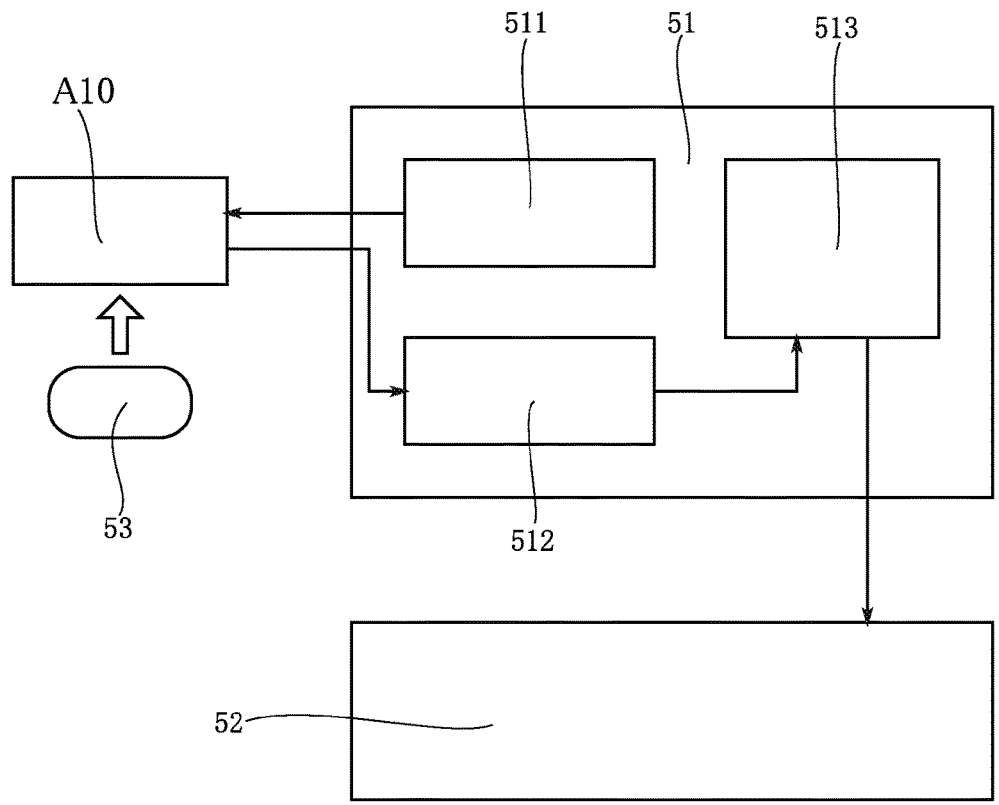
FIG. 9 is a block diagram of a circuit including the semiconductor device shown in FIG. 1 as its constituent element.
Figure 10:
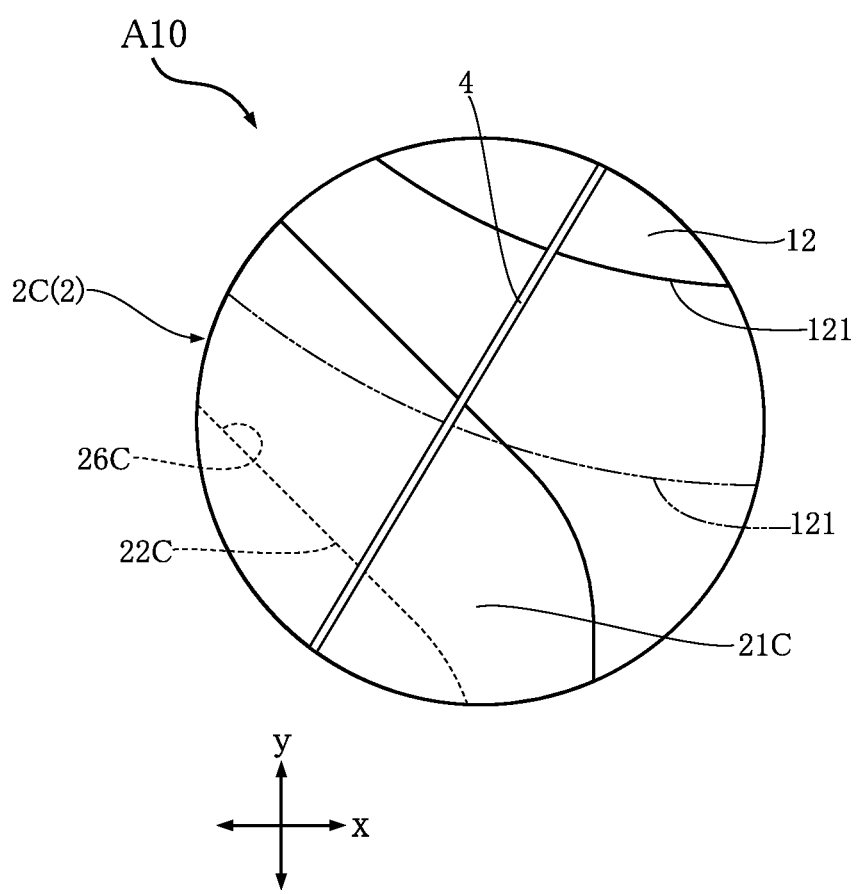
FIG. 10 shows a part of FIG. 2 as enlarged.

Referring now to FIG. 9, an example of a circuit including the semiconductor device A10 as its constituent element is described below.

As shown in FIG. 9, the circuit includes the semiconductor device A10, an integrated circuit 51 and a control target 52. Examples of the control target 52 include a light source of a display of a cellular phone and a DC motor. The integrated circuit 51 includes a device driving circuitry 511, a voltage detecting circuitry 512 and a controlling circuitry 513. The device driving circuitry 511 applies a current to the semiconductor element 11 of the semiconductor device A10. The voltage detecting circuitry 512 detects the electromotive force (Hall voltage) generated at the semiconductor element 11 due to Hall effect. The controlling circuitry 513 controls the operation of the control target 52. When a magnet 53 is brought closer to the semiconductor device A10, the semiconductor element 11 detects a change in the magnetic flux density, and an electromotive force occurs at the semiconductor element 11 due to Hall effect. The electromotive force is detected by the voltage detecting circuitry 512. The voltage detecting circuitry 512 transmits the detection results to the controlling circuitry 513. Based on the transmitted detection results, the controlling circuitry 513 controls the operation of the control target 52 (e.g. activates or stops the control target).

Referring now to FIGS. 11-18, an example of a method for manufacturing the semiconductor device A10 is described.

Figure 14:
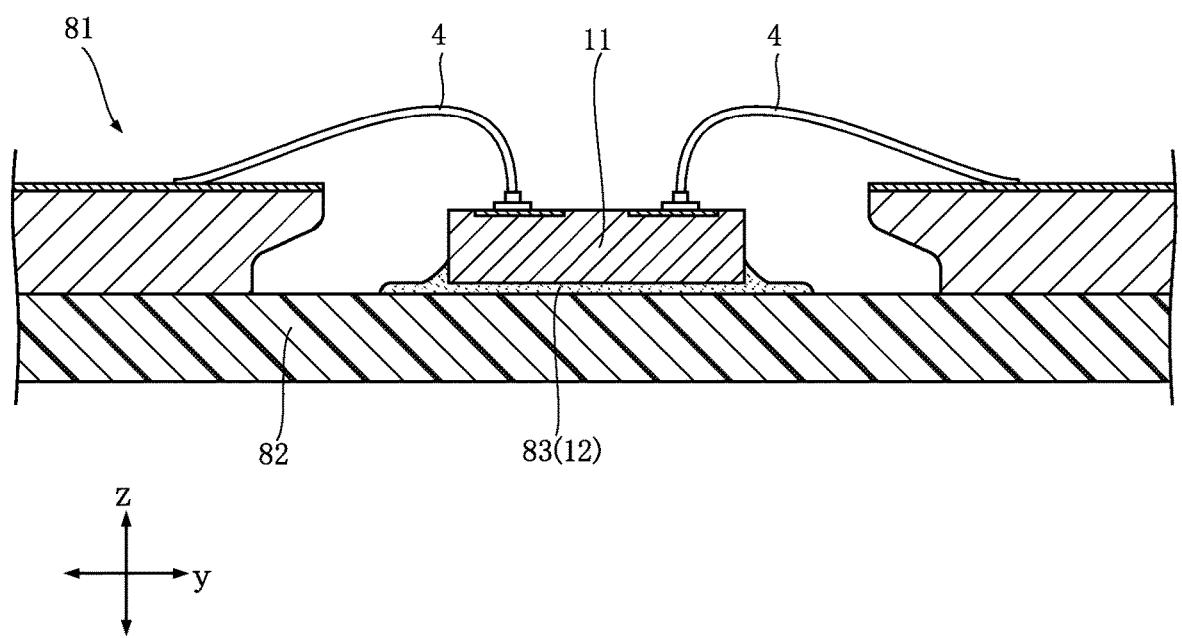
FIG. 14 is a sectional view for describing the method for manufacturing the semiconductor device shown in FIG. 1.
Figure 15:
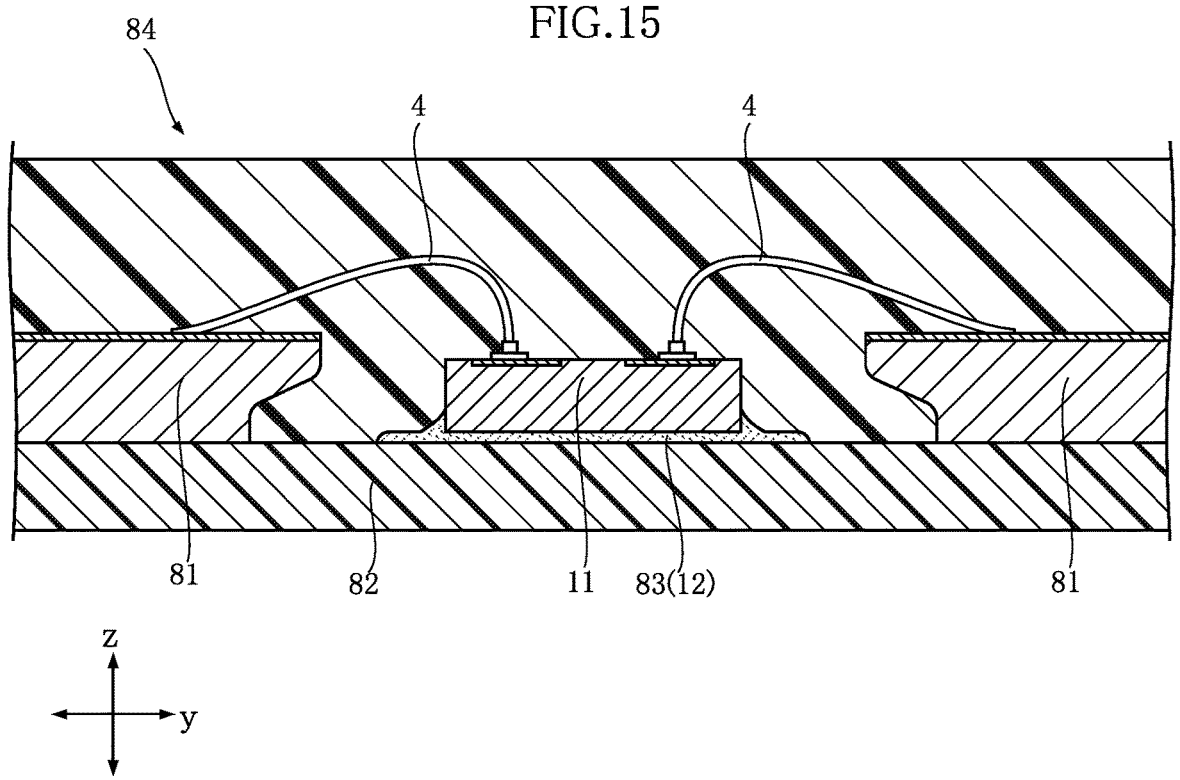
FIG. 15 is a sectional view for describing the method for manufacturing the semiconductor device shown in FIG. 1.
Figure 16:
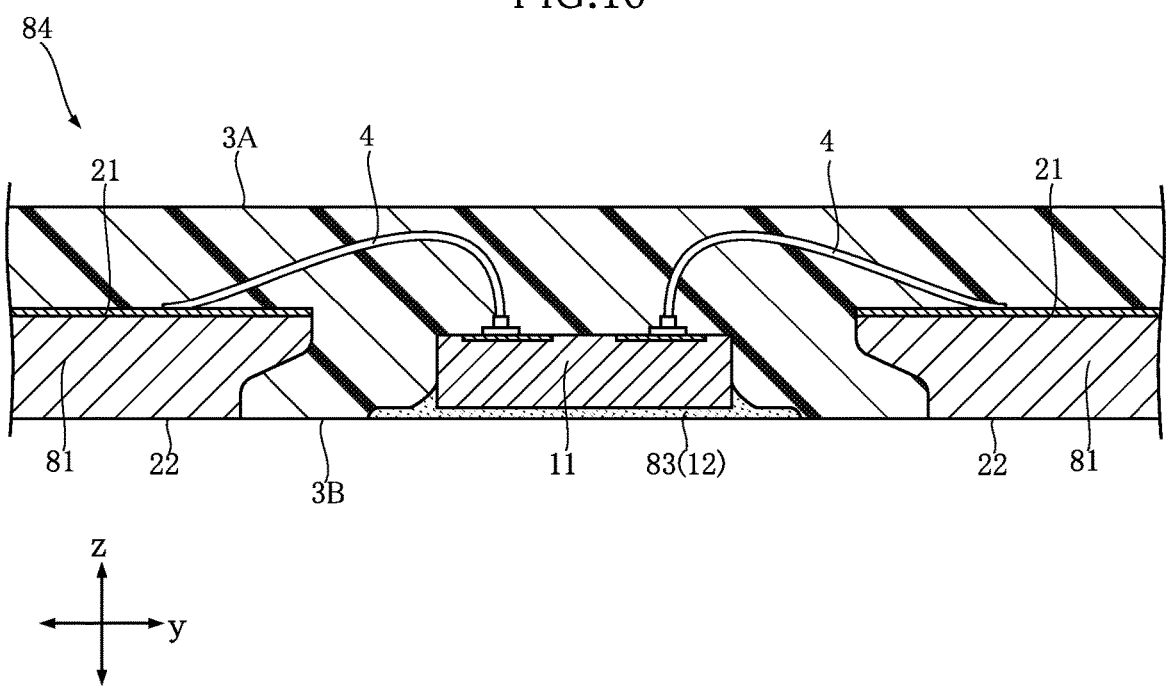
FIG. 16 is a sectional view for describing the method for manufacturing the semiconductor device shown in FIG. 1.

FIGS. 11-18 are sectional views for describing the manufacturing method of the semiconductor device A10, which are taken along the same plane as FIG. 16. Note that the thickness direction z of an electrically conductive plate (or simply, conductive plate) 81 shown in FIGS. 11-18 and the second direction y correspond to the thickness direction z and the second direction y shown in FIGS. 1-7, respectively.

Figure 11:
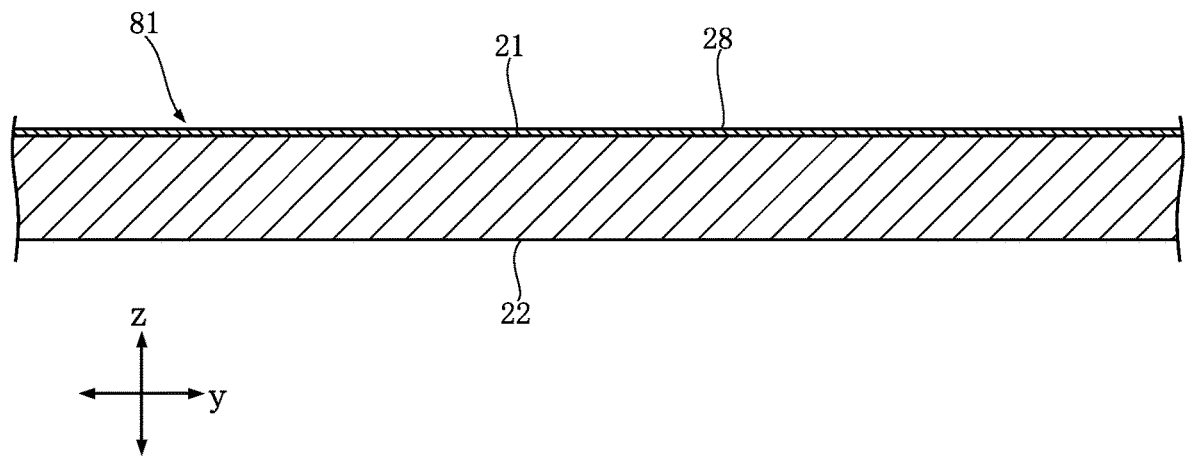
FIG. 11 is a sectional view for describing a method for manufacturing the semiconductor device shown in FIG. 1.

First, as shown in FIG. 11, a conductive plate 81 having a top surface 21 and a bottom surface 22 facing away from each other in the thickness direction z is prepared. The terminals 2 of the semiconductor device A10 are to be made from the conductive plate 81A. The conductive plate 81 is a thin metal plate containing copper, for example. The conductive plate 81 has a thickness of 100 μm, for example. Both of the top surface 21 and the bottom surface 22 are uniformly flat surfaces. The entirety of the top surface 21 is covered with an inner electrically conductive layer 28. The inner conductive layer 28 is formed by electroplating.

Figure 12:
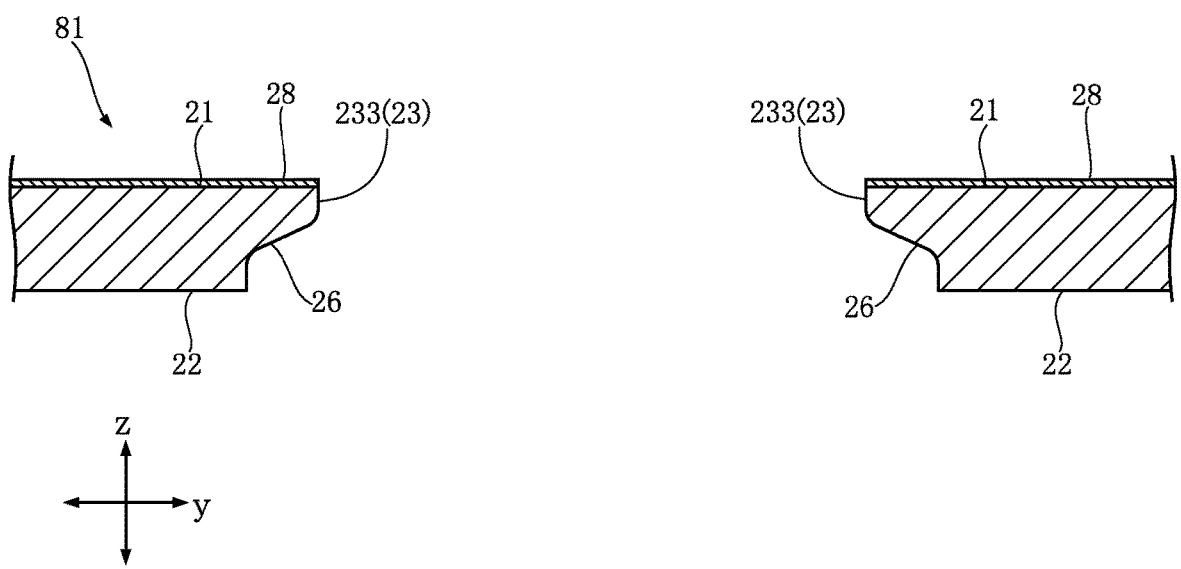
FIG. 12 is a sectional view for describing the method for manufacturing the semiconductor device shown in FIG. 1.

Then, a mask (having a predetermined pattern) is formed by photolithography on both of the inner conductive layer 28 and the bottom surface 22 of the conductive plate 81. Then, as shown in FIG. 12, a part of the conductive plate 81 and a part of the inner conductive layer 28 are removed by wet etching. For example, a mixed solution of sulfuric acid ($H_2SO_4$) and hydrogen peroxide ($H_2O_2$) is used as the etching solution. In this process, the etching is performed with respect to the conductive layer 28 and to the bottom surface 22 of the plate 81. For instance, first, a part of the conductive plate 81 is removed by half etching with respect to the bottom surface 22. Thereafter, etching is performed with respect to the inner conductive layer 28, so that a passage is formed to extend through the conductive plate 81 and the conductive layer 28 in the thickness direction z. Thus, the inner side surfaces 23 and dent portions 26 are formed in the conductive plate 81.

Figure 13:
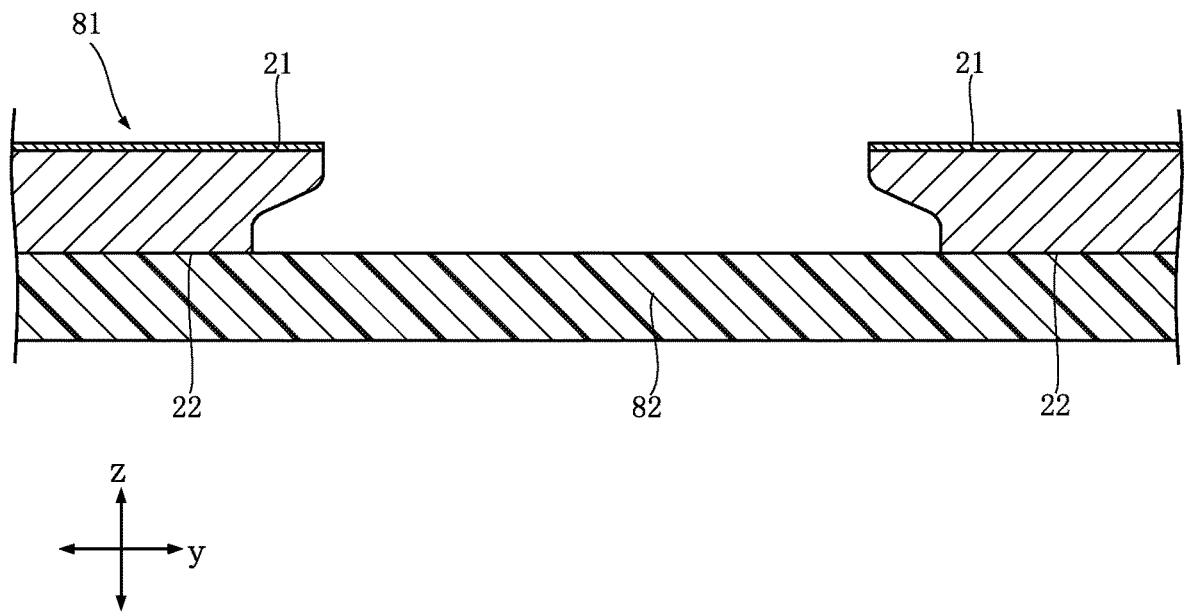
FIG. 13 is a sectional view for describing the method for manufacturing the semiconductor device shown in FIG. 1.

Then, as shown in FIG. 13, a base member 82 is attached to the bottom surface 22 of the conductive plate 81. The base member 82 may be an electrically insulating member such as a tape.

Then, as shown in FIG. 14, a semiconductor element 11 is mounted on the base member 82, and a plurality of wires 4 are formed to electrically connect the semiconductor element 11 and the conductive plate 81. Specifically, to mount the semiconductor element 11, a bonding material 83 is first applied onto the base member 82. The bonding material 83 is electrically conductive paste containing Ag, for example. Then, the semiconductor element 11 carried by a collet (which may have a sucking function) is brought above the base member 82 and bonded to the bonding material 83. Finally, the bonding material 83 is heat-cured in a curing furnace, for example. The heat-cured bonding material 83 is the conductive layer 12 of the semiconductor device A10. The wires 4 are formed by wire bonding.

Then, as shown in FIG. 15, a sealing resin 84 is formed to cover the conductive plate 81, the semiconductor element 11 and the wires 4. The sealing resin 84 is formed by heat-curing a thermosetting synthetic resin having electrically insulating properties by transfer molding. The sealing resin 84 formed in this way is in contact with the base member 82 and fills the dent portions 26 formed in the conductive plate 81.

Then, as shown in FIG. 16, the base member 82 is detached from the conductive plate 81 and the sealing resin 84, and upper part of the sealing resin 84, which is opposite to the base member 82 (prior to the detaching) with respect to the semiconductor element 11 or the conductive plate 81 in the thickness direction z, is removed uniformly by mechanical polishing along a direction perpendicular to the thickness direction z. As a result, the dimension of the sealing resin 84 in the thickness direction z is reduced, so that the height of the semiconductor device A10 can be reduced. The sealing resin 84 in this state has the first surface 3A and the second surface 3B. The bottom surface 22 of the conductive plate 81 and the bonding material 83 (electrically conductive layer 12) are exposed from the second surface 3B.

Figure 17:
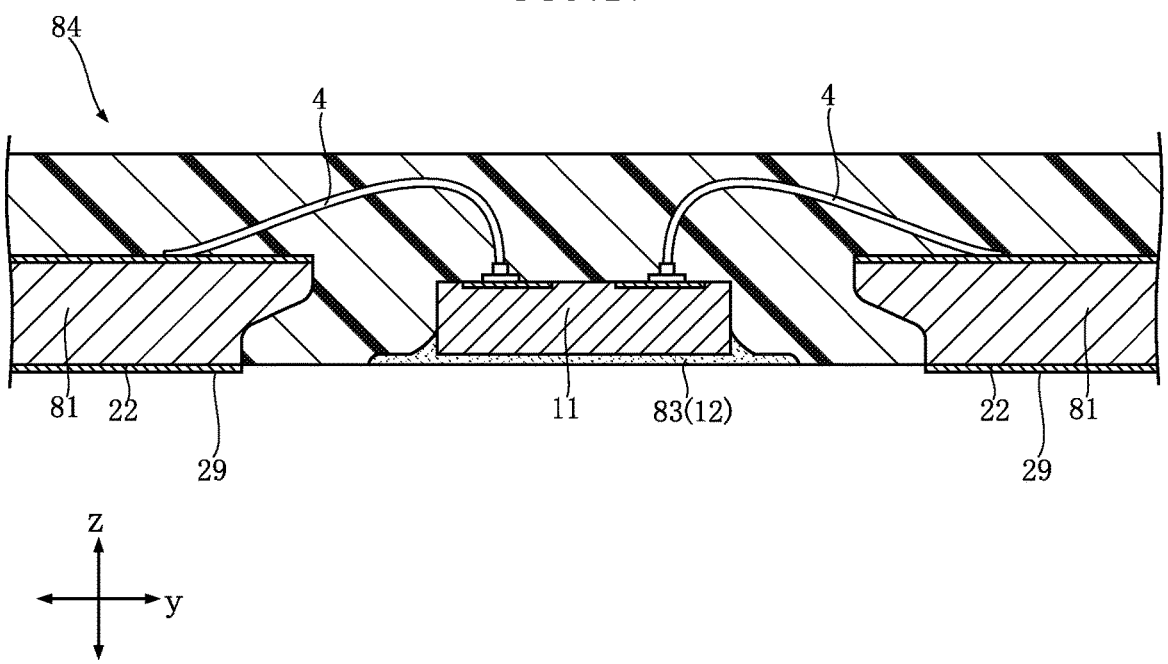
FIG. 17 is a sectional view for describing the method for manufacturing the semiconductor device shown in FIG. 1.
Figure 18:
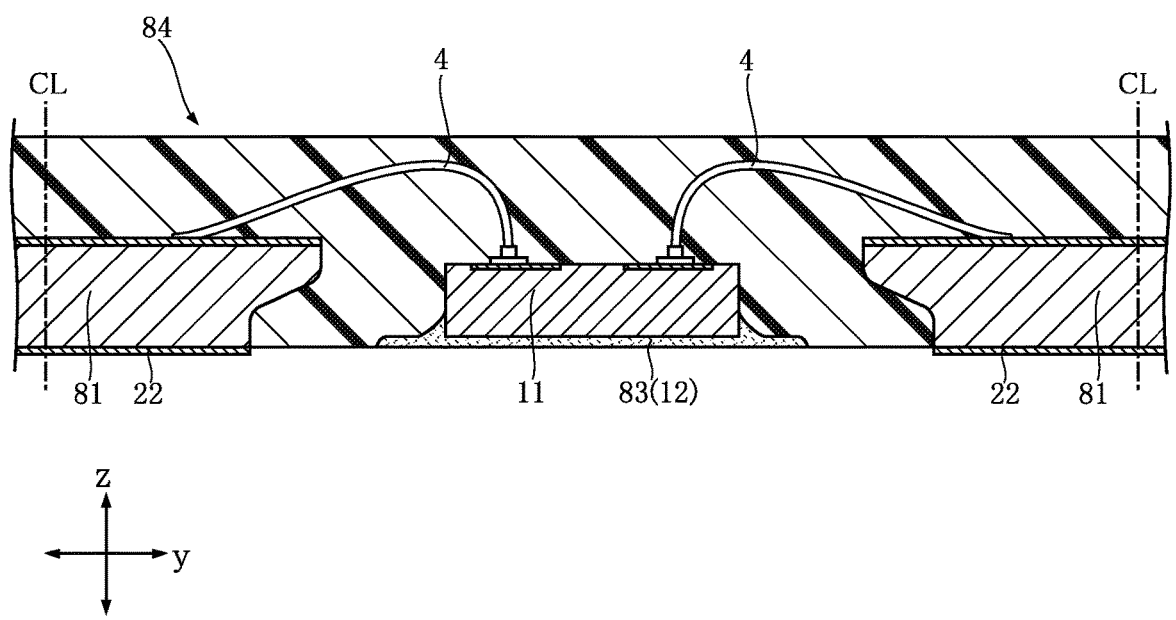
FIG. 18 is a sectional view for describing the method for manufacturing the semiconductor device shown in FIG. 1.

Then, as shown in FIG. 17, an outer electrically conductive layer (or simply, an outer conductive layer) 29 is formed to cover the bottom surface 22 of the conductive plate 21. The outer conductive layer 29 is formed by electroplating.

Subsequently, the conductive plate 81 (with the inner conductive layer 28 and the outer conductive layer 29) and the sealing resin 84 are cut along the first direction x and the second direction y for division into individual pieces. This cutting is performed with a dicing saw, starting from the side to which the bottom surface 22 of the conductive plate 81 faces. The cutting may be performed along the first direction x, in which case the cutting is performed along the cutting lines CL shown in FIG. 18. Each individual piece obtained by the division in this process corresponds to the semiconductor device A10. In this process, the conductive plate 81 becomes the terminals 2 each having a first outer side surface 24 and a second outer side surface 25. Further, the sealing resin 84 becomes the sealing resin 3 having the third surface 3C and the fourth surface 3D. The semiconductor device A10 is manufactured through the above-described process.

The advantages of the semiconductor device A10 are described below.

The semiconductor device A10 includes the conductive layer 12 that is in contact with both of the reverse surface 11B and the side surface 11C of the semiconductor element 11 and exposed from the second surface 3B of the sealing resin 3. Thus, heat generated at the semiconductor element 11 during the use of the semiconductor device A10 is efficiently dissipated to the outside through the conductive layer 12.

Each of the terminals 2 of the semiconductor device A10 is formed with a dent portion 26 recessed from both of the bottom surface 22 and the inner side surface 23. As seen from FIGS. 2 and 6, the conductive layer 12 is formed such that the edge 121 of the conductive layer 12 is located on the outer side of the edge of the semiconductor element 11, thereby enhancing the heat dissipation through the conductive layer 12. In addition, the edge 121 is spaced apart from the top surfaces 21 and the dent portions 26 of the terminals 2. Hence, short circuit between the conductive layer 12 and the terminals 2 is prevented. Further, even when a large amount of bonding material 83 (see FIG. 14) is applied to form the conductive layer 12, and a part of the edge 121 of the resulting conductive layer 12 (obtained by curing the bonding material 83) overlaps with the top surface 21 of a terminal 2 as viewed in the thickness direction z, the above-mentioned part of the edge 121 can terminate in the dent portion 26 without coming into contact with the terminal 2. In this manner, short-circuit between the conductive layer 12 and the terminals 2 can be reliably avoided.

The conductive layer 12 is formed in contact with both of the reverse surface 11B and the side surface 11C of the semiconductor element 11. Such a configuration provides a large contact area between the semiconductor element 11 and the conductive layer 12, which enhances the heat dissipation performance of the semiconductor device A10.

The dent portions 26 are filled with the sealing resin 3. With such a configuration, the eave-like portion of each terminal 2, which includes an inner side surface 23 and a portion of the top surface 21 that overlaps with a dent portion 26 as viewed in the thickness direction z, is caught unmovably by the sealing resin 3 in the thickness direction z. This prevents the terminals 2 from dropping off the second surface 3B.

The wires 4 are connected to the portions of the top surfaces 21 that overlap with the bottom surfaces 22 as viewed in the thickness direction z. With such an arrangement, in connecting the wires 4 to the terminals 2, the bonding force is supported via the bottom surfaces 22, so that the wires 4 can be bonded to the terminal 2 with sufficient bonding strength.

The terminals 2 are provided with inner electrically conductive layers 28 covering the top surfaces 21. The inner conductive layers 28 protect the terminals 2 from thermal shock that occurs in electrically connecting the wires 4 to the top surfaces 21.

The terminals 2 are also provided with outer electrically conductive layers 29 covering the bottom surfaces 22. The provision of the outer conductive layers 29 allows enhancement of the mounting strength of the semiconductor device A10 to a wiring board.

As viewed in the thickness direction z, the edge of the semiconductor element 11 of the semiconductor device A10 is made up of four sides inclined with respect to both of the first direction x and the second direction y. Further, the inner side surface 23 of each terminal 2 includes a portion (third portion 233) that is parallel to one of such four sides of the edge of the semiconductor element 11. Such a configuration allows the distance from the terminals 2 to the semiconductor element 11 to be shortened, which leads to further size reduction of the semiconductor device A10.

Figure 19:
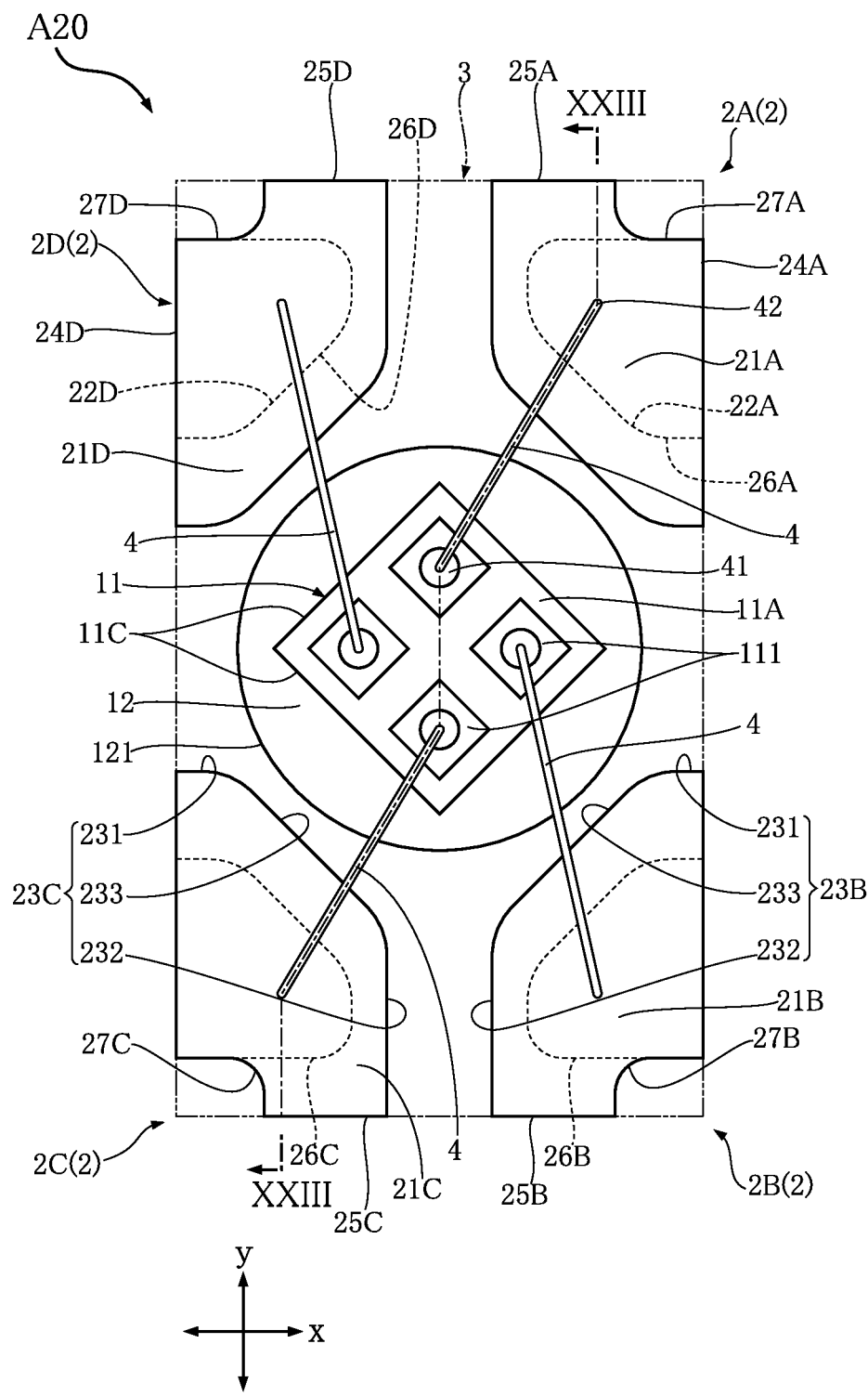
FIG. 19 is a plan view of a semiconductor device according to a second embodiment of the present disclosure.
Figure 20:
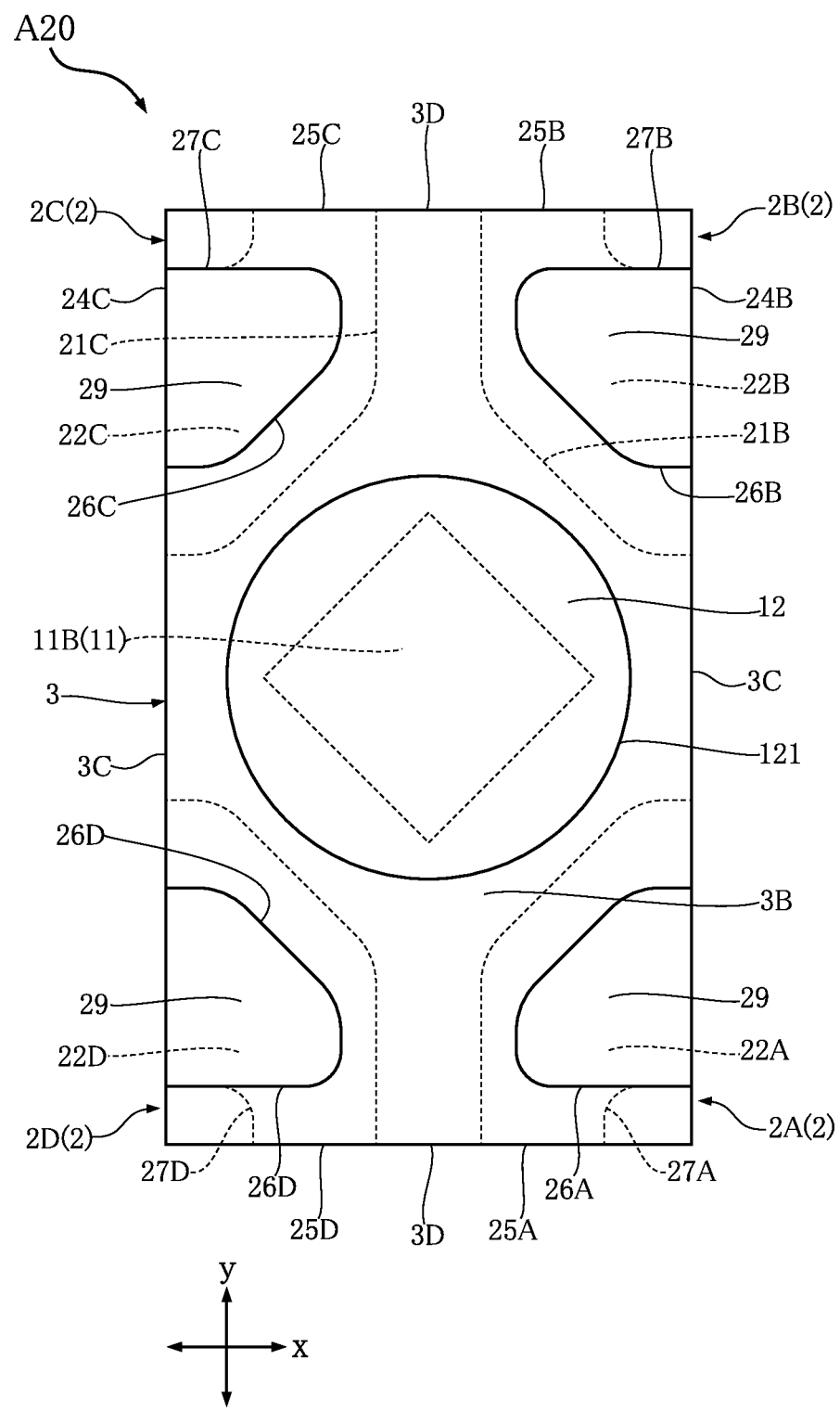
FIG. 20 is a bottom view of the semiconductor device shown in FIG. 19.
Figure 21:
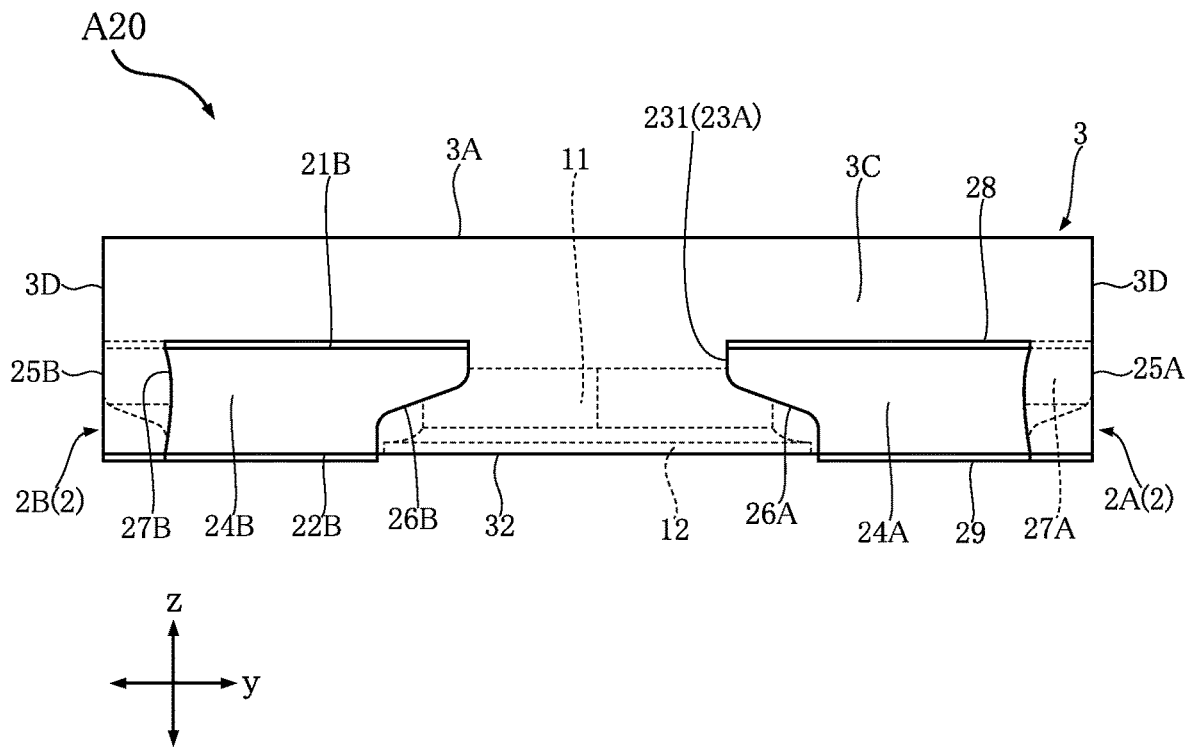
FIG. 21 is a right side view of the semiconductor device shown in FIG. 19.
Figure 22:
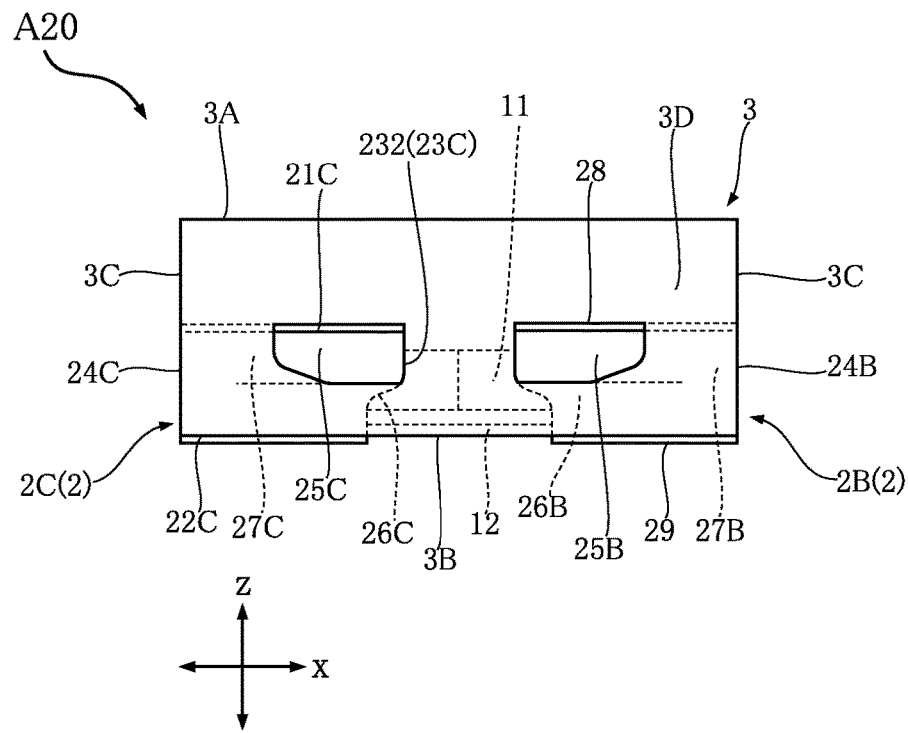
FIG. 22 is a front view of the semiconductor device shown in FIG. 19.
Figure 23:
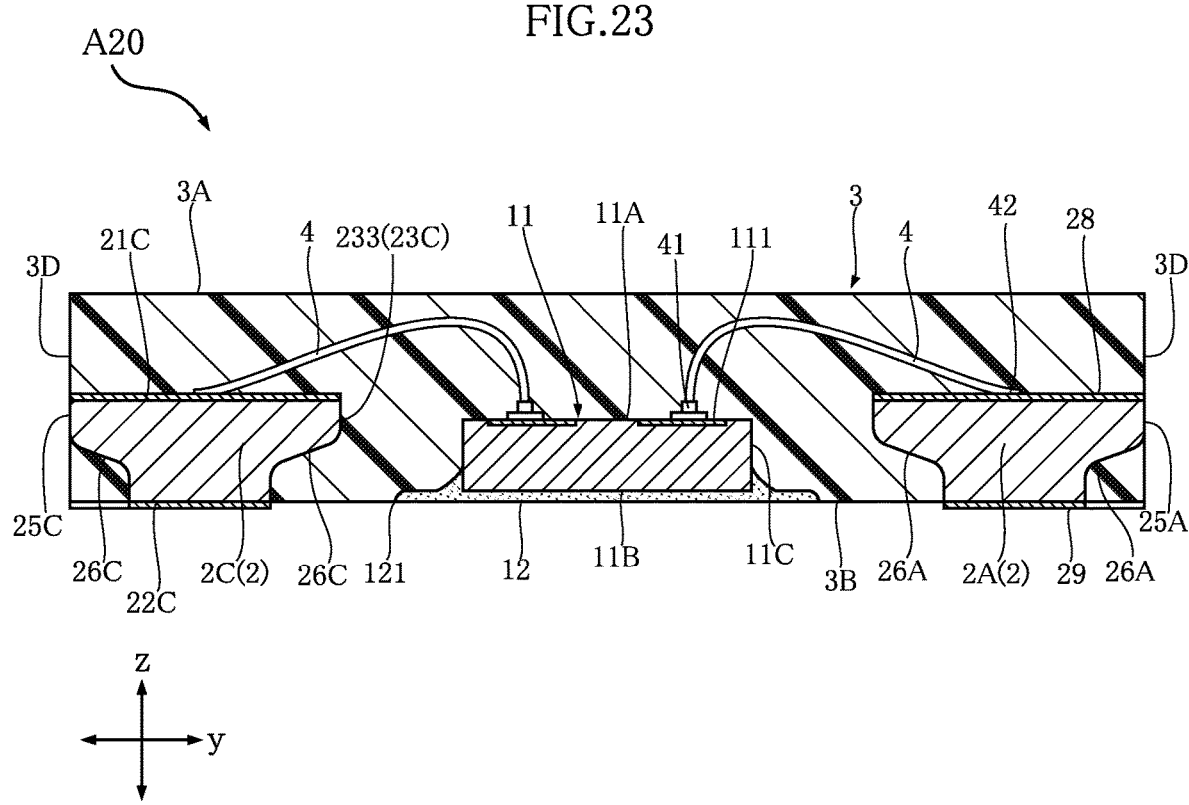
FIG. 23 is a sectional view taken along line XXIII-XXIII in FIG. 19.

With reference to FIGS. 19-23, a semiconductor device A20 according to a second embodiment of the present disclosure is described below. In these figures, the elements that are identical or similar to those of the semiconductor device A10 are designated by the same reference signs as those used for the semiconductor device A10, and the description is omitted. Note that FIG. 19 is a view as seen through the inner conductive layers 28 and the sealing resin 3, for convenience of understanding. In FIG. 19, the contour of the sealing resin 3 is illustrated by imaginary lines. In FIG. 19, line XXIII-XXIII passing through the semiconductor device is indicated by a single-dot chain line. Further, in FIGS. 19-23, some of the reference signs for the same elements of the terminals 2 are omitted.

The semiconductor device A20 differs from the semiconductor device A10 in configurations of the terminals 2 and the sealing resin 3.

As shown in FIGS. 19, 20, 22 and 23, in each of the terminals 2, a dent portion 26 is recessed also from the second outer side surface 25. As shown in FIGS. 19-22, each of the terminals 2 further has a penetrating portion 27. The penetrating portions 27 penetrates the terminals 2 vertically, i.e., from the top surfaces 21 to the bottom surfaces 22. The penetrating portions 27 are connected to the first outer side surfaces 24, the second outer side surfaces 25 and dent portions 26. Apart of the sealing resin 3 is located in the penetrating portions 27. In the example of the semiconductor device A20, the penetrating portions 27 are filled with the sealing resin 3. In the present specification, the penetrating portion 27 of the terminal 2A is referred to as a penetrating portion 27A, the penetrating portion 27 of the terminal 2B is referred to as a penetrating portion 27B, the penetrating portion 27 of the terminal 2C is referred to as a penetrating portion 27C, and the penetrating portion 27 of the terminal 2D is referred to as a penetrating portion 27D.

The advantages of the semiconductor device A20 are described below.

Similarly to the semiconductor device A10, the semiconductor device A20 includes the conductive layer 12 that is in contact with both of the reverse surface 11B and the side surface 11C of the semiconductor element 11 and exposed from the second surface 3B of the sealing resin 3. Thus, heat generated at the semiconductor element 11 during the use of the semiconductor device A20 is efficiently dissipated to the outside through the conductive layer 12. The terminals 2 of the semiconductor device A20 are formed with dent portions 26 recessed from both of the bottom surfaces 22 and the inner side surfaces 23. Thus, short circuit between the conductive layer 12 and the terminals 2 is avoided. In this way, the semiconductor device A20 also achieves enhanced heat dissipation while achieving height reduction.

Each of the terminals 2 is formed with a penetrating portion 27. A part of the sealing resin 3 is located in the penetrating portion 27. With such an arrangement, when a force is applied to displace the terminal 2 outward in the first direction x or the second direction y, the terminal 2 comes into contact with the sealing resin in the penetrating portion 27. Thus, detachment of the terminal 2 through the third surface 3C or the fourth surface 3D of the sealing resin 3 is prevented. In each of the terminals 2, the dent portion 26 is recessed from both of the bottom surface 22 and the second outer side surface 25. With such a configuration, a sufficient amount of the sealing resin 3 is present in the penetrating portions 27 during the manufacturing of the semiconductor device A20, so that detachment of the terminals 2 from the sealing resin 3 is effectively prevented.

Figure 24:
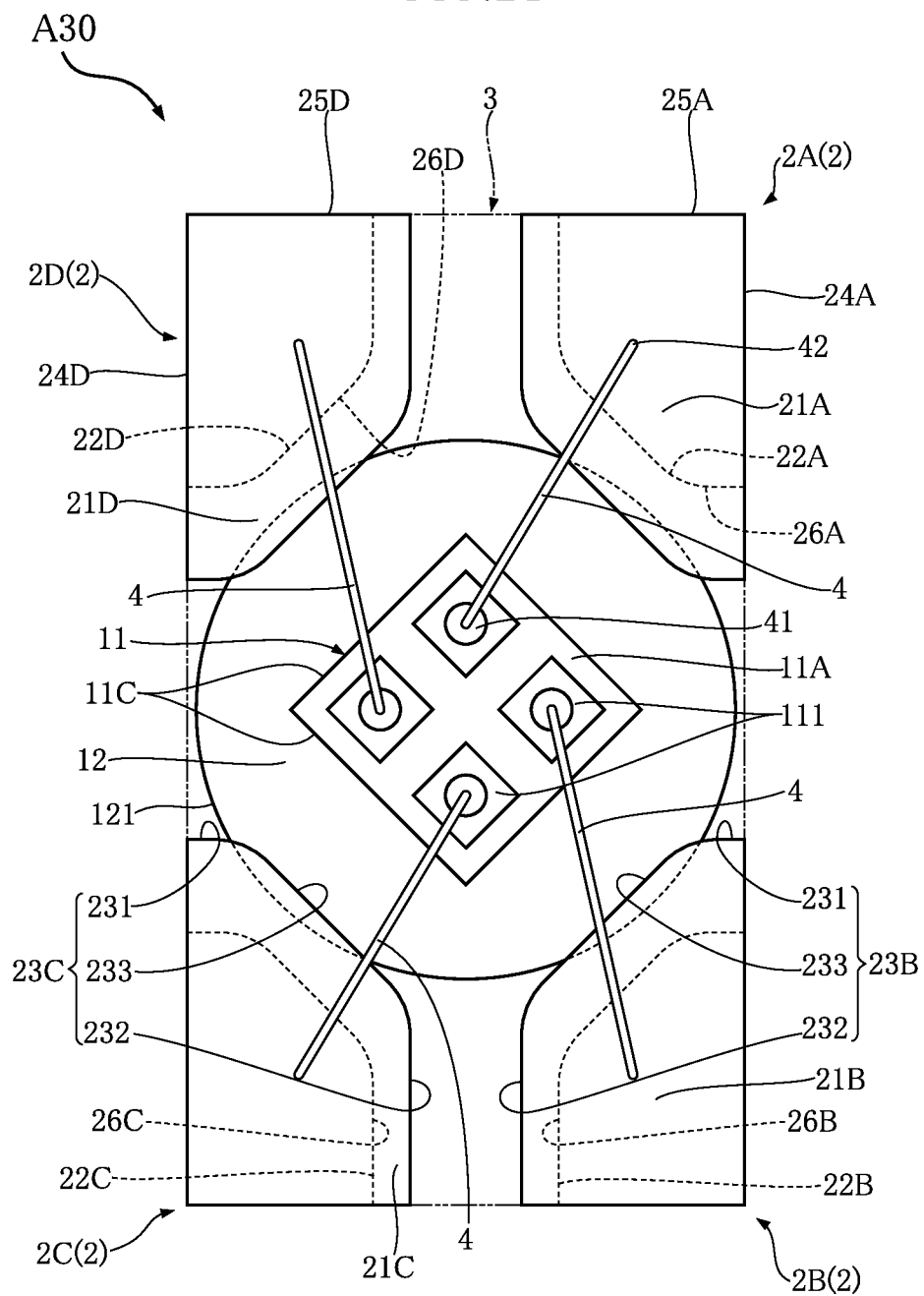
FIG. 24 is a plan view of a semiconductor device according to a third embodiment of the present disclosure.
Figure 25:
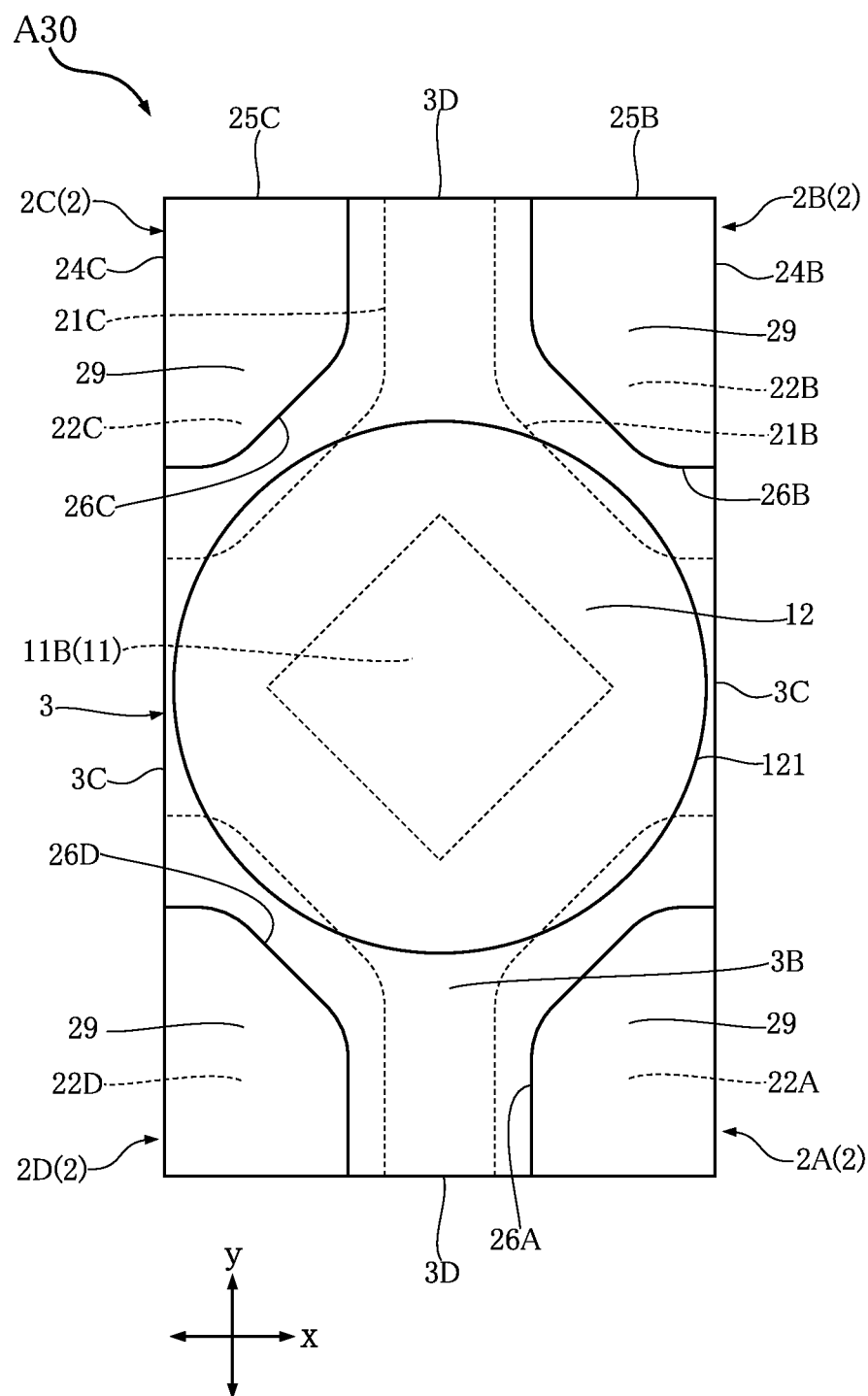
FIG. 25 is a bottom view of the semiconductor device shown in FIG. 24.
Figure 26:
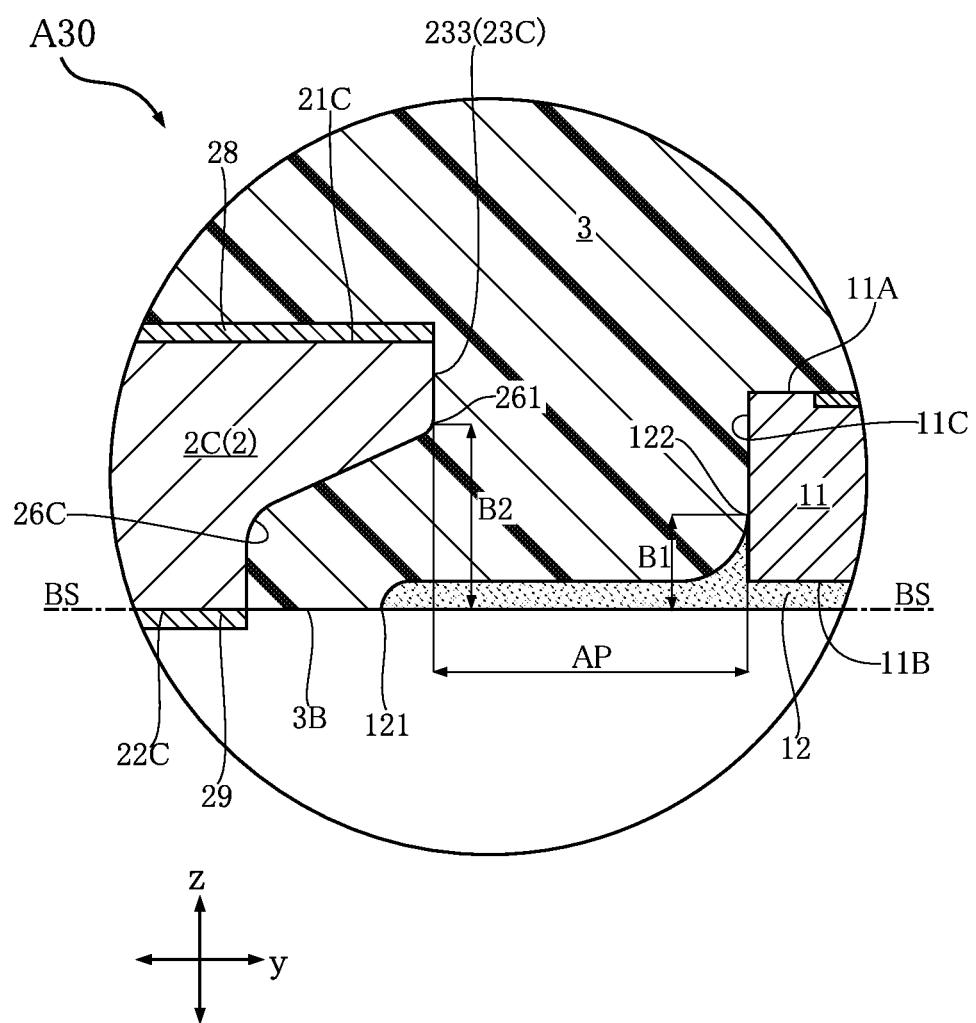
FIG. 26 is a sectional view showing a part of the semiconductor device of FIG. 24 as enlarged.

With reference to FIGS. 24-26, a semiconductor device A30 according to a third embodiment of the present disclosure is described below. In these figures, the elements that are identical or similar to those of the semiconductor device A10 are designated by the same reference signs as those used for the semiconductor device A10, and the description is omitted. Note that FIG. 24 is a view as seen through the inner conductive layers 28 and the sealing resin 3, for convenience of understanding. In FIG. 24, the contour of the sealing resin 3 is illustrated by imaginary lines. FIG. 26 is an enlarged sectional view of the semiconductor device A30 taken along the same plane as FIG. 7. In FIGS. 24-25, some of the reference signs for the same elements of the terminals 2 are omitted.

The semiconductor device A30 differs from the semiconductor device A10 in configuration of the conductive layer 12. The configurations of the terminals 2 and the sealing resin 3 of the semiconductor device A30 are the same as those of the semiconductor device A10, but the configurations of these members in the semiconductor device A20 may be employed instead.

As shown in FIGS. 24-26, the conductive layer 12 includes portions that overlap with the top surfaces 21 of the terminals 2 as viewed in the thickness direction z. Thus, as shown in FIG. 25, the area of the conductive layer 12 that is exposed from the second surface 3B of the sealing resin 3 is larger than the corresponding area in the semiconductor device A10. As shown in FIG. 26, the conductive layer 12 is in contact with both of the reverse surface 11B and the side surface 11C of the semiconductor element 11. The distance B1 from the base surface BS (see the semiconductor device A10) to the farthest portion 122 (see the semiconductor device A10) is shorter than the distance B2 from the base surface BS to the boundary 261 between the inner side surface 23 and the dent portion 26. As viewed in the thickness direction z, the farthest portion 122 is spaced apart from both of the top surface 21 and the dent portion 26 (the separation "AP" in FIG. 26).

Figure 27:
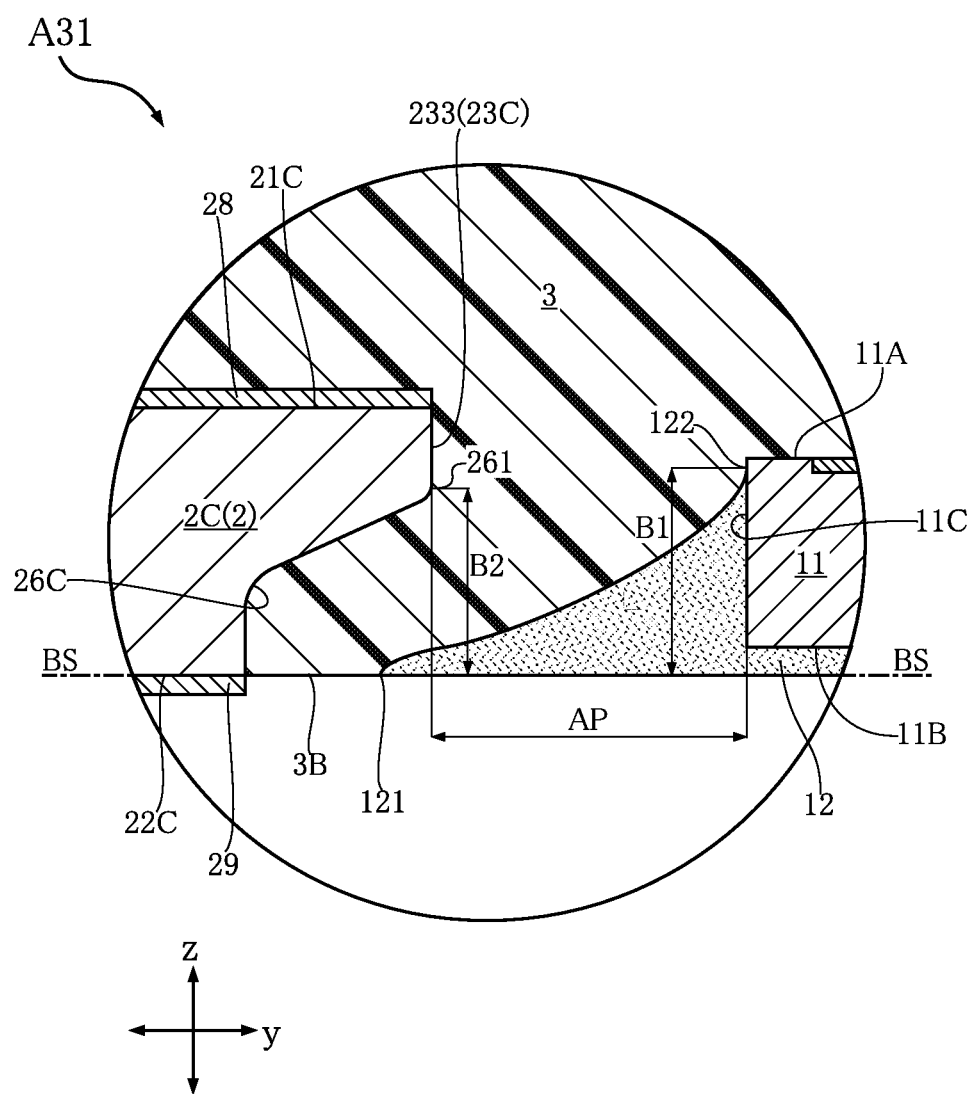
FIG. 27 is a sectional view showing a part of a semiconductor device according to a variation of the third embodiment of the present disclosure as enlarged.

Referring now to FIG. 27, a semiconductor device A31, which is a variation of the semiconductor device A30, is described. In the semiconductor device A31, the distance B1 from the base surface BS to the farthest portion 122 is longer than the distance B2 from the base surface BS to the boundary 261 between the inner side surface 23 and the dent portion 26. Thus, the contact area of the conductive layer 12 with the semiconductor element 11 is larger than that in the semiconductor device A30. As viewed in the thickness direction z, the farthest portion 122 is spaced apart from both of the top surface 21 and the dent portion 26 (the separation "AP" in FIG. 27).

Such configurations of the conductive layers 12 of the semiconductor device A30 and the semiconductor device A31 can be obtained by increasing the application amount of the bonding material 83 (see FIG. 14) which is to become the conductive layers 12.

The advantages of the semiconductor devices A30 are described below.

Similarly to the semiconductor device A10, the semiconductor device A30 includes the conductive layer 12 that is in contact with both of the reverse surface 11B and the side surface 11C of the semiconductor element 11 and exposed from the second surface 3B of the sealing resin 3. Thus, heat generated at the semiconductor element 11 during the use of the semiconductor device A30 is efficiently dissipated to the outside through the conductive layer 12. The terminals 2 of the semiconductor device A30 are formed with dent portions 26 recessed from both of the bottom surface 22 and the inner side surface 23. Thus, short circuit between the conductive layer 12 and the terminals 2 is avoided. In this way, the semiconductor device A30 also achieves enhanced heat dissipation while achieving height reduction.

The conductive layer 12 of the semiconductor device A30 includes portions overlapping with the top surfaces 21 of the terminals 2 as viewed in the thickness direction z. As shown in FIG. 26, such a portion of the conductive layer 12 is received in the dent portion 26, so that the conductive layer 12 does not come into contact with the terminal 2. Thus, short circuit between the conductive layer 12 and the terminals 2 is avoided. Since the area of the conductive layer 12 that is exposed from the second surface 3B of the sealing resin 3 in the semiconductor device A30 is larger than that in the semiconductor device A10, the semiconductor device A30 provides higher heat dissipation performance than the semiconductor device A10.

Similarly to the semiconductor device A30, the conductive layer 12 of the semiconductor device A31 includes portions overlapping with the top surfaces 21 of the terminals 2 as viewed in the thickness direction z. The contact area of the conductive layer 12 with the semiconductor element 11 is larger than that in the semiconductor device A30. With this configuration again, since a portion of the conductive layer 12 is received in the dent portion 26 and the conductive layer 12 does not come into contact with the terminals 2 as shown in FIG. 27, short circuit between the conductive layer 12 and the terminals 2 is avoided. The semiconductor device A31 is advantageous in that it provides higher heat dissipation performance than the semiconductor device A30.

Figure 28:
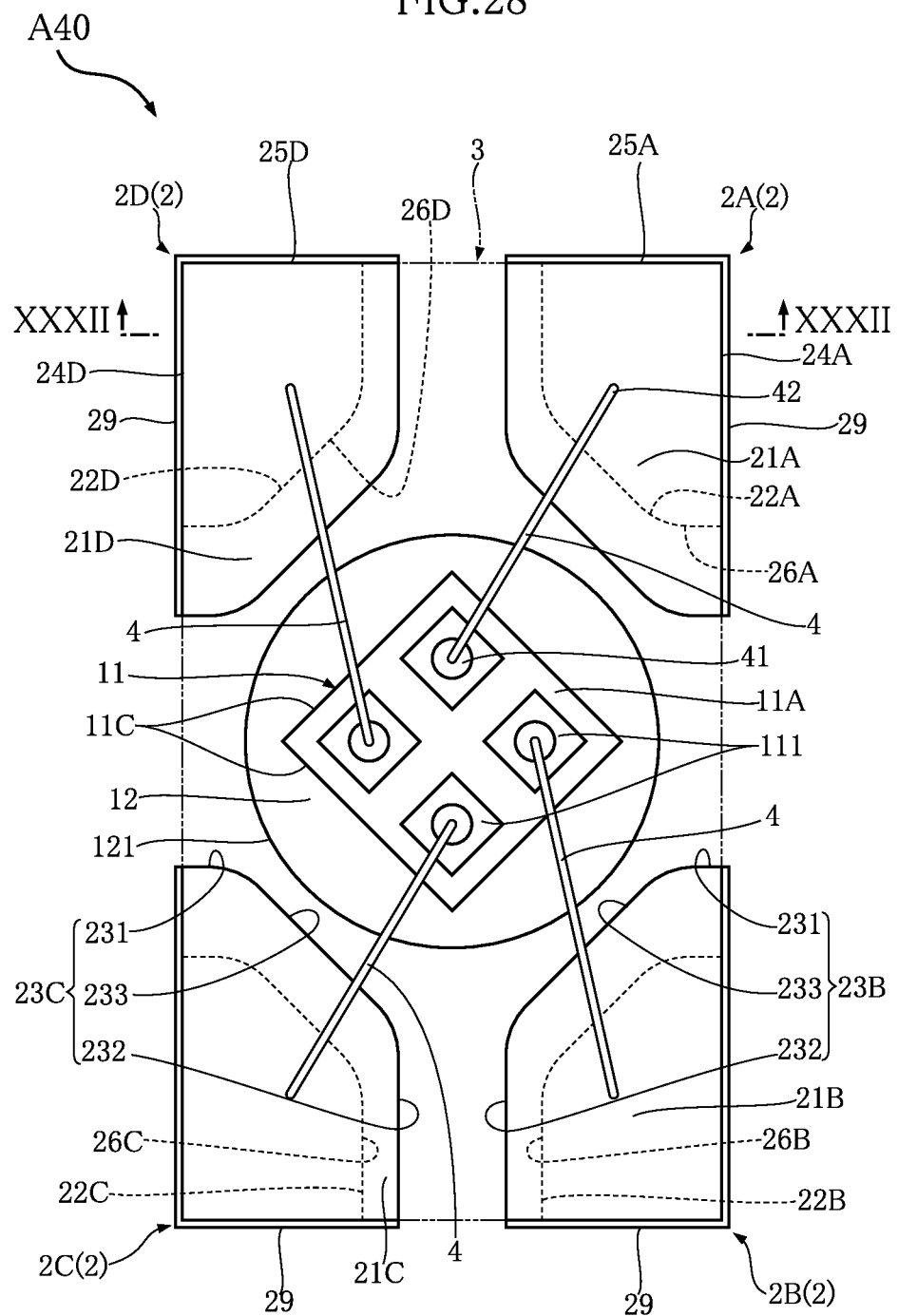
FIG. 28 is a plan view of a semiconductor device according to a fourth embodiment of the present disclosure.
Figure 29:
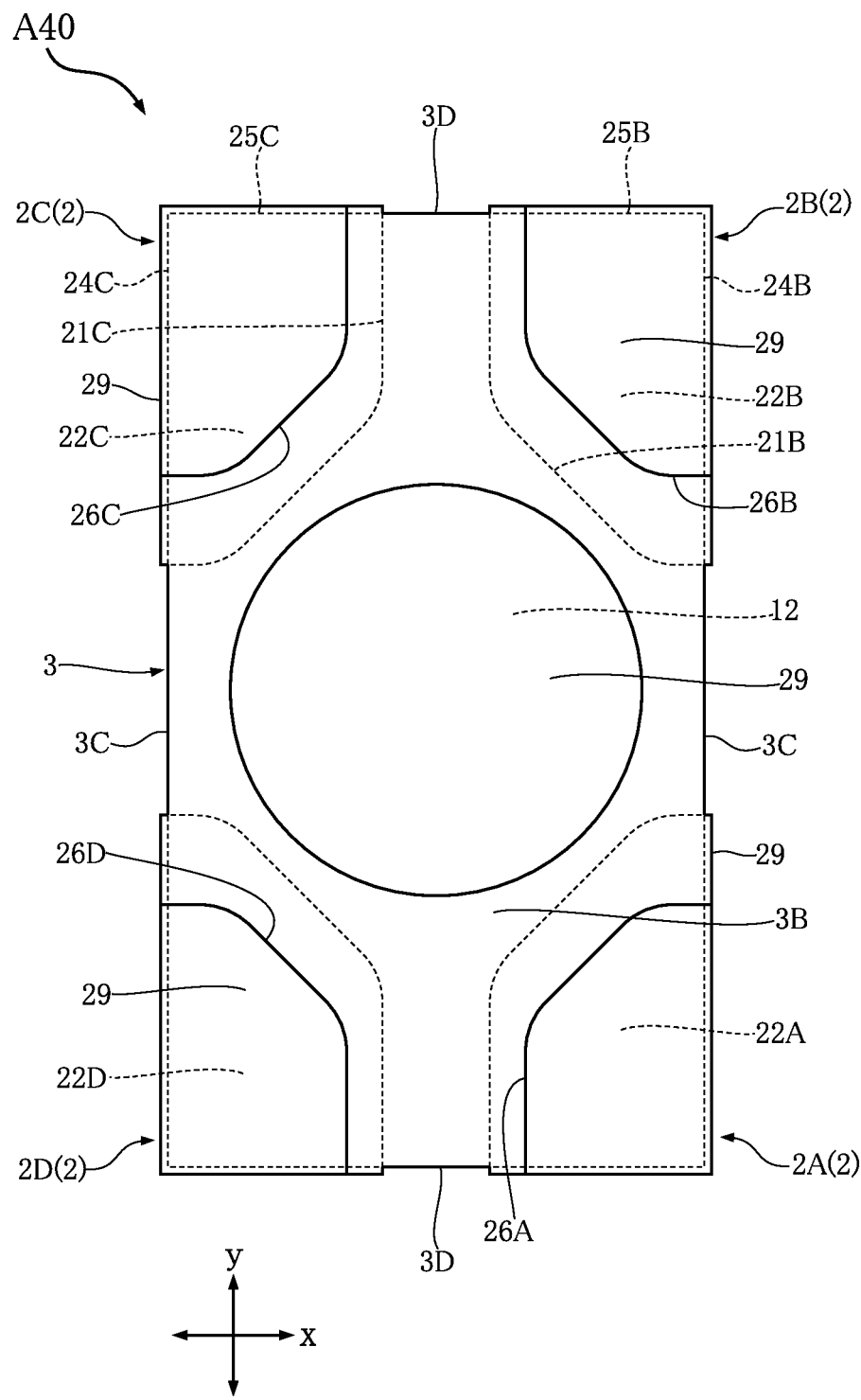
FIG. 29 is a bottom view of the semiconductor device shown in FIG. 28.
Figure 30:
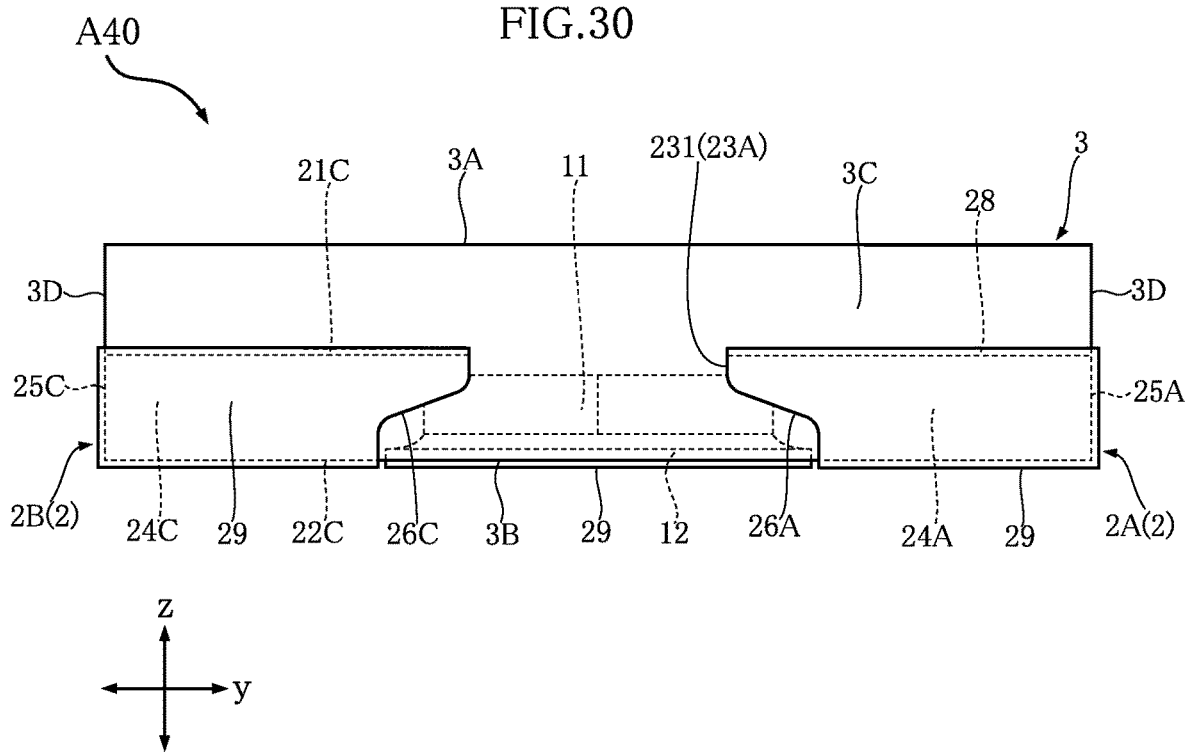
FIG. 30 is a right side view of the semiconductor device shown in FIG. 28.
Figure 31:
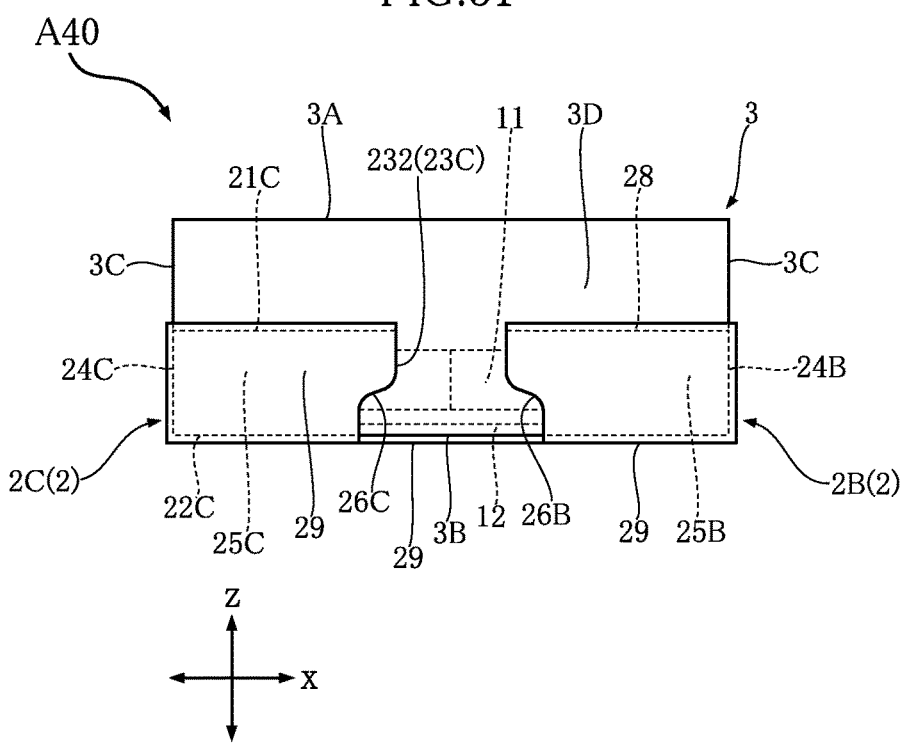
FIG. 31 is a front view of the semiconductor device shown in FIG. 28.
Figure 32:
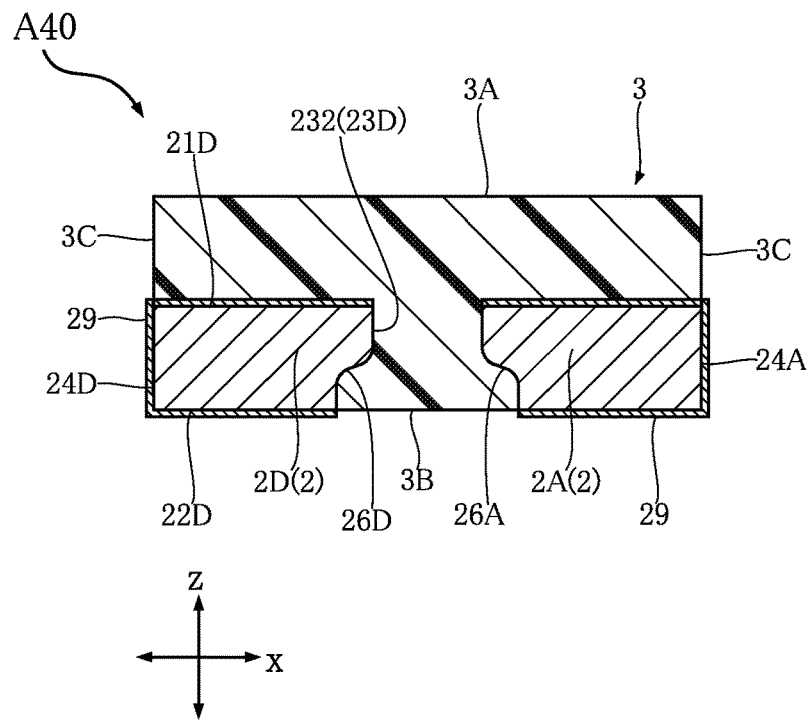
FIG. 32 is a sectional view taken along line XXXII-XXXII in FIG. 28.

With reference to FIGS. 28-32, a semiconductor device A40 according to a fourth embodiment of the present disclosure is described below. In these figures, the elements that are identical or similar to those of the semiconductor device A10 are designated by the same reference signs as those used for the semiconductor device A10, and the description is omitted. Note that FIG. 28 is a view as seen through the inner conductive layers 28 and the sealing resin 3, for convenience of understanding. In FIG. 28, the contour of the sealing resin 3 is illustrated by imaginary lines. Further, in FIGS. 28-32, some of the reference signs for the same elements of the terminals 2 are omitted.

The semiconductor device A40 differs from the semiconductor device A10 in configurations of the terminals 2 and the outer conductive layers 29. The configurations of the terminals 2 and the sealing resin 3 of the semiconductor device A40 are the same as those of the semiconductor device A10, but the configurations of these members in the semiconductor device A20 may be employed instead.

As shown in FIGS. 28-32, the outer conductive layers 29 cover the bottom surfaces 22 and the first outer side surfaces 24 of the terminals 2. The outer conductive layers 29 also cover the second outer side surfaces 25 of the terminals 2 and the conductive layer 12 exposed from the second surface 3B of the sealing resin 3. The outer conductive layers 29 are formed by barrel electroplating. Specifically, in manufacturing the semiconductor device A40, the above-described electroplating for forming the outer conductive layers 29 (See FIG. 17) is omitted. Instead, barrel electroplating for forming the outer conductive layers 29 is performed after the step of dividing the conductive plate 81 and the sealing resin 84 into individual pieces (See FIG. 18).

The advantages of the semiconductor device A40 are described below.

Similarly to the semiconductor device A10, the semiconductor device A40 also includes the conductive layer 12 that is in contact with both of the reverse surface 11B and the side surface 11C of the semiconductor element 11 and exposed from the second surface 3B of the sealing resin 3. Thus, heat generated at the semiconductor element 11 during the use of the semiconductor device A40 is efficiently dissipated to the outside through the conductive layer 12. The terminals 2 of the semiconductor device A40 are formed with dent portions 26 recessed from both of the bottom surface 22 and the inner side surface 23. Thus, short circuit between the conductive layer 12 and the terminals 2 is avoided. In this way, the semiconductor device A40 also achieves enhanced heat dissipation while achieving height reduction.

Figure 33:
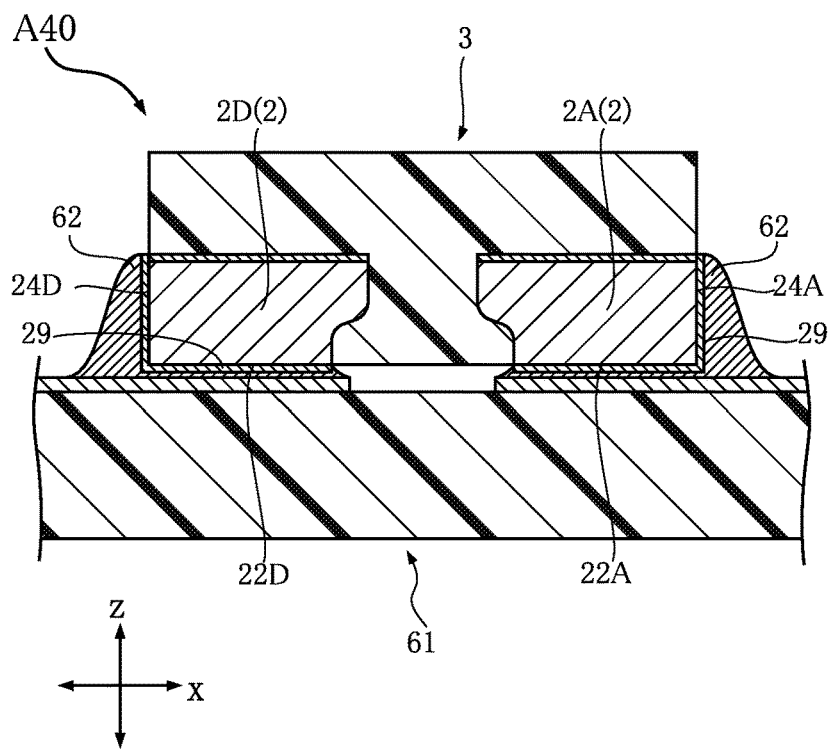
FIG. 33 is a sectional view showing the state where the semiconductor device shown in FIG. 28 is mounted on a wiring board.

In each of the terminals 2, the outer conductive layer 29 covers both of the bottom surface 22 and the first outer side surface 24. FIG. 33 is a sectional view (taken along the same plane as FIG. 31) showing the semiconductor device A40 mounted on a wiring board 61 by reflow soldering. As shown in FIG. 33, the conductive bonding material 62, which may be a solder cream for example, adheres not only to the outer conductive layers 29 covering the bottom surfaces 22 but also to the outer conductive layers 29 covering the first outer side surfaces 24. Thus, the semiconductor device A40 is bonded to the wiring board 61 with a higher bonding strength than the semiconductor device A10.

Figure 34:
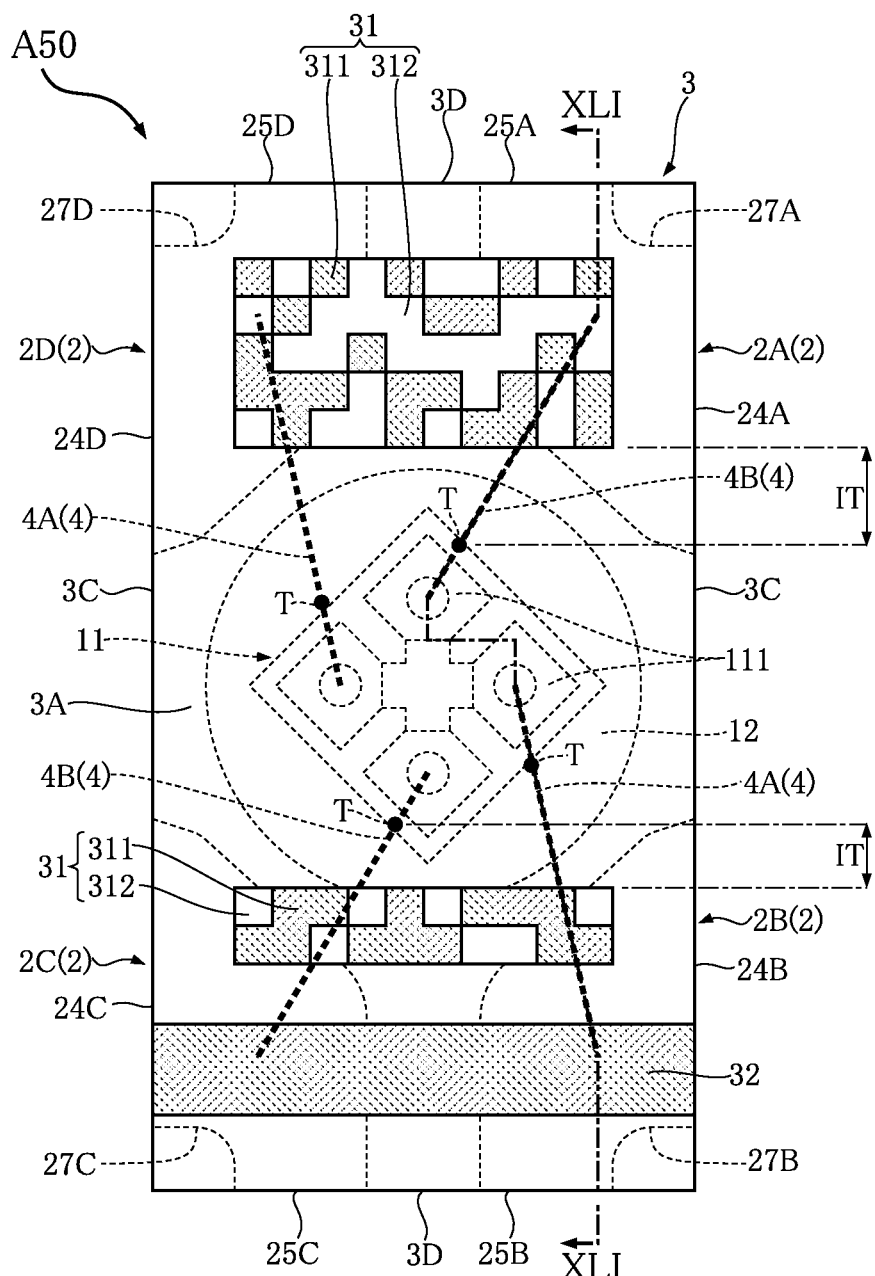
FIG. 34 is a plan view of a semiconductor device according to a fifth embodiment of the present disclosure.
Figure 35:
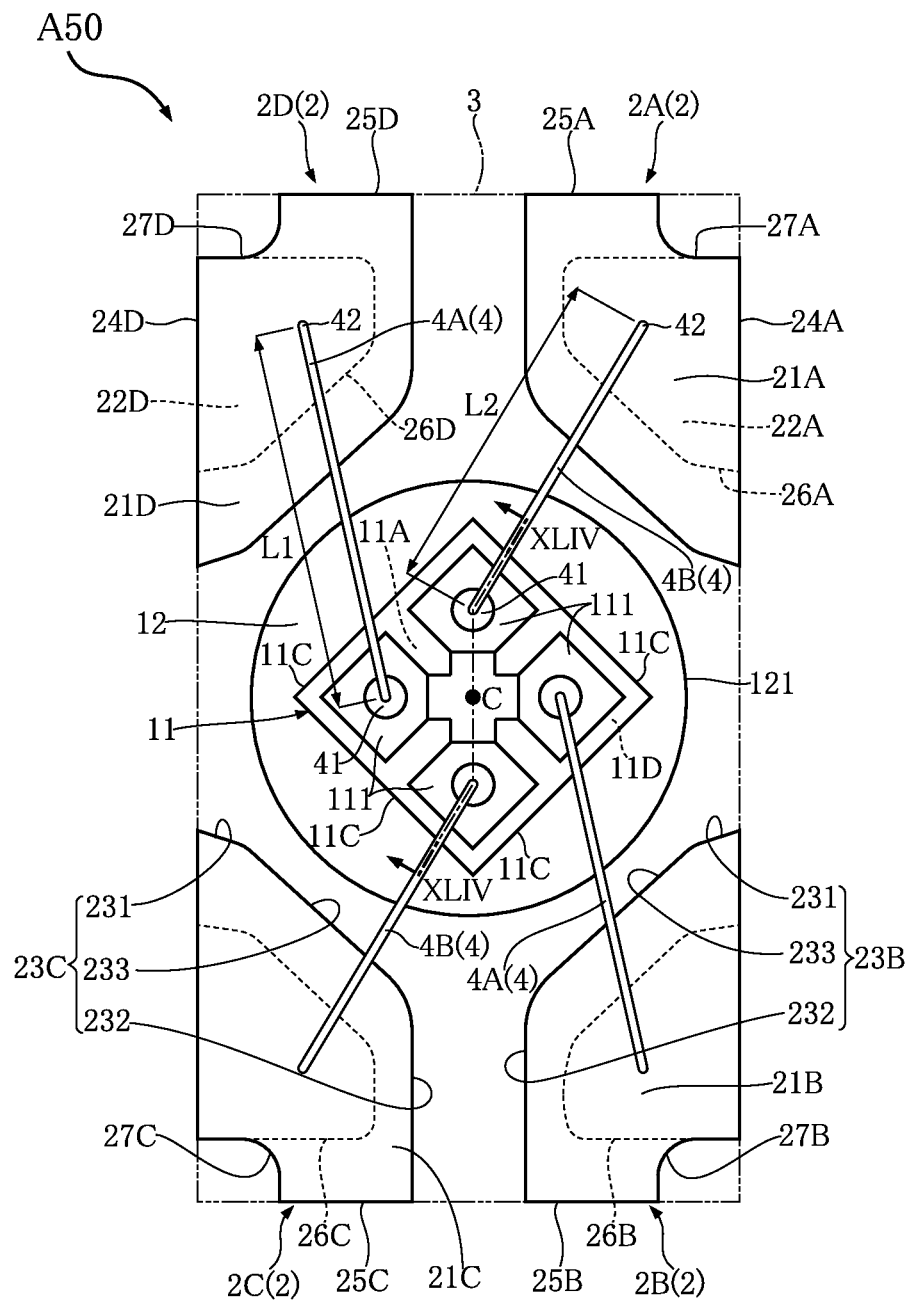
FIG. 35 is a plan view of the semiconductor device shown in FIG. 34.
Figure 36:
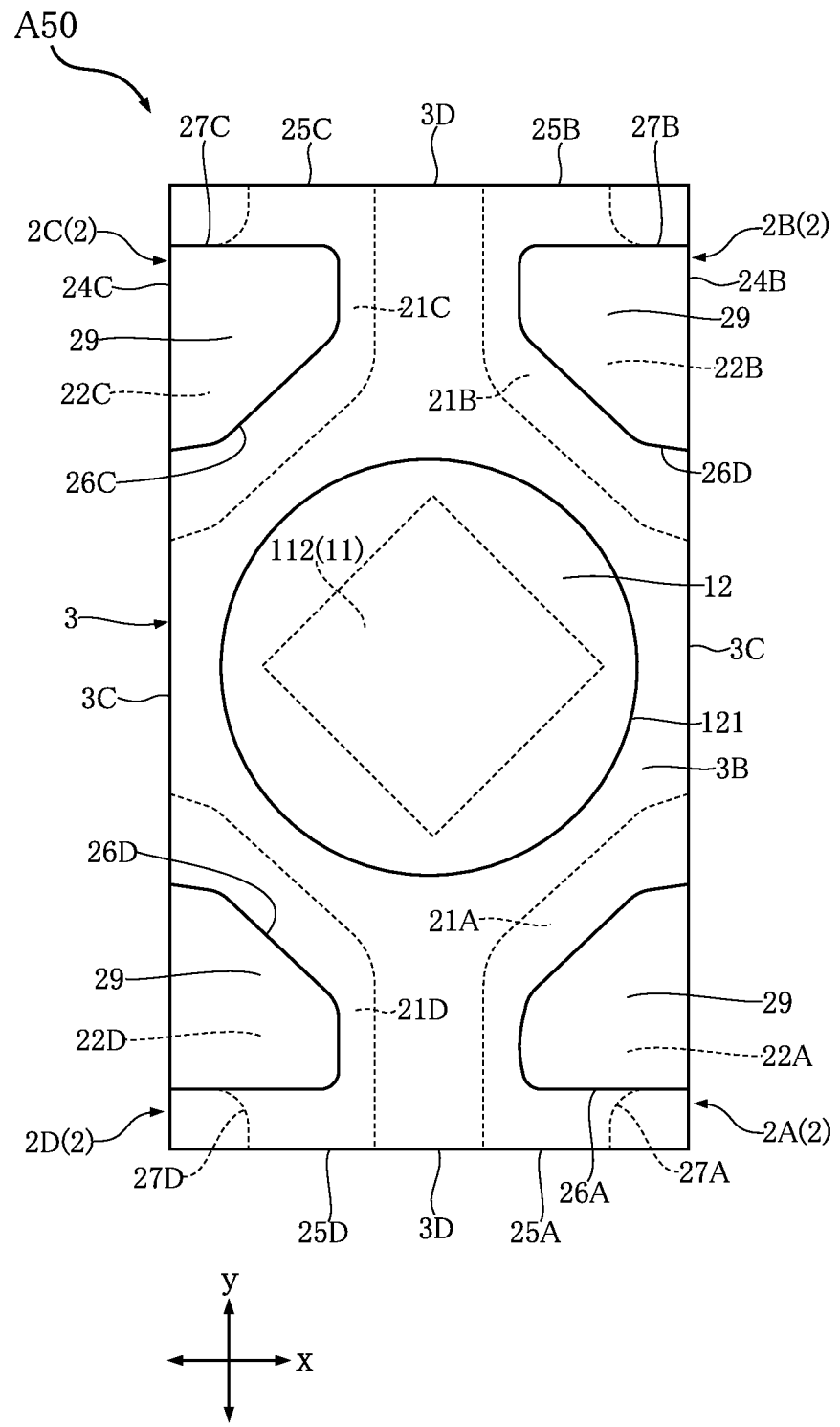
FIG. 36 is a bottom view of the semiconductor device shown in FIG. 34.
Figure 37:
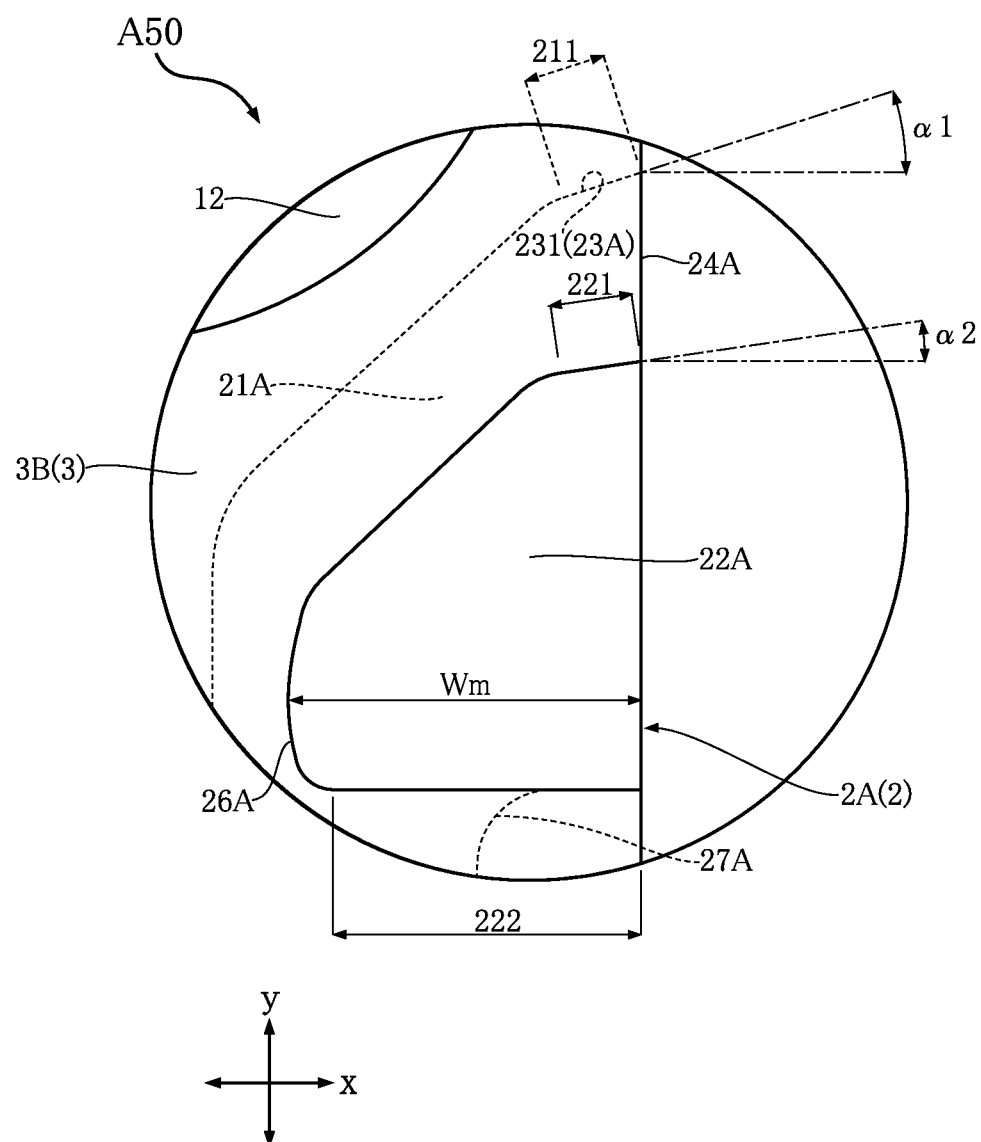
FIG. 37 shows a part of FIG. 36 as enlarged.
Figure 38:
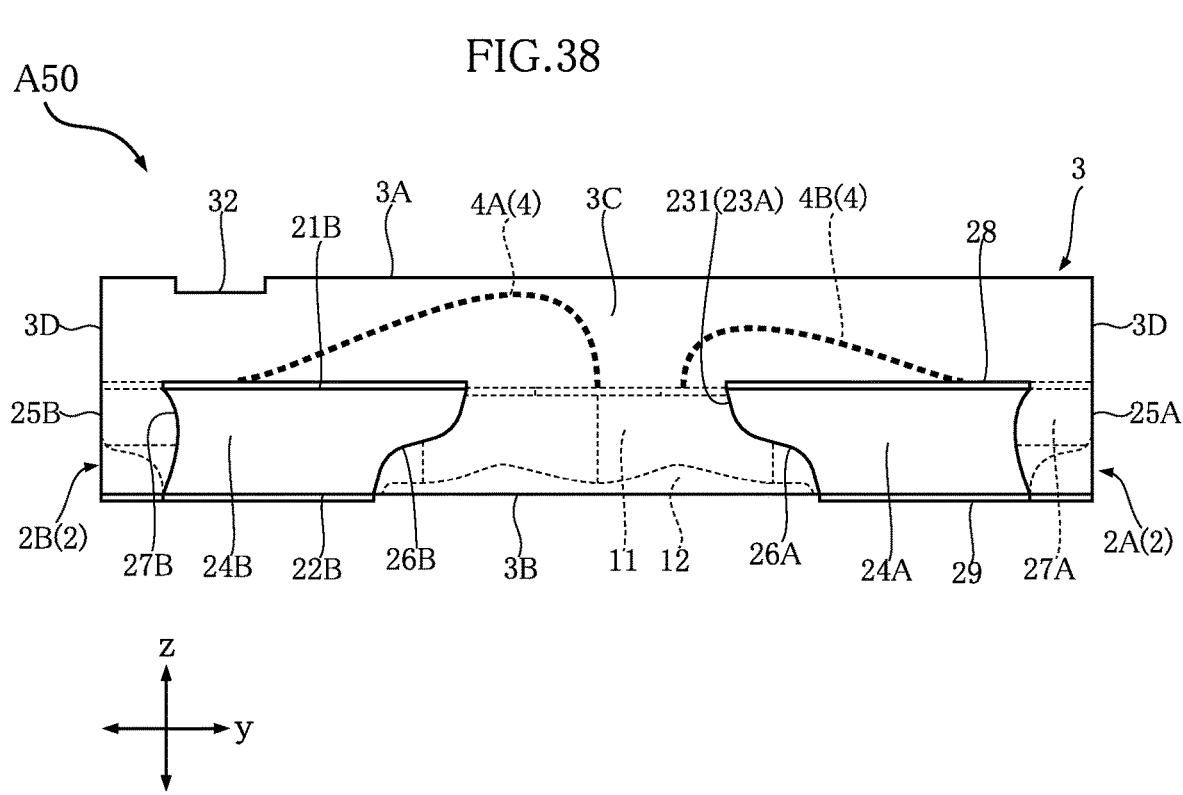
FIG. 38 is a right side view of the semiconductor device shown in FIG. 34.
Figure 39:
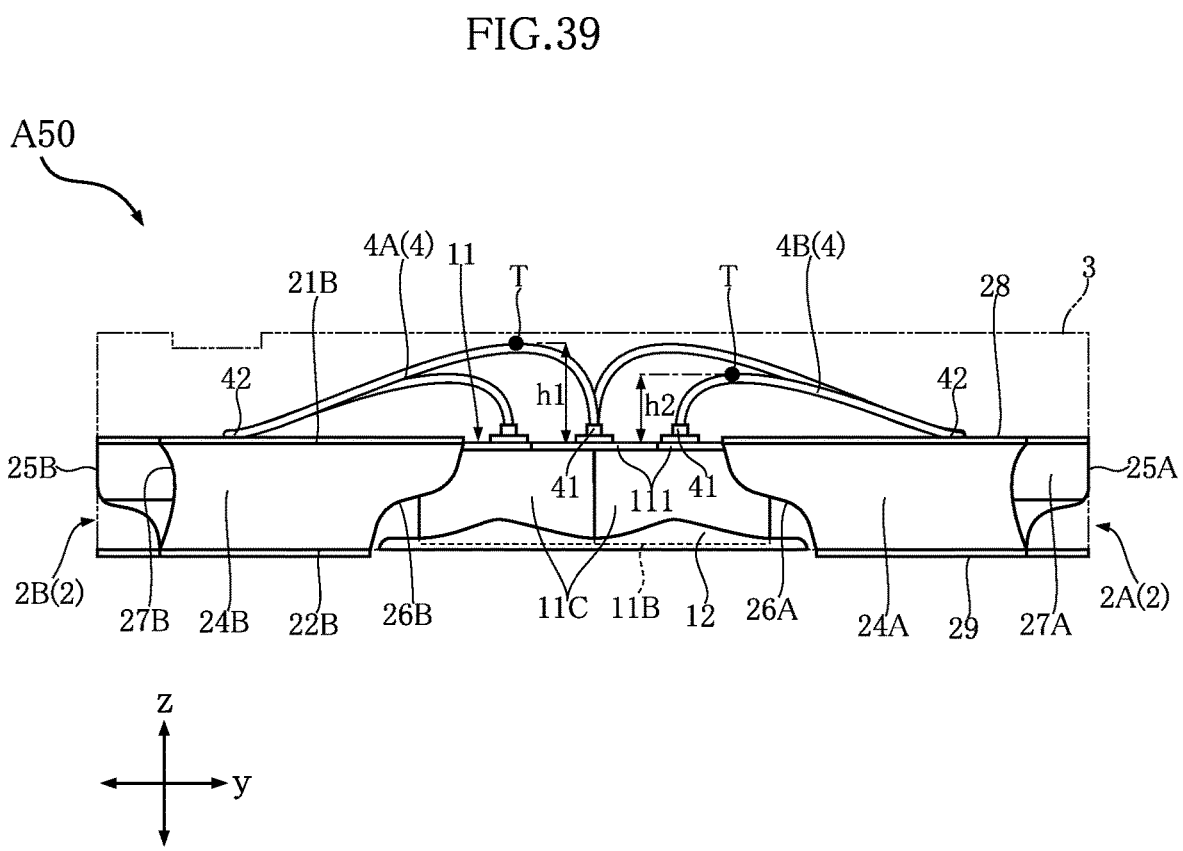
FIG. 39 is a right side view of the semiconductor device shown in FIG. 34.
Figure 40:
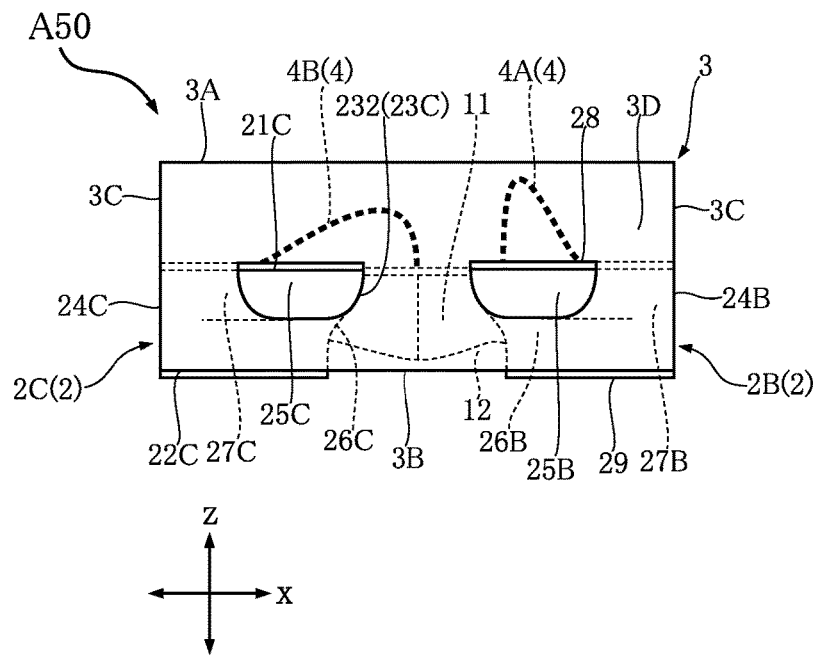
FIG. 40 is a front view of the semiconductor device shown in FIG. 34.
Figure 41:
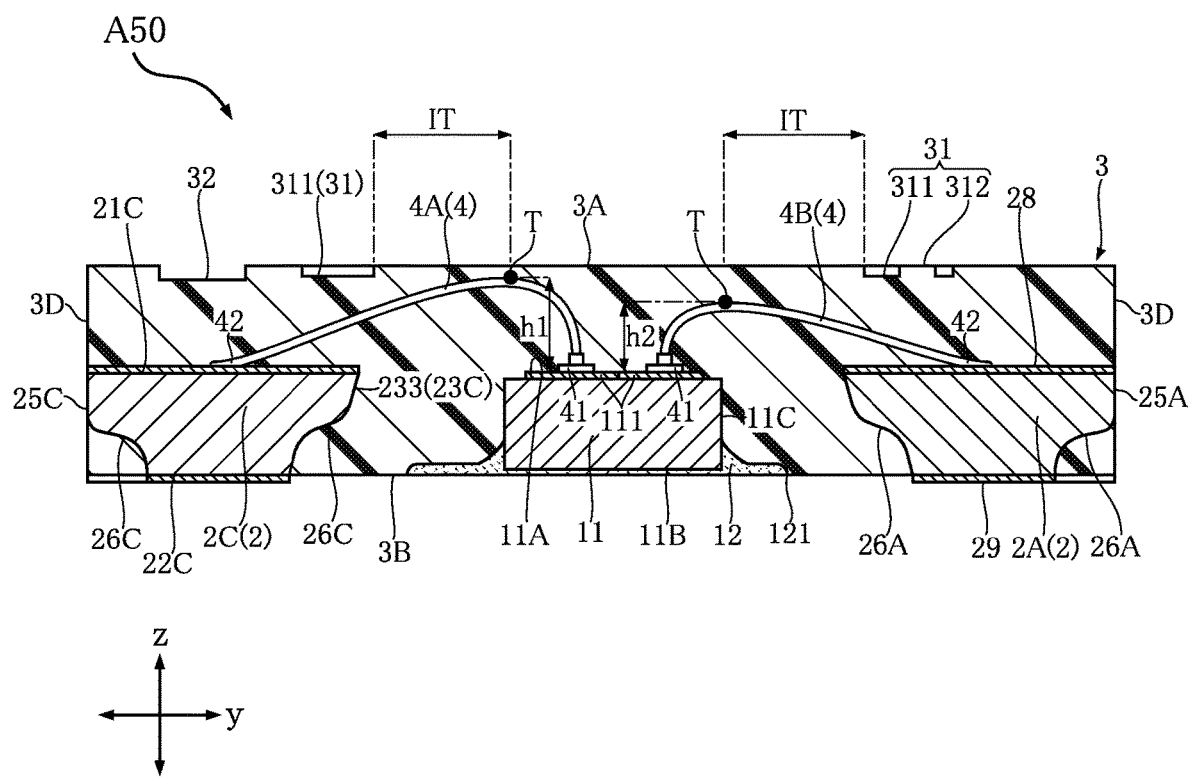
FIG. 41 is a sectional view taken along lines XLI-XLI of FIG. 34.
Figure 42:
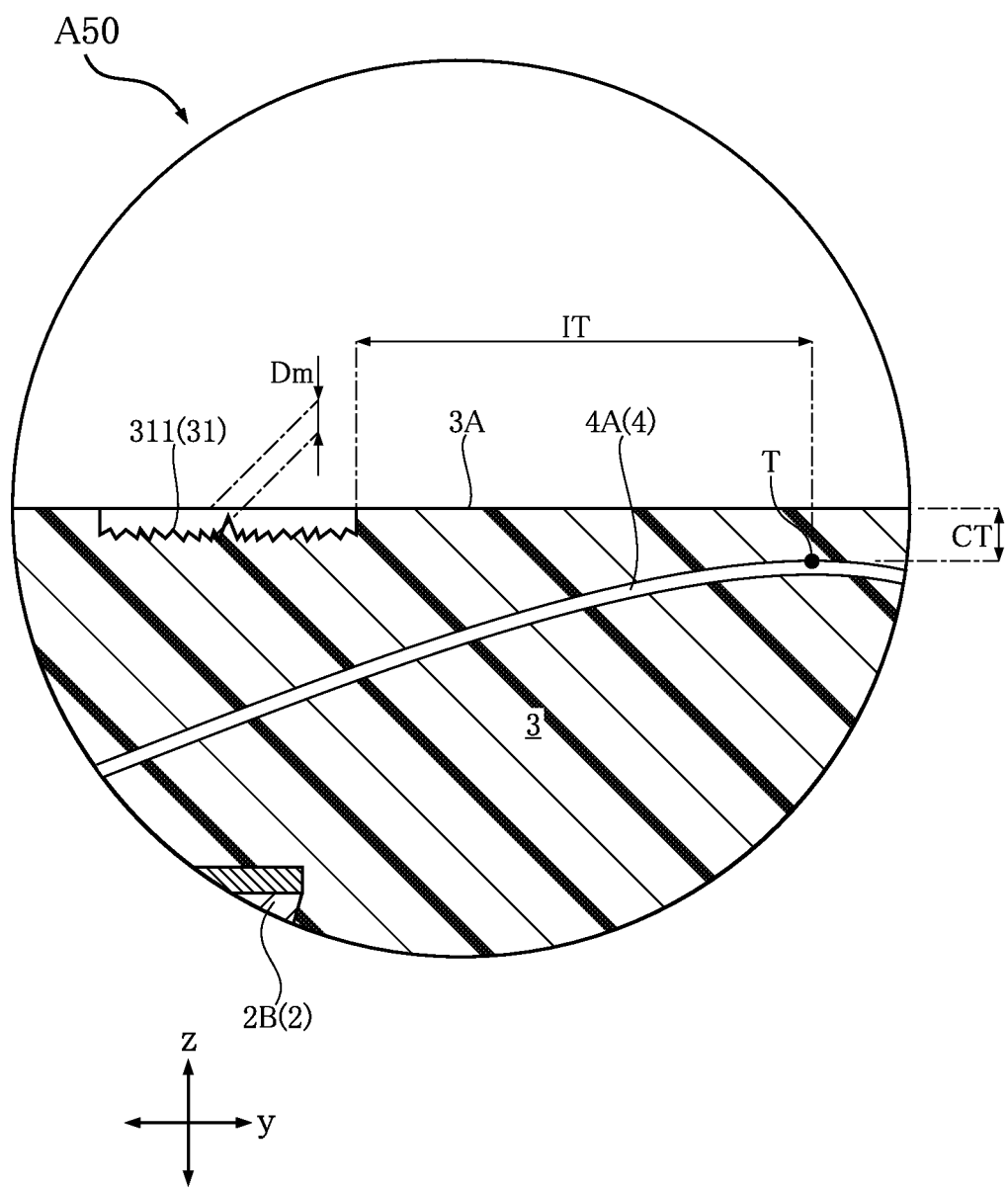
FIG. 42 shows a part of FIG. 41 as enlarged.
Figure 43:
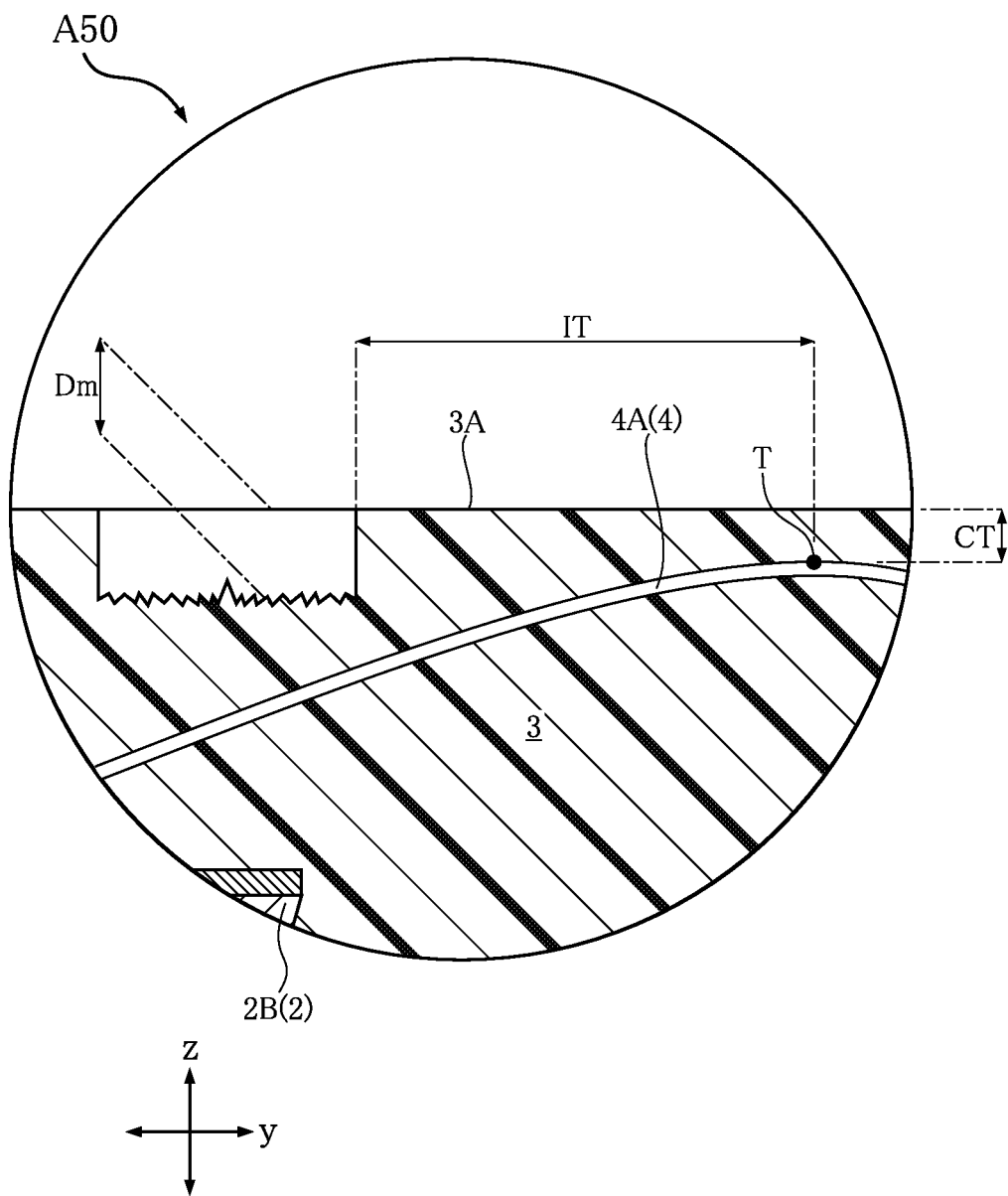
FIG. 43 shows a part of FIG. 41 as enlarged.

With reference to FIGS. 34-45, a semiconductor device A50 according to a fifth embodiment of the present disclosure is described below. In these figures, the elements that are identical or similar to those of the semiconductor device A10 are designated by the same reference signs as those used for the semiconductor device A10, and the description is omitted. Note that FIG. 35 is a view as seen through the inner conductive layers 28 and the sealing resin 3, for convenience of understanding. FIG. 39 is a view as seen through the sealing resin 3, for convenience of understanding. In FIGS. 35 and 39, the contour of the sealing resin 3 is illustrated by imaginary lines. The line XLI-XLI in FIG. 34 and the line XLIV-XLIV in FIG. 35 passing through the semiconductor device are indicated by single-dot chain lines. FIG. 43 is a sectional view taken along the same plane as FIG. 42. Further, in FIGS. 34-41, some of the reference signs for the same elements of the terminals 2 are omitted. The semiconductor device A50 differs from the semiconductor device A10 in configurations of the semiconductor element 11, the conductive layer 12, the terminals 2, the sealing resin 3 and the plurality of wires 4.

Figure 44:
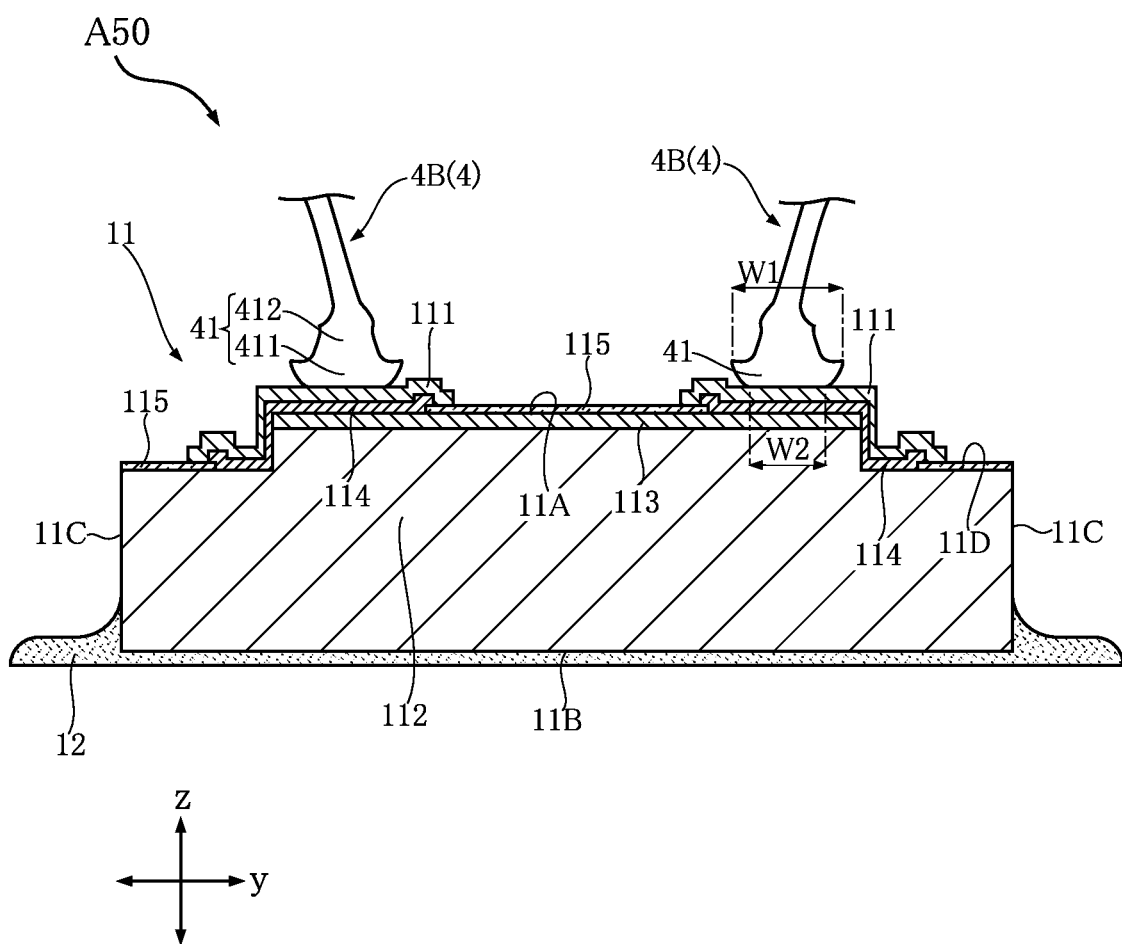
FIG. 44 is a sectional view taken along line XLIV-XLIV in FIG. 35, with the sealing resin unillustrated.

As shown in FIG. 44, the semiconductor element 11 further includes a recess 11D, a semiconductor substrate 112, a detection layer 113, a wiring layer 114 and an insulating film 115.

The semiconductor substrate 112 supports a plurality of electrodes 111, the detection layer 113, the wiring layer 114 and the insulating film 115. The semiconductor substrate 112 is made of gallium arsenide that does not contain any dopant. The surface of the semiconductor substrate 112 that is in contact with the conductive layer 12 in the thickness direction z corresponds to the reverse surface 11B.

The detection layer 113 is laminated on the semiconductor substrate 112 in the thickness direction z. The detection layer 113 is made up of a first gallium arsenide layer doped with an n-type dopant and laminated on the semiconductor substrate 112, and a second gallium arsenide layer as a cap film laminated on the first gallium arsenide layer. For example, the n-type dopant is silicon (Si). The second gallium arsenide layer as the cap film does not contain any dopant. The detection layer 113 is formed by epitaxial growth. The surface of the detection layer 113 that faces in the same direction as the top surfaces 21 of the terminals 2 in the thickness direction z corresponds to the obverse surface 11A. The thickness of the semiconductor element 11 from the obverse surface 11A to the reverse surface 11B is 70 to 90 μm, for example.

The recess 11D is recessed from the obverse surface 11A. As viewed in the thickness direction z, the recess 11D is in the form of a frame whose outer edge coincides with the edge (i.e., the periphery) of the semiconductor element 11. The recess 11D is formed by removing portions of the semiconductor substrate 112 and the detection layer 113 by etching. The recess 11D provides the mesa structure of the semiconductor substrate 112. The detection layer 113 is located on the upper end of the mesa structure.

The wiring layer 114 covers a part of the obverse surface 11A and a part of the recess 11D. The wiring layer 114 is electrically connected to the detection layer 113. The wiring layer 114 is formed of an alloy layer containing gold, germanium (Ge), and nickel.

The insulating film 115 covers portions of the obverse surface 11A and the recess 11D that are not covered with the wiring layer 114. For example, the insulating film 115 is made of silicon nitride ($Si_3N_4$).

The electrodes 114 cover the wiring layer 114. Thus, the electrodes 111 are electrically connected to the detection layer 113 via the wiring layer 114.

As shown in FIG. 37, the top surface 21 of each terminal 2 further includes a first edge segment 211. The first edge segment 211 is a part of the edge of the top surface 21. The first edge segment 211 is connected to both of the first portion 231 of an inner side surface 23 and a first outer side surface 24. The first edge segment 211 is inclined at an inclination angle α1 with respect to the first direction x.

As shown in FIG. 37, the bottom surface 22 of each terminal 2 further includes a second edge segment 221 and a parallel edge segment 222. The second edge segment 221 and the parallel edge segment 222 are parts of the edge of the bottom surface 22. The second edge segment 221 is connected to both of a first outer side surface 24 and a dent portion 26. The second edge segment 221 is inclined at an inclination angle α2 with respect to the first direction x. The inclination angle α2 is smaller than the inclination angle α1. The parallel edge segment 222 extends in the first direction x and is connected to a first outer side surface 24, a dent portion 26 and a penetrating portion 27. The maximum width Wm of the bottom surface 22 in the first direction x shown in FIG. 37 is longer than the parallel edge segment 222.

The thickness of each terminal 2 from the top surface 21 to the bottom surface 22 is 80 to 100 μm, for example. The dimension of the sealing resin 3 in the thickness direction z from the top surface 21 to the first surface 3A of the sealing resin 3 is 55 to 75 μm, for example.

As shown in FIGS. 34 and 41, the sealing resin 3 has a mark 31 which is formed on the first surface 3A. In the semiconductor device A50, the mark 31 has two sections spaced apart from each other in the second direction y. As viewed in the thickness direction z, the semiconductor element 11 is located between these two sections. The mark 31 has recesses 311 and flat portions 312. The recesses 311 are recessed from the first surface 3A, while the flat portions 312 are flush with the first surface 3A, i.e., not recessed from the surface 3A. The mark 31 may be provided to represent a predetermined code or codes constituted by a combination of the recesses 311 and the flat portions 312. The code may provide product information of the semiconductor device A50, such as a model number. By reading the code of the mark 31, product information of the semiconductor device A50 is obtained. The recesses 311 are formed with a laser.

As shown in FIGS. 34, 38 and 41, the sealing resin 3 further includes a discrimination groove 32. The discrimination groove 32 is formed in the first surface 3A. As viewed in the thickness direction z, the discrimination groove is spaced apart from the marks 31 in the second direction y and extends in the first direction x. Opposite ends of the discrimination groove 32 in the first direction x are connected to the paired sections of the third surface 3C. The discrimination groove 32 is provided for polarity indication of the semiconductor device A50 so that the semiconductor device A50 is installed on a wiring board with proper polarity.

The thickness of the sealing resin 3 from the first surface 3A to the second surface 3B is 135 to 175 μm, for example.

As shown in FIG. 35, the plurality of wires 4 include a pair of first wires 4A and a pair of second wires 4B. The wires are arranged such that the pair of the first wires 4A and the pair of the second wires 4B are symmetrical with respect to the center C of the semiconductor element 11 as viewed in the thickness direction z. As viewed in the thickness direction z, the length L1 of the first wires 4A is longer than the length L2 of the second wires 4B.

As shown in FIGS. 34, 39, and 42, each of the first wires 4A and the second wires 4B has a top T. Each top T is a point that is farthest from a first connecting portion 41 in the thickness direction z. The loop height h1 of each of the paired first wires 4A is larger than the loop height h2 of each of the paired second wires 4B. The loop height h1, h2 is a distance from the bottom of a first connecting portion 41 to a top T in the thickness direction z.

As shown in FIGS. 34 and 41, as viewed in the thickness direction z, the top of each wire 4 is spaced apart by a distance IT from the edge of the mark 31 in the second direction y. As shown in FIG. 42, the maximum depth Dm of each recess 311 of the mark 31 is smaller than the thickness of the sealing resin 3 from the first surface 3A to the top T of each wire 4. For example, the thickness CT is 18 to 21 μm. Alternatively, as shown in FIG. 43, the maximum depth Dm of each recess 311 of the mark 31 may be larger than the thickness CT of the sealing resin 3 from the first surface 3A to the top T.

As shown in FIG. 44, the first connecting portion 41 of each of the paired second wires 4B has a lower portion 411 and an upper portion 412. The lower portion 411 is generally disk-shaped and in contact with an electrode 111. The width W1 of the lower portion 411 at its upper end is larger than the width W2 of the lower portion 411 at its lower end. Note that the widths W1 and W2 are the dimensions of the lower portion 411 in a direction perpendicular to the thickness direction z. The upper portion 412 is generally in the form of a frustum and connected to the upper side of the lower portion 411. Though not illustrated, the first connecting portion 41 of each of the paired first wires 4A also has a lower portion 411 and an upper portion 412.

Figure 45:
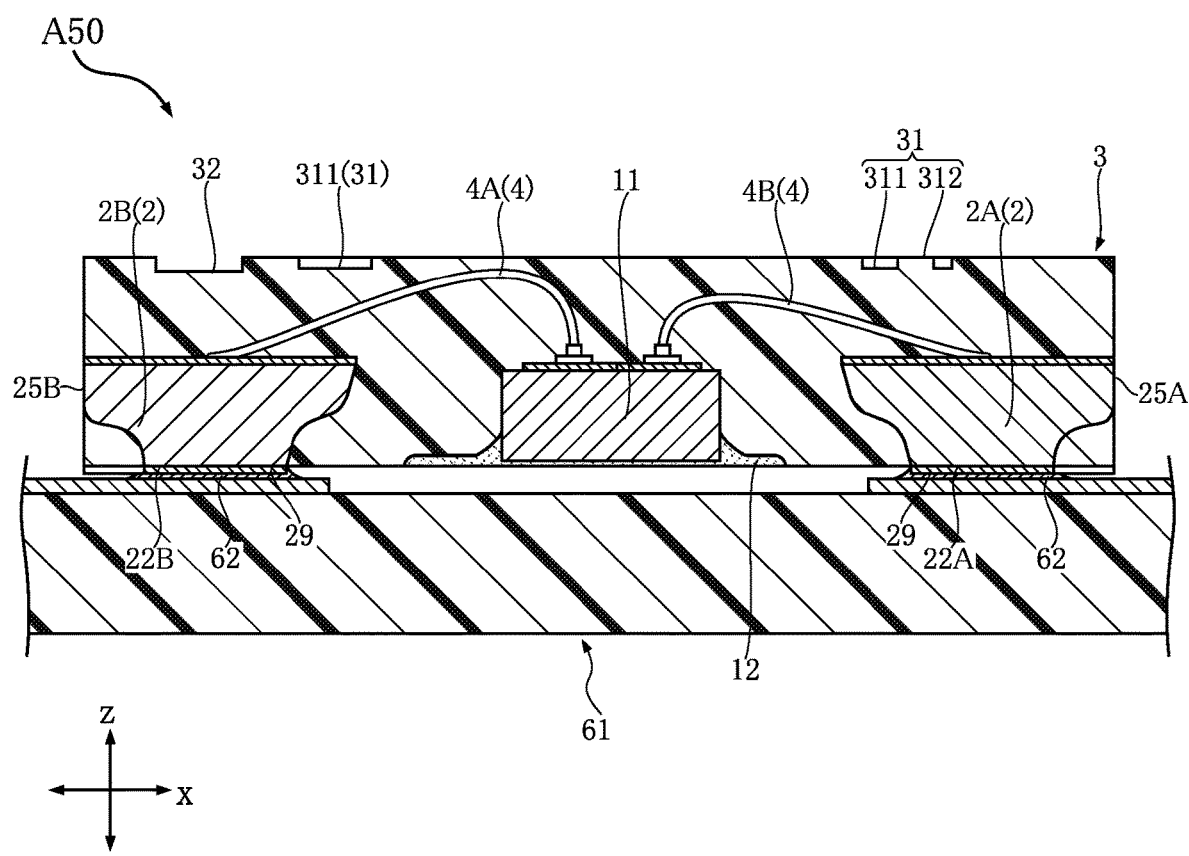
FIG. 45 is a sectional view showing the state where the semiconductor device shown in FIG. 34 is mounted on a wiring board.

FIG. 45 is a sectional view (taken along the same plane as FIG. 41) showing the semiconductor device A50 mounted on a wiring board 61 by reflow soldering. As shown in FIG. 45, the conductive bonding material 62, which may be a solder cream for example, adheres to the outer conductive layers 29 covering the bottom surfaces 22 of the terminals 2. The volume of the conductive bonding material 62 may be increased such that the conductive bonding material 62 adheres to both of the outer conductive layers 29 and the first outer side surfaces 24 of the terminals 2.

Figure 46:
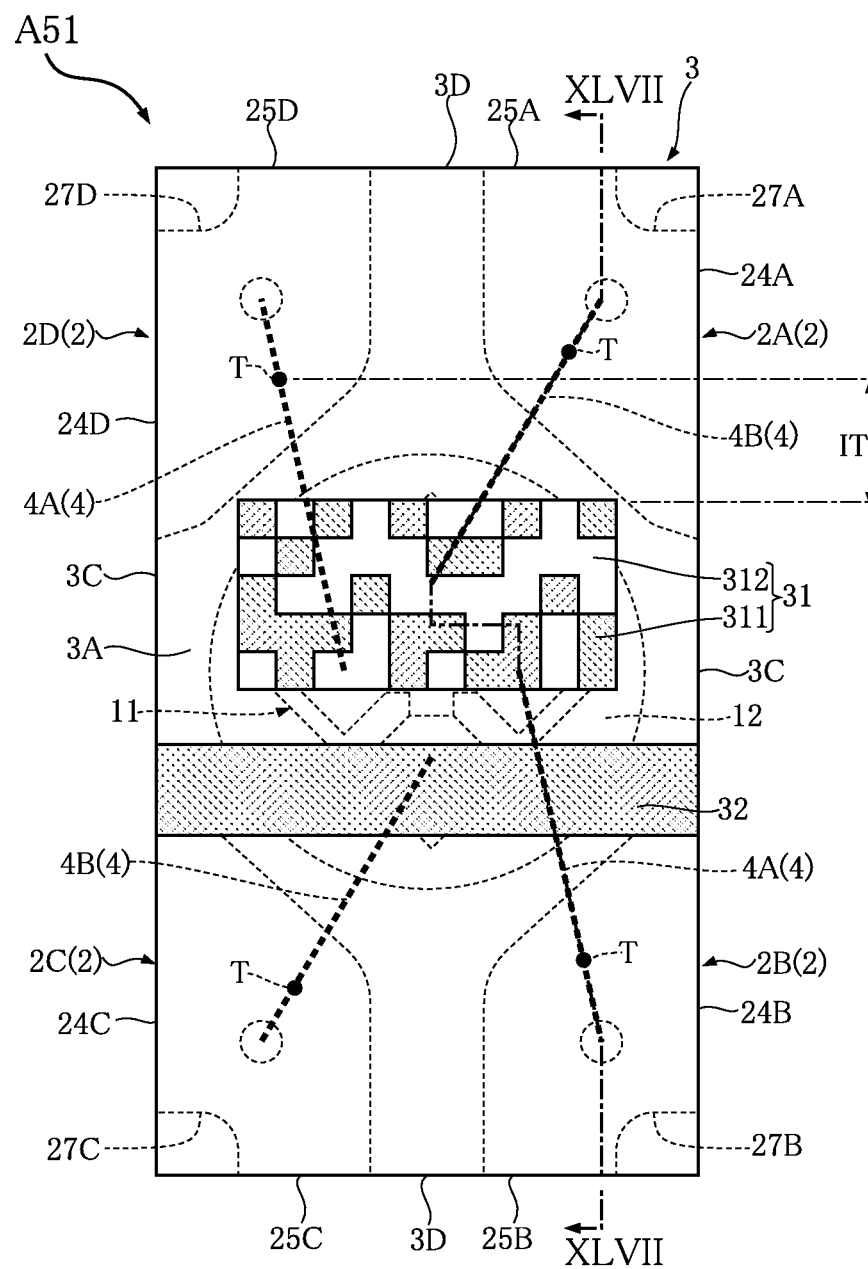
FIG. 46 is a plan view of a semiconductor device according to a variation of the fifth embodiment of the present disclosure.
Figure 47:
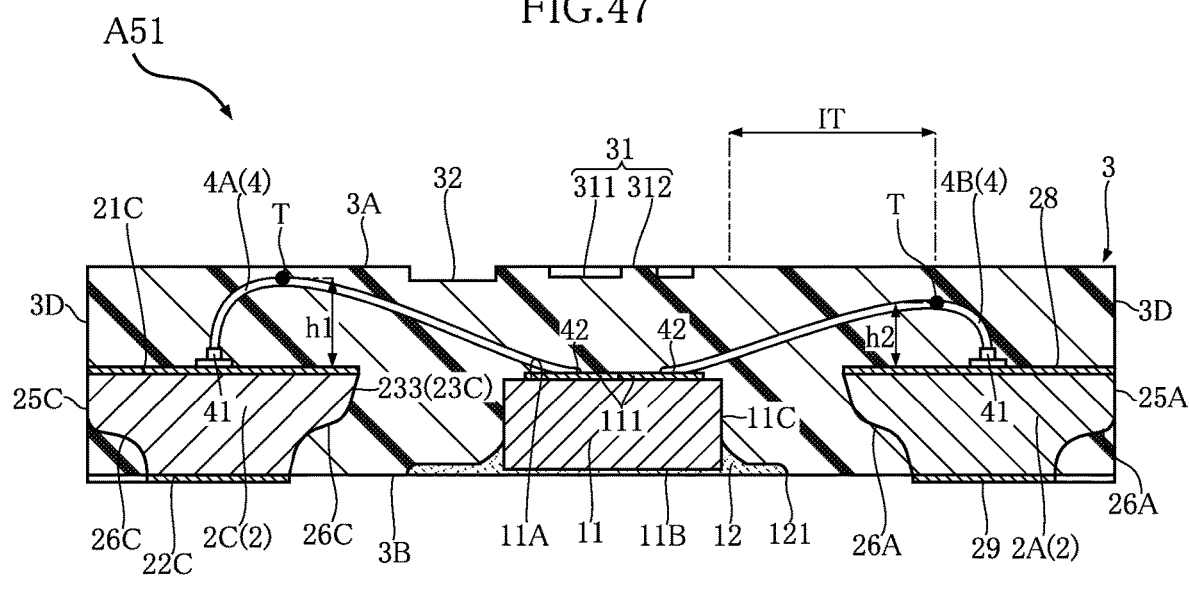
FIG. 47 is a sectional view taken along line XLVII-XLVII in FIG. 46.

Referring now to FIGS. 46 and 47, a semiconductor device A51, which is a variation of the semiconductor device A50, is described. As shown in FIG. 47, in the semiconductor device A51, the first connecting portions 41 of the wires 4 are connected to the inner conductive layers 28 covering the top surfaces 21 of the terminals 2. The second connecting portions 42 of the wires 4 are connected to the electrodes 111 of the semiconductor element 11. In this case, each first connecting portion 41 is connected to an inner electrically conductive layer 28 on a portion of the top surface 21 that overlaps with the bottom surface 22 as viewed in the thickness direction z. As shown in FIG. 46, the sealing resin 3 has a mark 31 and a discrimination groove 32 at positions overlapping with the semiconductor element 11 as viewed in the thickness direction z. As will be understood from this variation, the wires 4 may be connected in the manner according to the semiconductor device A50 or in the manner according to the semiconductor device A51.

The advantages of the semiconductor device A50 are described below.

Similarly to the semiconductor device A10, the semiconductor device A50 also includes the conductive layer 12 that is in contact with both of the reverse surface 11B and the side surface 11C of the semiconductor element 11 and exposed from the second surface 3B of the sealing resin 3. Thus, heat generated at the semiconductor element 11 during the use of the semiconductor device A50 is efficiently dissipated to the outside through the conductive layer 12. The terminals 2 of the semiconductor device A50 are formed with dent portions 26 recessed from both of the bottom surface 22 and the inner side surface 23. Thus, short circuit between the conductive layer 12 and the terminals 2 is avoided. In this way, the semiconductor device A50 also achieves enhanced heat dissipation while achieving height reduction.

The sealing resin 3 has the mark 31 formed on the first surface 3A. The top of each wire 4 is spaced apart by a distance IT from the edge of the mark 31 in the second direction y. Thus, the recesses 311, which constitute the mark 31, do not interfere with the wires 4.

Figure 48:
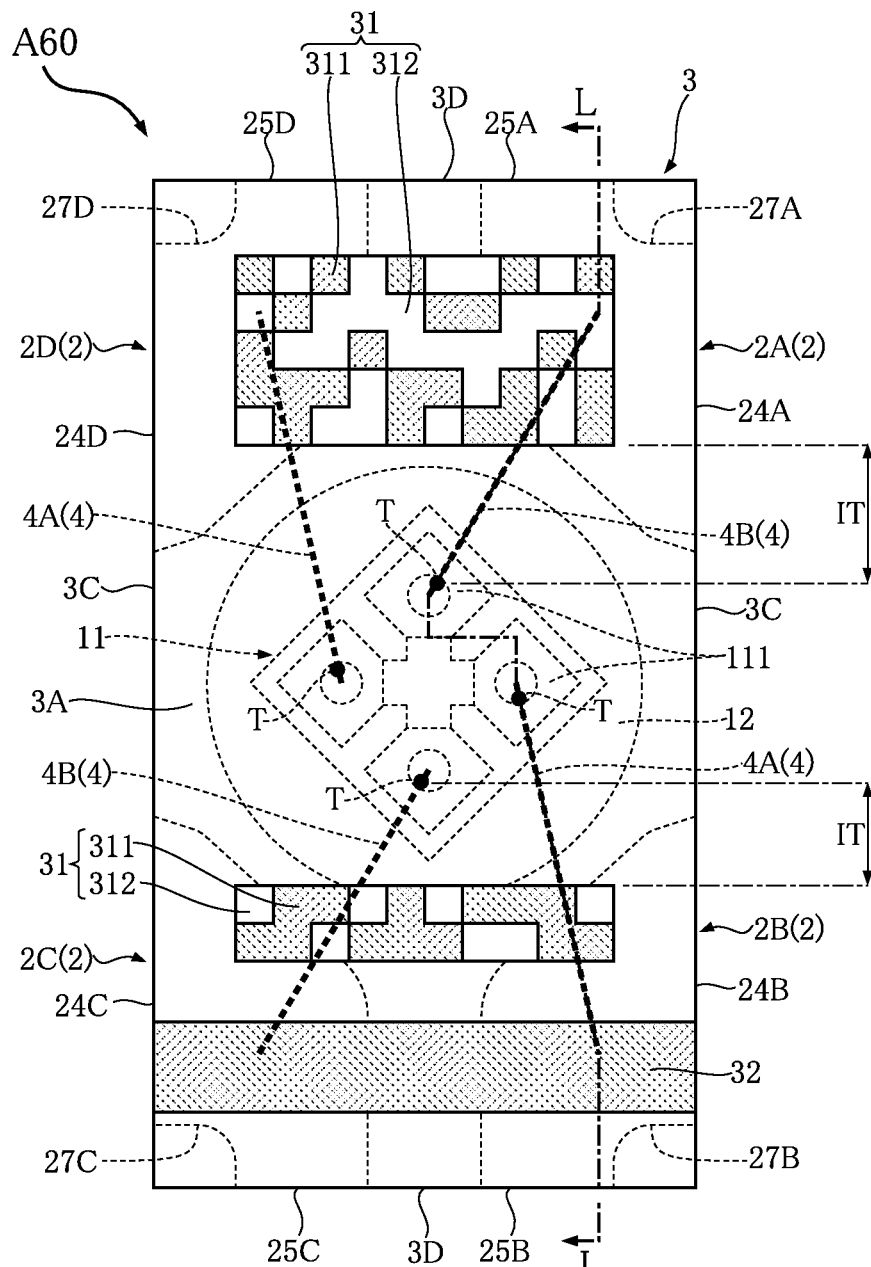
FIG. 48 is a plan view of a semiconductor device according to a sixth embodiment of the present disclosure.
Figure 51:
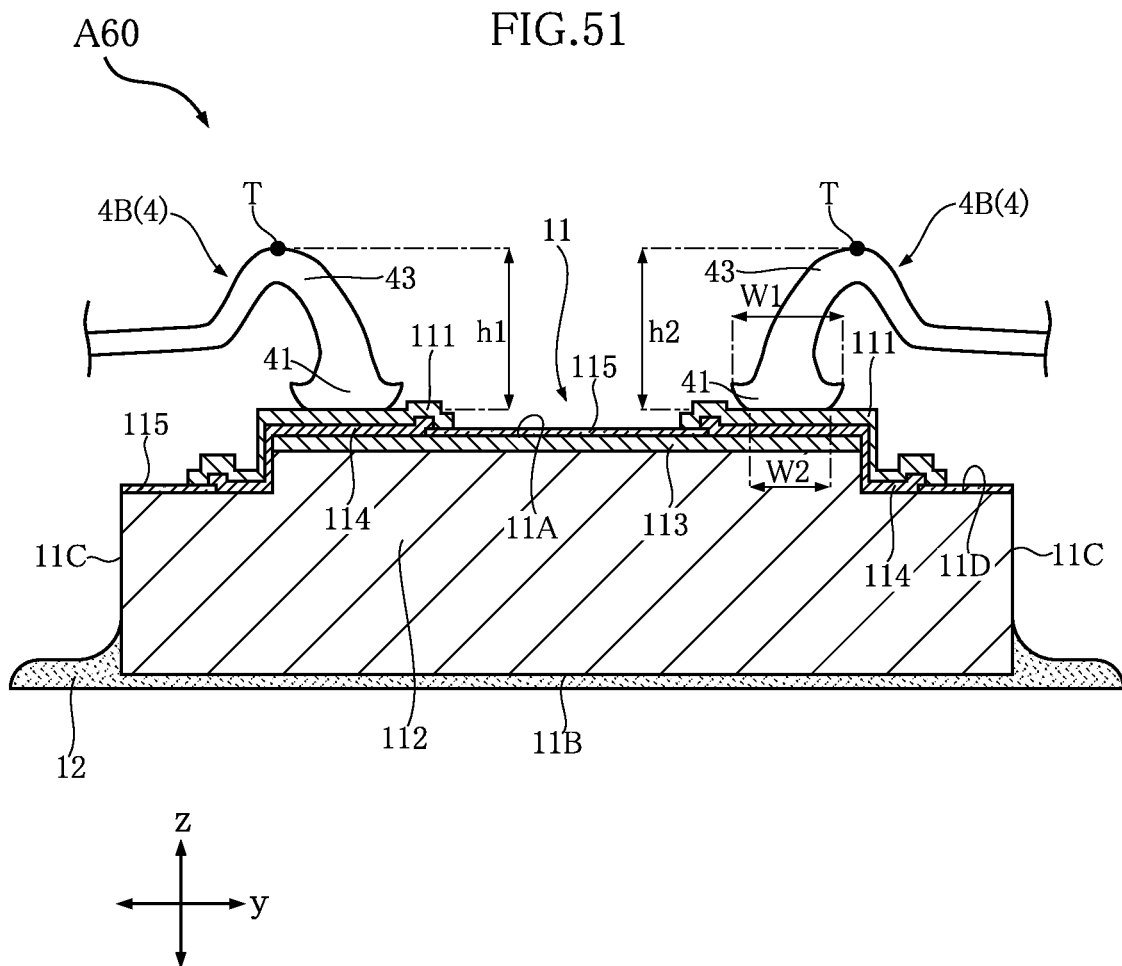
FIG. 51 is a sectional view of the semiconductor device shown in FIG. 48, with the sealing resin unillustrated.

With reference to FIGS. 48 and 51, a semiconductor device A60 according to a sixth embodiment of the present disclosure is described below. In the figures, the elements that are identical or similar to those of the semiconductor device A10 are designated by the same reference signs as those used for the semiconductor device A10, and the description is omitted. Note that FIG. 48 is a view as seen through the inner conductive layers 28 and the sealing resin 3, for convenience of understanding. FIG. 49 is a view as seen through the sealing resin 3, for convenience of understanding. In FIGS. 48 and 49, the contour of the sealing resin 3 is illustrated by imaginary lines. In FIG. 48, line L-L passing through the semiconductor device is indicated by a single-dot chain line. FIG. 51 is a sectional view taken along the same plane as FIG. 44. Further, in FIGS. 48-50, some of the reference signs for the same elements of the terminals 2 are omitted.

The semiconductor device A60 differs from the semiconductor device A50 in thickness of the sealing resin 3 and configuration of the wires 4.

The thickness of the sealing resin 3 from the first surface 3A to the second surface 3B is 125 to 165 μm, for example. Thus, the thickness of the sealing resin 3 is smaller than that in the semiconductor device A50.

As shown in FIGS. 49-51, the plurality of wires 4 further include bent portions 43. Each bent portion 43 is connected to the upper end of a first connecting portion 41. The bent portion 43 is bent into a V-shape in the thickness direction z. The top T of each wire 4 is located at the tip of the bent portion 43 that is farthest from the bottom of a first connecting portion 41 in the thickness direction z. As shown in FIG. 48, the tops T of all wires 4 overlap with the semiconductor element 11 as viewed in the thickness direction z. As shown in FIG. 51, the width W1 of the first connecting portion 41 of each of the paired second wires 4B at its upper end (connected to the bent portion 43) is larger than the width W2 of the first connecting portion at its lower end (in contact with an electrode 111). Though not illustrated, the width W1 is larger than the width W2 also at the first connecting portion 41 of each of the paired first wires 4A.

As shown in FIGS. 49-51, the loop height h1 of each of the paired first wires 4A is approximately equal to the loop height h2 of each of the paired second wires 4B. For example, the loop heights h1 and h2 are 32 to 52 μm. The loop heights h1 and h2 of the semiconductor device A60 are smaller than the loop heights h1 and h2 of the semiconductor device A50.

As shown in FIGS. 48 and 50, as viewed in the thickness direction z, the two distances IT from the tops T of the wires 4 to the edge of the mark 31 are longer than the distances IT in the semiconductor device A50.

Figure 52:
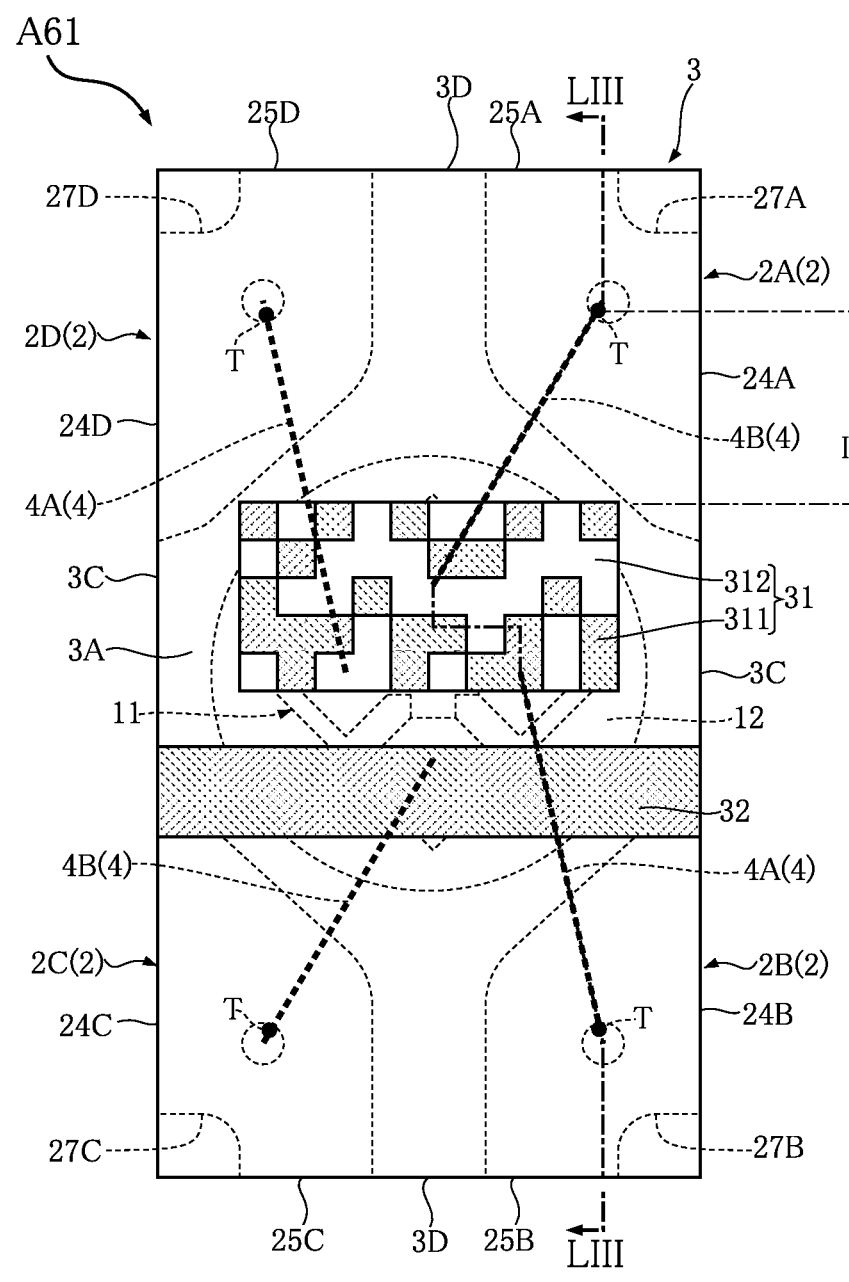
FIG. 52 is a plan view of a semiconductor device according to a variation of the sixth embodiment of the present disclosure.
Figure 53:
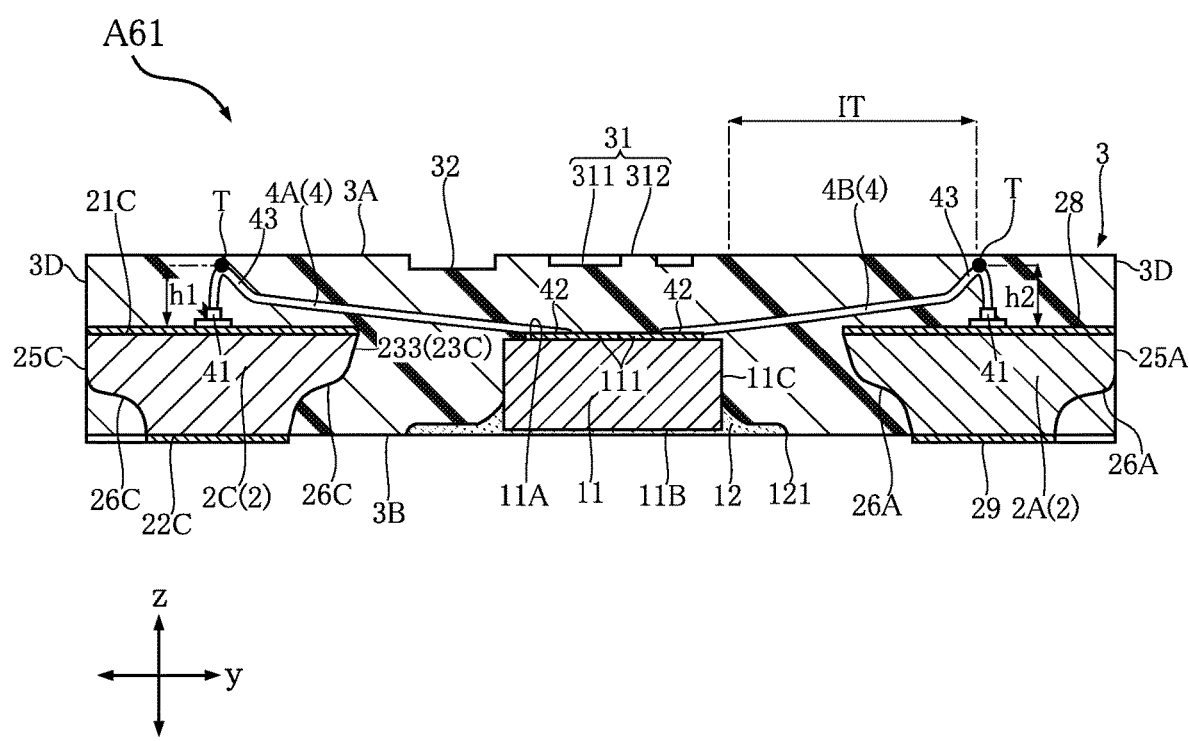
FIG. 53 is a sectional view taken along line LIII-LIII in FIG. 52.

Referring now to FIGS. 52 and 53, a semiconductor device A61, which is a variation of the semiconductor device A60, is described. As shown in FIG. 53, in the semiconductor device A61, the first connecting portions 41 of the wires 4 are connected to the inner conductive layers 28 covering the top surfaces 21 of the terminals 2. The second connecting portions 42 of the wires 4 are connected to the electrodes 111 of the semiconductor element 11. In this case, each first connecting portion 41 is connected to an inner electrically conductive layer 28 on a portion of the top surface 21 that overlaps with the bottom surface 22 as viewed in the thickness direction z. As shown in FIG. 52, the sealing resin 3 has a mark 31 and a discrimination groove 32 at positions overlapping with the semiconductor element 11 as viewed in the thickness direction z. The tops T of the wires 4 are located at positions overlapping with the terminals 2 as viewed in the thickness direction z. As will be understood from this variation, the wires 4 may be connected in the manner according to the semiconductor device A60 or in the manner according to the semiconductor device A61.

The advantages of the semiconductor device A60 are described below.

Similarly to the semiconductor device A10, the semiconductor device A60 also includes the conductive layer 12 that is in contact with both of the reverse surface 11B and the side surface 11C of the semiconductor element 11 and exposed from the second surface 3B of the sealing resin 3. Thus, heat generated at the semiconductor element 11 during the use of the semiconductor device A60 is efficiently dissipated to the outside through the conductive layer 12. The terminals 2 of the semiconductor device A60 are formed with dent portions 26 recessed from both of the bottom surface 22 and the inner side surface 23. Thus, short circuit between the conductive layer 12 and the terminals 2 is avoided. In this way, the semiconductor device A60 also achieves enhanced heat dissipation while achieving height reduction.

Each of the wires 4 has a bent portion 43. The bent portion 43 is connected to a first connecting portion 41 and bent into a V-shape in the thickness direction z. This allows the loop height h1 of each of the paired first wires 4A to be approximately equal to the loop height h2 of each of the paired second wires 4B. Further, it is also possible to make the loop heights h1 and h2 be smaller than the loop heights h1 and h2 of the semiconductor device A50. Accordingly, the thickness of the sealing resin 3 from the first surface 3A to the second surface 3B can be made smaller than that of the semiconductor device A50, which leads to further height reduction of the semiconductor device A60.

The tops T of the wires 4 are located at positions overlapping with the semiconductor element 11 as viewed in the thickness direction z. Accordingly, the tops T of the wires 4 are spaced apart from the edge of the mark 31 by larger distances IT than in the semiconductor device A50. In other words, it is possible to form a mark 31 that has a larger dimension in the direction y so that the mark 31 can represent more product information about the semiconductor device A60.

The present disclosure is not limited to the foregoing embodiments. The specific structure of each part of the present disclosure may be varied in design in many ways.

The present disclosure includes the configurations described in the following clauses.

Clause 1.

A semiconductor device comprising:

a semiconductor element including an obverse surface and a reverse surface facing away from each other in a thickness direction, and a side surface connected to the obverse surface and the reverse surface;

a conductive layer that is in contact with the reverse surface and the side surface and contains metal particles;

a plurality of terminals spaced apart from the semiconductor element and electrically connected to the semiconductor element; and a sealing resin that includes a first surface facing in a direction in which the obverse surface faces and a second surface facing away from the first surface, the sealing resin covering the semiconductor element;

wherein the conductive layer has an edge located on an outer side of an edge of the semiconductor element as viewed in the thickness direction, each of the terminals includes a top surface facing in the direction in which the obverse surface faces, a bottom surface facing away from the top surface, an inner side surface connected to the top surface and in contact with the sealing resin, and a dent portion recessed from the bottom surface and the inner side surface, and the conductive layer and the bottom surface of each of the terminals are exposed from the second surface.

Clause 2.

The semiconductor device according to clause 1, wherein the dent portion of each of the terminals is in contact with the sealing resin.

Clause 3.

The semiconductor device according to clause 2, wherein the sealing resin includes a third surface facing in a first direction perpendicular to the thickness direction, each of the terminals includes a first outer side surface connected to all of the top surface, the bottom surface and the inner side surface and facing in the first direction, and the first outer side surface of each of the terminals is exposed from the third surface.

Clause 4.

The semiconductor device according to clause 3, wherein the sealing resin includes a fourth surface facing in a second direction perpendicular to the thickness direction and the first direction, and each of the terminals includes a second outer side surface connected to the top surface, the bottom surface and the inner side surface and facing in the second direction, and the second outer side surface of each of the terminals is exposed from the fourth surface.

Clause 5.

The semiconductor device according to clause 4, wherein in each of the terminals, the dent portion is recessed from the bottom surface and the second outer side surface.

Clause 6.

The semiconductor device according to clause 5, wherein each of the terminals includes a penetrating portion penetrating from the top surface to the bottom surface and connected to the first outer side surface, the second outer side surface and the dent portion, and a part of the resin is located in the penetrating portion of each of the terminals.

Clause 7.

The semiconductor device according to any one of clauses 4-6, wherein the semiconductor element has an edge made up of four sides inclined with respect to the first direction and the second direction, and the inner side surface of each of the terminals includes a portion that is parallel to one of the four sides of the semiconductor element.

Clause 8.

The semiconductor device according to clause 7, wherein the edge of the conductive layer is spaced apart from the top surface of each of the terminals as viewed in the thickness direction.

Clause 9.

The semiconductor device according to clause 7, wherein a part of the conductive layer overlaps with the top surface of at least one of the terminals as viewed in the thickness direction.

Clause 10.

The semiconductor device according to clause 8 or 9, wherein the conductive layer includes a contact portion held in contact with the side surface, the contact portion having a farthest part that is farthest from a base surface that is perpendicular to the thickness direction and contains the second surface, and wherein a distance between the farthest part and the base surface is smaller than a distance between the base surface and a boundary between the inner side surface and the dent portion.

Clause 11.

The semiconductor device according to clause 9, wherein the conductive layer includes a contact portion held in contact with the side surface, the contact portion having a farthest part that is farthest from a base surface that is perpendicular to the thickness direction and contains the second surface, wherein a distance between the farthest part and the base surface is greater than a distance between the base surface and a boundary between the inner side surface and the dent portion, and wherein the farthest part is spaced apart from the top surface of each of the terminals as viewed in the thickness direction.

Clause 12.

The semiconductor device according to clause 8 or 9, wherein each of the terminals includes an outer electrically conductive layer covering the bottom surface.

Clause 13.

The semiconductor device according to clause 12, wherein, in each of the terminals, the outer conductive layer covers the first outer side surface.

Clause 14.

The semiconductor device according to clause 12, further comprising wires that electrically connect the semiconductor element to the terminals.

Clause 15.

The semiconductor device according to clause 14, wherein, in each of the terminals, the wire is connected to a portion of the top surface that overlaps with the bottom surface as viewed in the thickness direction.

Clause 16.

The semiconductor device according to clause 15, wherein each of the terminals further includes an inner electrically conductive layer that covers the top surface.

The invention claimed is:

1. A semiconductor device comprising:
   a semiconductor element;
   a terminal spaced apart from and electrically connected to the semiconductor element; and
   a sealing resin covering the semiconductor element and at least a part of the terminal,
   wherein the sealing resin includes an obverse surface formed with a mark representing information relating to the semiconductor device, and the mark comprises at least one recess formed in the obverse surface and at least one flat portion, and
   wherein the mark comprises a first region and a second region that are spaced apart from each other with the semiconductor element disposed therebetween as viewed in plan.

2. The semiconductor device according to claim 1, further comprising a wire connecting the semiconductor element to the terminal, wherein the mark is spaced apart from a top of the wire as viewed in a direction parallel to the obverse surface of the sealing resin.

3. The semiconductor device according to claim 1, wherein the sealing resin has a pair of first sides and a pair of second sides as viewed in plan, the second sides being longer than the first sides, and wherein an entirety of the mark is spaced apart from the first sides and the second sides as viewed in plan.

4. A semiconductor device comprising:
   a semiconductor element;
   a terminal spaced apart from and electrically connected to the semiconductor element; and
   a sealing resin covering the semiconductor element and at least a part of the terminal,
   wherein the sealing resin includes an obverse surface formed with a mark representing information relating to the semiconductor device, and the mark comprises at least one recess formed in the obverse surface and at least one flat portion, and
   wherein the sealing resin has a pair of first sides and a pair of second sides as viewed in plan, the second sides being longer than the first sides, and wherein an entirety of the mark is spaced apart from the first sides and the second sides as viewed in plan,
   the semiconductor device further comprising a groove formed in the obverse surface of the sealing resin, wherein the groove extends from one of the second sides to the other of the second sides.

5. The semiconductor device according to claim 4, wherein the groove overlaps with the semiconductor element as viewed in plan.

6. The semiconductor device according to claim 4, wherein the mark overlaps with the semiconductor element as viewed in plan.

7. The semiconductor device according to claim 1, wherein an entirety of the mark is spaced apart from the semiconductor element as viewed in plan.

8. The semiconductor device according to claim 1, further comprising a wire connecting the semiconductor element to the terminal, wherein a distance between a top of the wire and the obverse surface of the sealing resin is greater than a maximum depth of the recess.

9. A semiconductor device comprising:
   a semiconductor element;
   a terminal spaced apart from and electrically connected to the semiconductor element; and
   a sealing resin covering the semiconductor element and at least a part of the terminal,
   wherein the sealing resin includes an obverse surface formed with a mark representing information relating to the semiconductor device, and the mark comprises at least one recess formed in the obverse surface and at least one flat portion,
   the semiconductor device further comprising a wire connecting the semiconductor element to the terminal, wherein a distance between a top of the wire and the obverse surface of the sealing resin is smaller than a maximum depth of the recess.

10. The semiconductor device according to claim 1, wherein the obverse surface of the sealing resin except for the mark is flat and flush with the flat portion of the mark.

11. The semiconductor device according to claim 1, wherein the first region and the second region are different in area measured in plan view.

12. The semiconductor device according to claim 1, wherein the recess has a pattern comprising at least one rectangle as viewed in plan.

13. The semiconductor device according to claim 12, wherein the recess has a pattern comprising a plurality of rectangles as viewed in plan.

14. The semiconductor device according to claim 1, wherein the recess comprises a roughened bottom surface.

15. The semiconductor device according to claim 1, further comprising a wire connecting the semiconductor element to the terminal, wherein the wire has a first end attached to the semiconductor element and a second end attached to the terminal, and wherein the mark overlaps with the second end of the wire as viewed in plan.

16. The semiconductor device according to claim 15, wherein the recess of the mark overlaps with the second end of the wire as viewed in plan.

17. The semiconductor device according to claim 1, wherein the at least one recess comprises a plurality of recesses each having an edge that defines an outer periphery of the mark.

18. The semiconductor device according to claim 1, wherein the recess of the mark overlaps with the terminal as viewed in plan, and a distance between a bottom surface of the recess and the terminal is greater than a depth of the recess.

19. The semiconductor device according to claim 1, wherein the semiconductor element comprises a Hall element.

* * * * *